United States Patent
Takemura et al.

(10) Patent No.: US 7,107,701 B2
(45) Date of Patent: Sep. 19, 2006

(54) SUBSTRATE DRYING METHOD AND APPARATUS

(75) Inventors: Yoshio Takemura, Nara-ken (JP); Susumu Matsuda, Nara-ken (JP); Hiroaki Mizunoe, Nara-ken (JP)

(73) Assignee: Toho Kasei Co., Ltd., Nara-ken (JP)

( * ) Notice: Subject to any disclaimer, the term of this patent is extended or adjusted under 35 U.S.C. 154(b) by 0 days.

(21) Appl. No.: 10/347,260

(22) Filed: Jan. 21, 2003

(65) Prior Publication Data
US 2004/0139626 A1    Jul. 22, 2004

(30) Foreign Application Priority Data

Jan. 22, 2002 (JP) ............... 2002-013042
Mar. 5, 2002 (JP) ............... 2002-058878

(51) Int. Cl.
*B08B 3/00* (2006.01)
*B08B 3/04* (2006.01)
*F26B 13/10* (2006.01)
*F26B 3/00* (2006.01)

(52) U.S. Cl. ............... 34/526; 34/209; 134/30; 134/32; 134/95.2; 134/102.3; 134/902

(58) Field of Classification Search .......... 34/467, 34/340, 342, 401, 402, 404–406, 61, 76–79, 34/202, 221, 364, 370, 381, 524, 526, 209; 134/33, 902, 26, 30, 32, 95.2, 102.1, 102.3, 134/117, 200
See application file for complete search history.

(56) References Cited

U.S. PATENT DOCUMENTS 5,520,744 A    5/1996 Fujikawa et al.

| | | | |
|---|---|---|---|
| 6,131,588 A * | 10/2000 | Kamikawa et al. | 134/102.3 |
| 6,167,323 A * | 12/2000 | Komino et al. | 700/121 |
| 6,219,936 B1 * | 4/2001 | Kedo et al. | 34/381 |
| 6,244,281 B1 * | 6/2001 | Ohsawa et al. | 134/135 |
| 6,368,040 B1 * | 4/2002 | Yamasaki et al. | 414/225.01 |
| 6,375,758 B1 * | 4/2002 | Nakashima et al. | 134/30 |
| 6,431,184 B1 * | 8/2002 | Taniyama | 134/1.3 |
| 6,536,452 B1 * | 3/2003 | Kohama et al. | 134/117 |

FOREIGN PATENT DOCUMENTS

| | | |
|---|---|---|
| JP | 6-103686 | 12/1994 |
| JP | 2000223466 A * | 8/2000 |
| JP | 2002-217161 | 8/2002 |
| JP | 2003-332294 | 11/2003 |
| KR | 1020020009351 | 2/2002 |

* cited by examiner

*Primary Examiner*—Jiping Lu
(74) *Attorney, Agent, or Firm*—Wenderoth, Lind & Ponack, L.L.P.

(57) ABSTRACT

There are provided a substrate drying method and apparatus by which an attachment amount of particles to surfaces of substrates can be reduced when the substrates are exposed from pure water, and occurrence of non-uniform drying can be prevented by improving drying efficiency of the substrates. Air or an inert gas, and gaseous or droplet-like isopropyl alcohol (hereinafter, referred to as IPA) are supplied into a space on a liquid level of the pure water in a drying chamber, and pure water on a liquid level side is drained from the liquid level or the vicinity of the liquid level of the pure water, while raising the pure water in which the substrates are immersed together with the substrates, the substrates are exposed from the pure water above the liquid level in the drying chamber, and, at the same time, the pure water held on the exposed surfaces of the substrates is replaced by IPA, whereby the substrates are dried.

10 Claims, 27 Drawing Sheets

SUBSTRATE DRYING METHOD AND APPARATUS

BACKGROUND OF THE INVENTION

The present invention relates to a substrate drying method and apparatus in which surfaces of substrates are dried by removing the substrates, immersed in pure water, from the pure water.

Conventionally, in such a drying apparatus as disclosed in Japanese examined Patent Publication No. 6-103686, IPA (Isopropyl Alcohol) is supplied as vapor, by using nitrogen gas as a carrier, into an upper space in a treatment tank of wafers, which are one example of substrates, treated with an etching solution and then washed with pure water. Then, the wafer surfaces are dried by draining the pure water in the treatment tank from a bottom portion of the treatment tank to expose the wafers in the treatment tank, and replace water droplets attached to surfaces of the exposed wafers with IPA vapor supplied into the upper space of the treatment tank.

Furthermore, there is also a drying apparatus in which, instead of exposing wafers in a treatment tank by draining pure water in the treatment tank from a bottom portion of the treatment tank, the wafers are dried by exposing the wafers in the treatment tank by raising the wafers from the treatment tank, and replacing water droplets attached to surfaces of these exposed wafers with IPA vapor supplied into an upper space of the treatment tank.

However, in the apparatus having the above structure, particles generated when the wafers are washed with pure water float in a vicinity of a liquid level of the pure water in the treatment tank. Since the wafers are exposed in the treatment tank by draining the pure water in the treatment tank from the bottom portion of the treatment tank, this drainage is successively performed from the pure water in the vicinity of the bottom portion of the treatment tank, and the pure water in the vicinity of the liquid level, in which the particles float, is finally drained. Therefore, a problem arises in that these floating particles are attached to wafer surfaces when the wafers are exposed from the liquid level.

Furthermore, in the apparatus having the above structure, since the wafers are exposed by draining the pure water from the bottom portion of the treatment tank, the pure water at the liquid level in the treatment tank is only finally drained, and hence a dissolution amount of IPA is increased at the liquid level with time. Therefore, an IPA concentration in the pure water at the liquid level and a thickness of a layer in which IPA is dissolved are increased, thereby degrading replacement efficiency. Thus, a problem arises in that drying efficiency is degraded, and non-uniform drying of the wafer surfaces occurs.

Furthermore, even when the wafers are exposed by raising them from the liquid level of the pure water in the treatment tank, a problem arises in that particles are similarly attached to wafer surfaces. Furthermore, there is a problem in that non-uniform drying of the wafer surfaces occurs because a wave is produced at the liquid level of the pure water upon raising of the wafers.

Accordingly, an object of the present invention is to provide a substrate drying method and apparatus in which, upon exposure of substrates from pure water, an amount of particles attached to surfaces of the substrates can be reduced, increases in a concentration of IPA dissolved in the pure water at a liquid level and a thickness of a pure water layer in which IPA is dissolved can be prevented, and drying efficiency of substrates can be improved to prevent non-uniform drying, and thus solve the above problems.

SUMMARY OF THE INVENTION

In accomplishing these and other aspects, according to a first aspect of the present invention, there is provided a substrate drying method of drying substrates immersed in pure water in a drying chamber by exposing the substrates from the pure water, comprising:

supplying air or an inert gas, and gaseous or droplet-like isopropyl alcohol into a space above a liquid level of the pure water in the drying chamber;

while raising the pure water in which the substrates are immersed together with the substrates, draining pure water on a liquid level side from the liquid level or a vicinity of the liquid level of the pure water, exposing the substrates from the pure water above the liquid level in the drying chamber, and replacing the pure water held on exposed surfaces of the substrates by the gaseous or droplet-like isopropyl alcohol; and then, drying the substrates by evaporating the isopropyl alcohol from the surfaces of the substrates.

According to a second aspect of the present invention, there is provided a substrate drying method as defined in the first aspect, wherein the pure water on the liquid level is drained in a state that a position of the liquid level relative to the space is fixed.

According to a third aspect of the present invention, there is provided a substrate drying method as defined in the first aspect, wherein, while the pure water in which the substrates are immersed together is raised with the substrates relative to the drying chamber by lowering the drying chamber, pure water on the liquid level side is drained from the liquid level or the vicinity of the liquid level of the pure water.

According to a fourth aspect of the present invention, there is provided a substrate drying method as defined in the first aspect, further comprising draining the pure water on the liquid level side by a flow along the liquid level and along respective surfaces of the substrates, of which, the substrates immersed in the pure water are a plurality of substrates arranged so that surfaces thereof are substantially parallel to each other and substantially perpendicular to the liquid level of the pure water.

According to a fifth aspect of the present invention, there is provided a substrate drying method as defined in the first aspect, wherein the pure water is drained from the vicinity of a bottom of the drying chamber upon drainage of the pure water on the liquid level side from the liquid level or the vicinity of the liquid level of the pure water.

According to a sixth aspect of the present invention, there is provided a substrate drying method as defined in the first aspect, wherein the pure water is supplied from the vicinity of the bottom of the drying chamber upon drainage of the pure water on the liquid level side from the liquid level or the vicinity of the liquid level of the pure water.

According to a seventh aspect of the present invention, there is provided a substrate drying method as defined in the first aspect, wherein the inert gas is nitrogen gas.

According to an eighth aspect of the present invention, there is provided a substrate drying method as defined in the first aspect, wherein the substrates are wafers or liquid crystal glass substrates.

According to a ninth aspect of the present invention, there is provided a substrate drying apparatus comprising:

a drying chamber in which substrates can be immersed in pure water;

an isopropyl alcohol supply device for supplying air or an inert gas, and gaseous or droplet-like isopropyl alcohol into a space above a liquid level of the pure water in the drying chamber; and a drainage device for draining pure water on a liquid level side from the liquid level or a vicinity of the liquid level of the pure water while raising the pure water in which the substrates are immersed together with the substrates by raising a movable plate disposed so as to raise or lower in the drying chamber, wherein, the pure water on the liquid level is drained while raising the pure water together with the substrates by raising the movable plate by the drainage device, the substrates are exposed from the pure water above the liquid level in the drying chamber, and, at the same time, the pure water held on exposed surfaces of the substrates is replaced by the gaseous or droplet-like isopropyl alcohol, and then the substrates can be dried by evaporating the isopropyl alcohol from the surfaces of the substrates.

According to a tenth aspect of the present invention, there is provided a substrate drying apparatus as defined in the ninth aspect, wherein the pure water on the liquid level side is drained by the drainage device in a state that a position of the liquid level relative to the space is fixed.

According to an eleventh aspect of the present invention, there is provided a substrate drying apparatus as defined in the ninth aspect, wherein the movable plate comprises a bottom of the drying chamber, and the drainage device comprises a bottom elevator for raising or lowering the bottom and further includes a substrate support mechanism for supporting the substrates, and the bottom of the drying chamber is raised by the bottom elevator, and the pure water on the liquid level side is drained by allowing the pure water to overflow at an upper portion of the drying chamber while raising the pure water together with the substrates supported by the substrate support mechanism.

According to a twelfth aspect of the present invention, there is provided a substrate drying apparatus as defined in the ninth aspect, wherein the movable plate divides the pure water into pure water in an upper pure water tank-section on the liquid level side and pure water in a lower pure water tank-section on a side of the bottom of the drying chamber in the drying chamber, and the drainage device is a movable plate elevator for raising or lowering the movable plate, a substrate support mechanism disposed on the movable plate and supporting the substrates immersed in the pure water in the upper pure water tank-section is further included, and the movable plate of the drying chamber is raised by the movable plate elevator so as to raise a partitioning position between the upper pure water tank-section and the lower pure water tank-section, and the pure water on the liquid level side is drained by allowing the pure water to overflow at an upper portion of the drying chamber while raising the pure water in the upper pure water tank-section together with the substrates supported by the substrate support mechanism.

According to a thirteenth aspect of the present invention, there is provided a substrate drying apparatus as defined in the twelfth aspect further comprising a pure water supply mechanism for supplying pure water into the lower pure water tank-section of the drying chamber, wherein the partitioning position between the upper pure water tank-section and the lower pure water tank-section is raised by raising the movable plate of the drying chamber by the movable plate elevator, and pure water is supplied into the lower pure water tank-section, depending on a raising of the partitioning position, by the pure water supply mechanism.

According to a fourteenth aspect of the present invention, there is provided a substrate drying apparatus comprising:

a drying chamber in which substrates can be immersed in pure water;

an isopropyl alcohol supply device for supplying air or an inert gas, and gaseous or droplet-like isopropyl alcohol into a space above a liquid level of the pure water in the drying chamber; and a drainage device for draining pure water on a liquid level side from the liquid level or a vicinity of the liquid level of the pure water while raising the pure water in which the substrates are immersed relative to the drying chamber together with the substrates, by raising a liquid moving plate disposed in the drying chamber so as to raise or lower relative to the drying chamber by lowering the drying chamber, wherein, the pure water on the liquid level side is drained while raising the substrates and the pure water relative to the drying chamber together with the liquid moving plate by lowering the drying chamber by the drainage device, the substrates are exposed from the pure water above the liquid level in the drying chamber, and, at the same time, the pure water held on exposed surfaces of the substrates is replaced by the gaseous or droplet-like isopropyl alcohol, and then the substrates can be dried by evaporating the isopropyl alcohol from the surfaces of the substrates.

According to a fifteenth aspect of the present invention, there is provided a substrate drying apparatus as defined in the ninth aspect, wherein the inert gas is nitrogen gas.

According to a sixteenth aspect of the present invention, there is provided a substrate drying apparatus as defined in the ninth aspect, wherein the pure water on the liquid level side is drained by a flow along the liquid level and along respective surfaces of the substrates, of which, the substrates immersed in the pure water are a plurality of substrates arranged so that surfaces thereof are substantially parallel to each other and substantially perpendicular to the liquid level of the pure water.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 25A and 25B are schematic explanatory views showing states in which a wafer is raised in a drying chamber of the wafer drying apparatus according to the modification of the first embodiment, of which FIG. 25A is a schematic explanatory view showing a state in which the wafer is completely immersed in pure water, and FIG. 25B is a schematic explanatory view showing a state in which a part of the wafer is exposed above the liquid level of pure water;

DETAILED DESCRIPTION OF THE PREFERRED EMBODIMENTS

Figure 1:
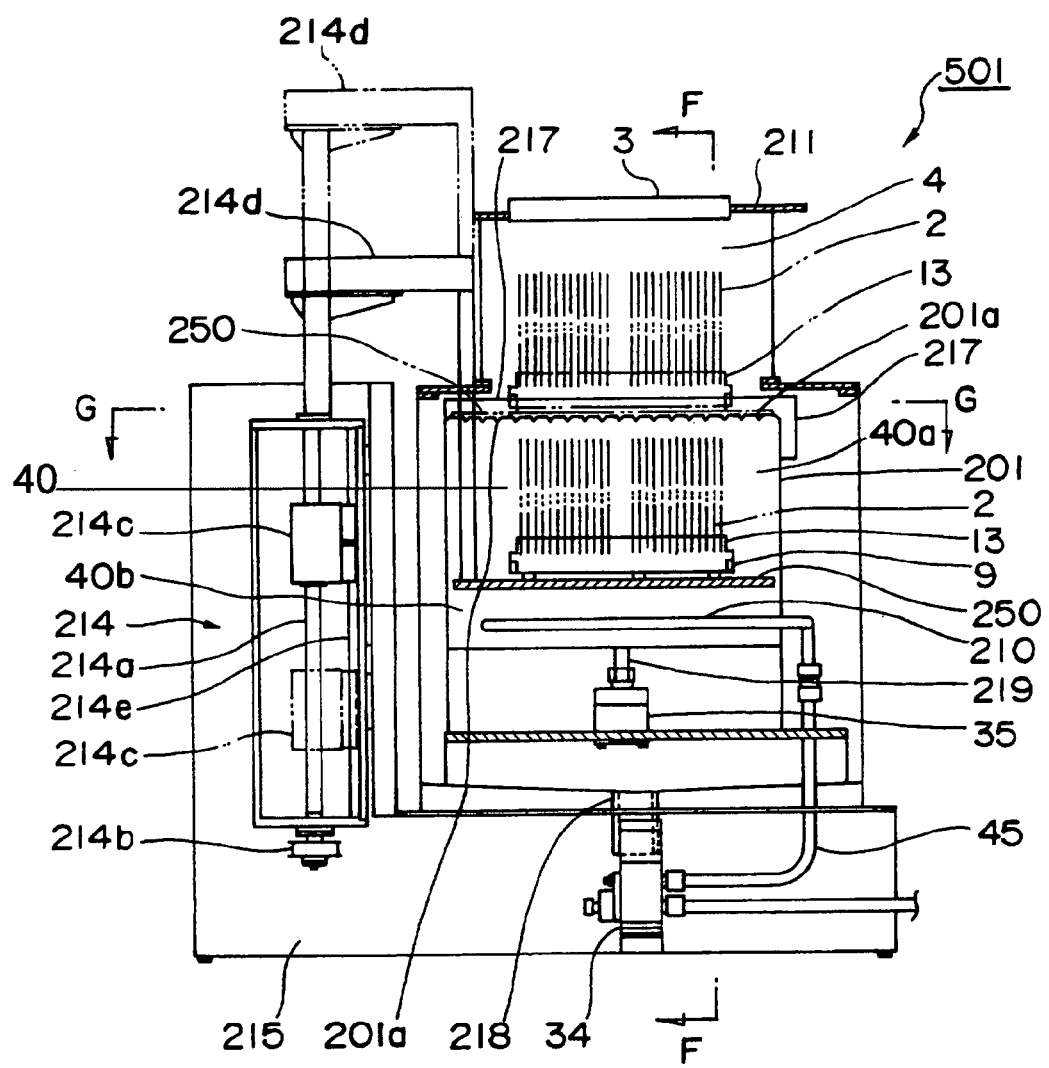
FIG. 1 is a longitudinal sectional view showing a wafer drying apparatus according to a first embodiment of the present invention.

Before description of the present invention proceeds, it is to be noted that like parts are designated by like reference numerals throughout the accompanying drawings. Before explanation of embodiments of the present invention, definitions of terms used in the present specification and claims are explained.

The term "droplet" used in the present specification and claims refers to a particle in a liquid phase having a diameter of at least 10 μm. The term "mist" refers to a particle having a diameter of less than 10 μm among the aforementioned particles in the liquid phase. That is, "droplet-like isopropyl alcohol" are particles having diameters of at least 10 μm and maintaining its liquid phase formed by isopropyl alcohol in the liquid phase. Furthermore, the term "gas" refers to a substance not in the liquid phase but in the vapor phase, in which particles having a diameter of the liquid phase do not exist. Therefore, "gaseous isopropyl alcohol" refers to isopropyl alcohol in the vapor phase.

Embodiments of the present invention are described in detail with reference to the accompanying drawings.

First Embodiment

Figure 2:
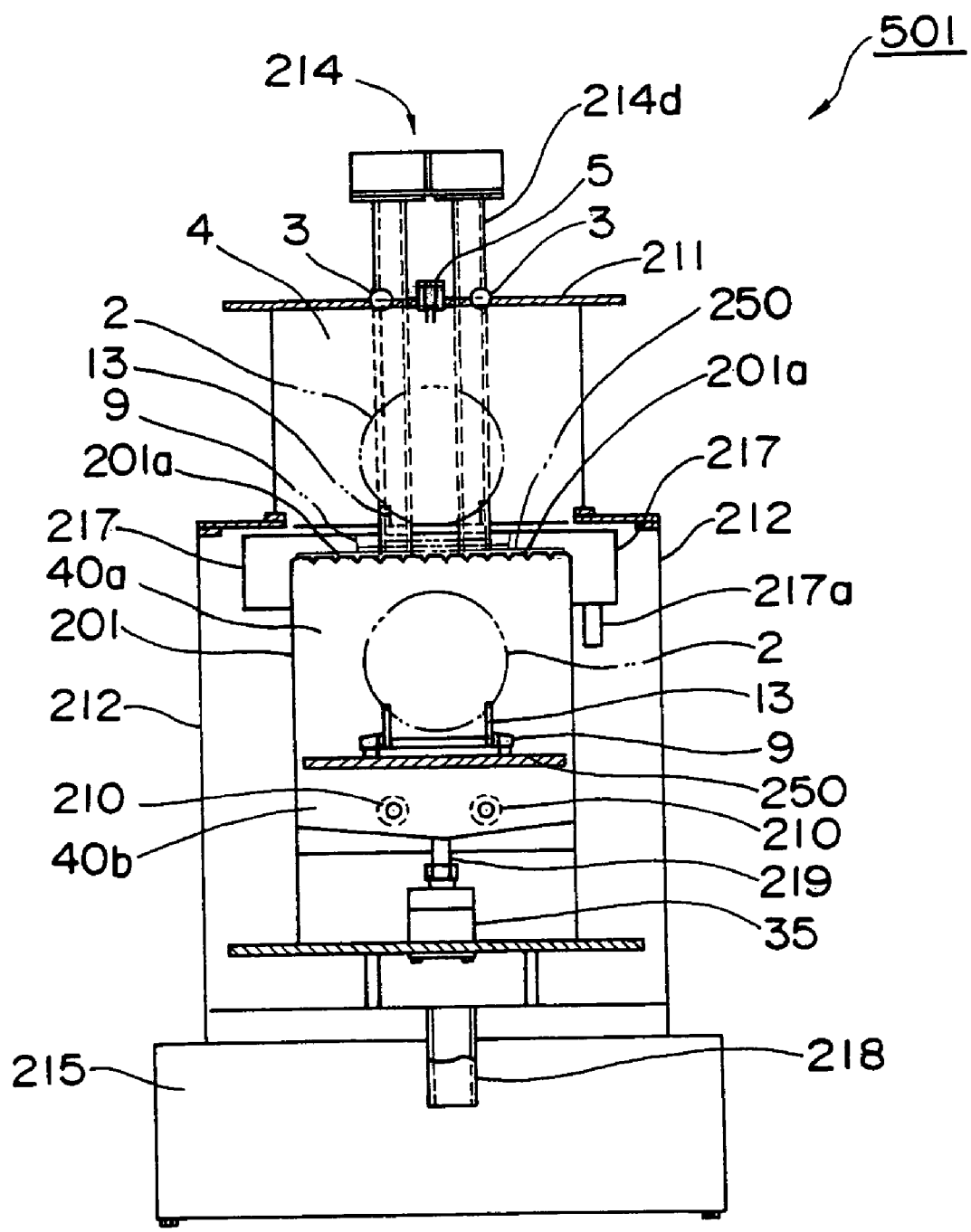
FIG. 2 is a cross sectional view showing the wafer drying apparatus along line F—F in FIG. 1.
Figure 3:
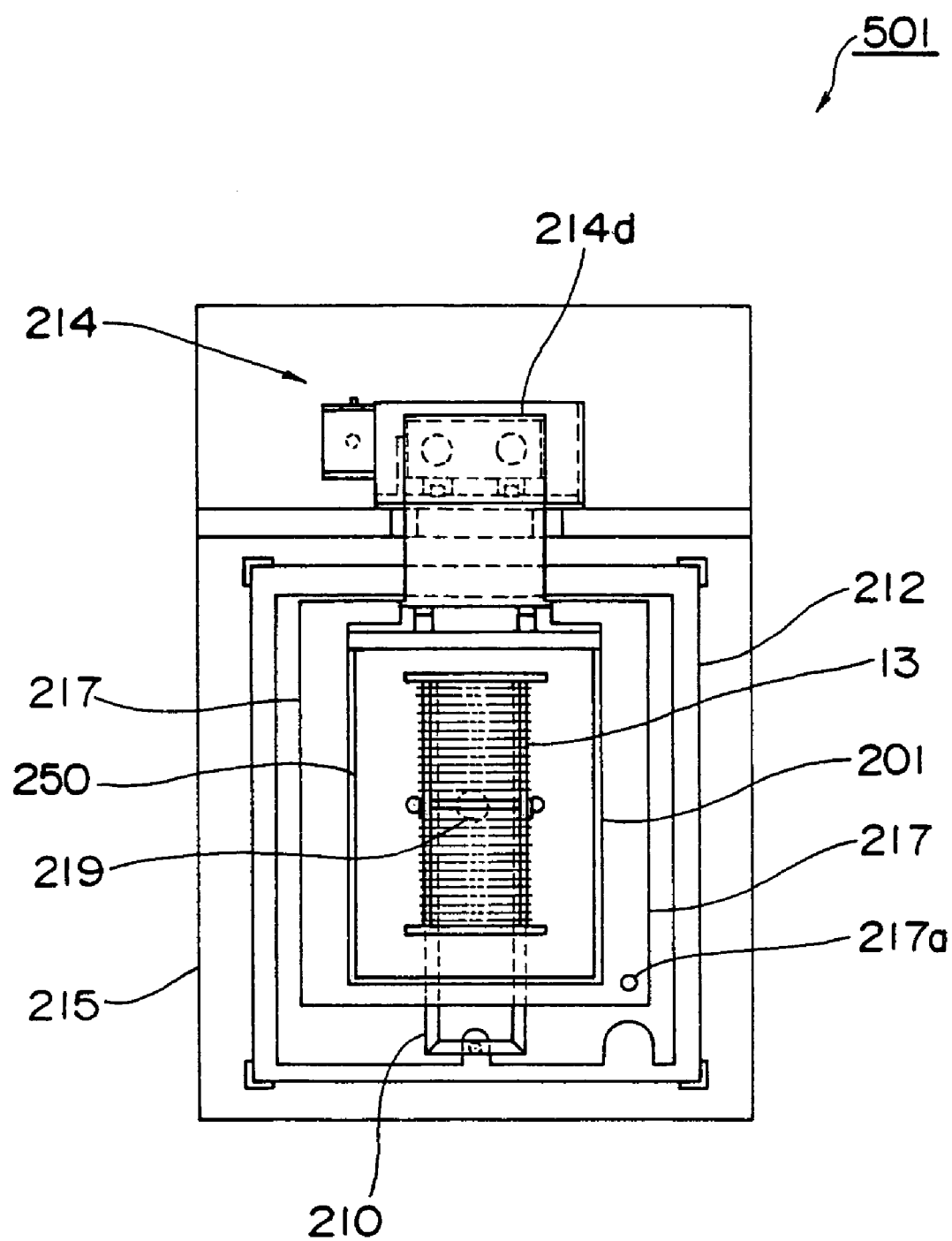
FIG. 3 is a cross sectional view showing the wafer drying apparatus along line G—G in FIG. 1.
Figure 4:
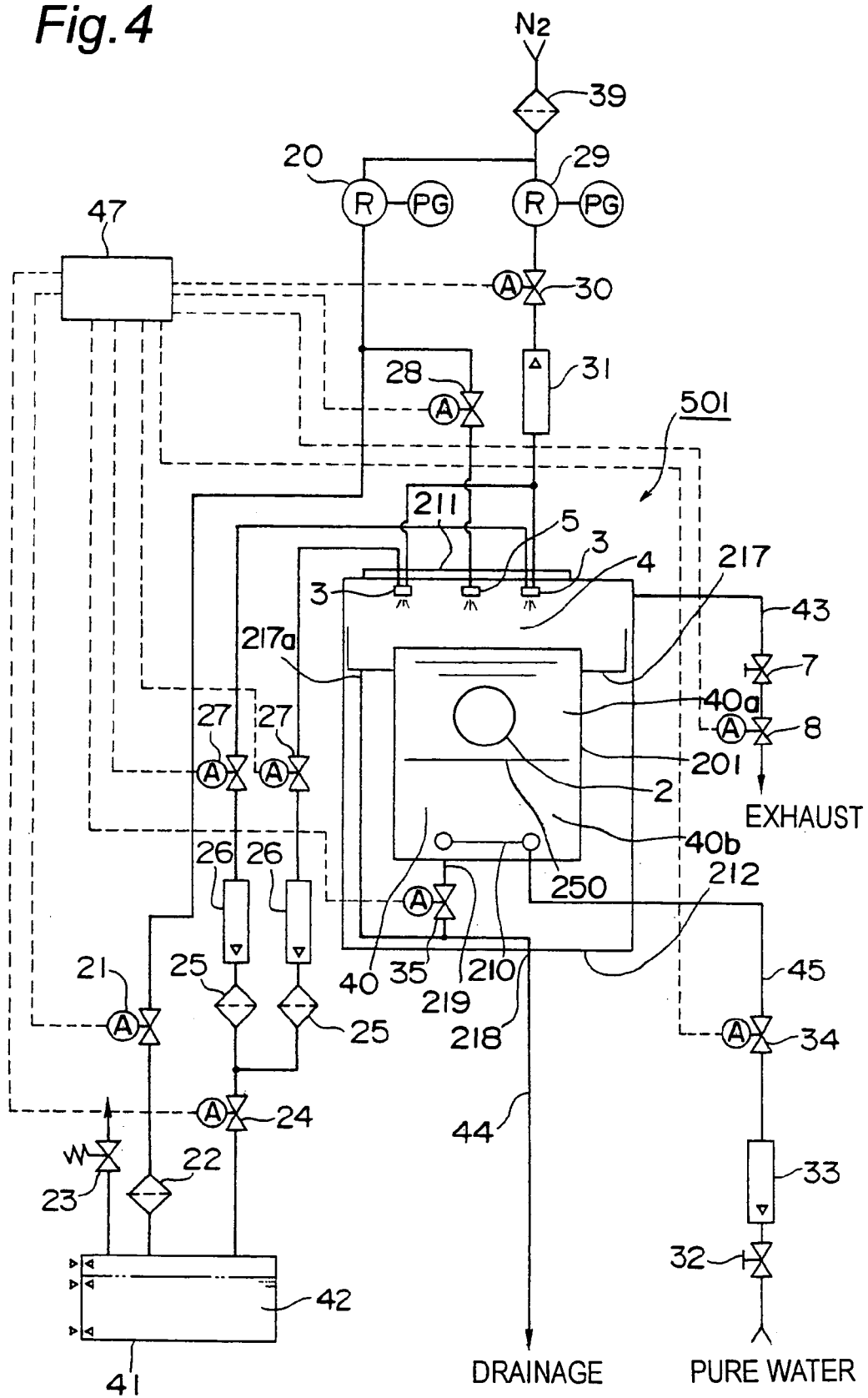
FIG. 4 is a flow diagram showing a schematic configuration of the wafer drying apparatus of the first embodiment.

A substrate drying apparatus according to a first embodiment of the present invention is a wafer drying apparatus 501 which dries wafers as one example of substrates. A longitudinal section of the wafer drying apparatus 501 is shown in FIG. 1. A cross sectional view along line F—F in FIG. 1 is shown in FIG. 2. A cross sectional view along line G—G in FIG. 1 is shown in FIG. 3. Furthermore, a flow diagram showing a schematic configuration of the wafer drying apparatus 501 is shown in FIG. 4. Examples of a substrate used in the present invention include a liquid crystal panel substrate and the like in addition to the aforementioned wafers.

As shown in FIGS. 1 to 4, the wafer drying apparatus 501 includes a drying chamber 201 having a substantially rectangular box-like shape with an entire upper surface being open, four side surfaces and a bottom, in which pure water 40 can be stored. A plurality of disc-like wafers 2 can be immersed in this stored pure water 40, washed and dried. Also provided is a treatment chamber 212 having a substantially rectangular box-like shape, in which a sealable space 4 is included, and the drying chamber 201 is fixed inside of the treatment chamber.

Furthermore, the drying chamber 201 includes a partition plate 250 as one example of a movable plate, which divides, the drying chamber into two pure water tank-sections in a vertical direction and is disposed substantially parallel to a liquid level of the pure water 40. The pure water 40 stored in the drying chamber 201 is thus divided into two portions via this partition plate 250, of which an upper side is an upper pure water tank section 40a, and a lower side is a lower pure water tank-section 40b. Furthermore, this partition plate 250 has a gap so that its entire periphery is not brought into a contact with an inside of the drying chamber 201, and that pure water can be supplied from the lower pure water tank-section 40b into the upper pure water tank-section 40a. Furthermore, the partition plate 250 can be raised and lowered along the inside of the drying chamber 201 by a partition plate elevating mechanism 214, which is one example of a movable plate elevator. Structure of this partition plate elevating mechanism 214 is explained in detail later. Furthermore, an upper end of the drying chamber 201, that is upper ends of the aforementioned four side surfaces, are at a same height.

Furthermore, a known wafer carrier 13, for supporting a plurality of wafers 2 arranged at a constant interval so that surfaces of the wafers 2 are substantially parallel to a vertical direction and that the surfaces are substantially parallel to one another, can be carried into the drying chamber 201. Furthermore, the drying chamber 201 includes a carrier fixing portion 9, which is one example of a substrate support mechanism for releasably fixing a carried-in wafer carrier 13 therein. The carrier fixing portion 9 is equipped with, for example, a plurality of fixing pins, and in the wafer carrier 13 are fixing pin receiving portions engageable with the fixing pins so that the wafer carrier 13 can be fixed to the carrier fixing portion 9 by engaging each of the fixing pins with each of the fixing pin receiving portions. As a fixing mechanism, other known fixing mechanisms may be used, and it is sufficient if the wafer carrier 13 and the carrier fixing portion 9 are not wobbly or the like in a state that the wafer carrier 13 is fixed to the carrier fixing portion 9.

Furthermore, the carrier fixing portion 9 is attached on an upper surface of the partition plate 250 in the drying chamber 201, and all the wafers 2 supported by the wafer carrier 13 can be simultaneously immersed in the pure water 40 in a state that pure water is injected and filled into the drying chamber 201 (that is, can be immersed in the upper pure water tank-section 40a). Instead of carrying a plurality of wafers 2 into the drying chamber 201 by using the wafer carrier 13, each wafer 2 may be directly carried into the drying chamber 201 without using the wafer carrier 13 and supported by a substrate support mechanism fixed to the partition plate 250 in the drying chamber 201 so that its supported position is fixed.

Furthermore, the treatment chamber 212 has a lid 211, that can be opened and closed, on an upper surface thereof, and the space 4 in the treatment chamber 212 is made open by opening the lid 211 so that the wafer carrier 13 housing a multiplicity of wafers 2 is fed into or removed from the treatment chamber, that maintenance of an interior of the treatment chamber 212 can be performed, and so forth. By closing the lid 211, the space 4 in the treatment chamber 212 can be sealed. Furthermore, the lid 211 is equipped with two droplet supply devices 3, which, as one example of an isopropyl alcohol supply device, inject nitrogen gas ($N_2$) as one example of an inert gas into the space 4 above the liquid level of pure water 40 stored in the drying chamber 201 in the treatment chamber 212 and, at the same time, inject isopropyl alcohol (hereinafter, simply referred to as IPA) in a liquid phase to supply droplet-like IPA into the space 4. The lid is also equipped with a drying nozzle 5 for injecting nitrogen gas into the space 4. Structure of each droplet supply device 3 is explained in detail later. Furthermore, as one example of the inert gas, nitrogen gas is preferably used due to its ease in handling, but other kinds of inert gases can be used instead of nitrogen gas.

Furthermore, a pure water supply unit 210, which is one example of a tubular pure water supply mechanism, for supplying pure water into the lower pure water tank-section 40b below the partition plate 250 in the drying chamber 201 is disposed in the lower pure water tank-section 40b of the drying chamber 201. Furthermore, the pure water supply unit 210 has a multiplicity of pure water supply holes in an outer periphery of a tube in the lower pure water tank-section 40b so that pure water can be uniformly supplied into the lower pure water tank-section 40b in the drying chamber 201. Furthermore, when the partition plate 250 is stationary, pure water supplied into the lower pure water tank-section 40b can also be supplied into the upper pure water tank-section 40a through the aforementioned gap between an end portion of the partition plate 250 and an inner surface of the drying chamber 201.

Furthermore, the partition plate 250 is maintained substantially parallel to a liquid level of pure water 40 in the drying chamber 201, and can be moved in parallel along the four side surfaces by the partition plate elevating mechanism 214. The partition plate elevating mechanism 214 is disposed to the left of the treatment chamber 212 in FIG. 1, and the treatment chamber 212 and the partition plate elevating mechanism 214 are fixed on a machine base 215 of the wafer drying apparatus 501. The partition plate elevating mechanism 214 includes a ball screw shaft 214a fixed to the machine base 215 in the vertical direction so that it can be rotated about a rotational axis, a drive unit 214b which selectively rotates the ball screw shaft 214a in either a forward or a reverse direction, a nut 214c which can be raised or lowered (that is, elevatable) along the ball screw shaft 214a by meshing it with the ball screw shaft 214a and rotating the ball screw shaft 214a in a forward or reverse direction, a guide 214e which is fixed to the machine base 215 and guides a raising and lowering operation in the vertical direction while fixing the nut 214c in the forward or reverse rotational direction, and an elevating frame 214d which is formed into a portal shape with a plurality of rigid bodies and has one lower end fixed to the nut 214c and another lower end penetrating through an upper surface of the treatment chamber 212 so as to be fixed to an end portion of an upper surface of the partition plate 250 on the left side of in FIG. 1. Examples of the drive unit 214b include a motor that is fixed to a lower end of the ball screw shaft 214a to directly rotate the ball screw shaft 214a in the forward or the reverse directions, and a motor that indirectly rotates the ball screw shaft 214a in the forward or the reverse directions by reciprocally rotating a pulley fixed to the lower end of the ball screw shaft 214a via a belt or the like. In the partition plate elevating mechanism 214, the elevating frame 214d is raised or lowered by rotating the ball screw shaft 214a in the forward or the reverse directions by the drive unit 214b so that the partition plate 250 can be raised or lowered along the side surfaces of the drying chamber 201. Consequently, in the drying chamber 201 in a state that pure water is supplied and the upper pure water tank-section 40a and the lower pure water tank-section 40b are filled with water, by raising the partition plate 250, so as to be positioned at a height position at which all wafers 2 supported by the wafer carrier 13 are immersed in water in the upper pure water tank-section 40a, by the partition plate elevating mechanism 214, the pure water 40 stored in the upper pure water tank-section 40a above the partition plate 250 is raised together with the partition plate 250, and the pure water on the liquid level side of the pure water 40 can be allowed to overflow the drying chamber 201 from an upper end thereof. Furthermore, a range of raising and lowering of the partition plate 250 by the partition plate elevating mechanism 214 is, for example, a range from a position at which upper ends of all wafers 2 supported by the wafer carrier 13 are positioned below the upper end of the drying chamber 201 with some margin (that is, a lower end position of a raising and lowering operation) to a position at which lower ends of all the wafers 2 are positioned above the upper end of the drying chamber 201 with some margin (that is, an upper end position of the raising and lowering operation).

Here, the term "pure water on the liquid level side" means a liquid in the vicinity of the liquid level including the liquid level of pure water 40, and refers to, for example, a liquid in a liquid layer up to about 20 mm below the liquid level. This is applicable both in a case where this liquid is constituted by only pure water and a case where IPA or particles such as silicon compounds are mixed (or dissolved) in pure water.

Furthermore, in the drying chamber 201, an overflow receiving portion 217 having a gutter with a substantially U-shaped cross section with an opening portion facing upwardly is disposed along an outside of upper portions of the four side surfaces of the drying chamber 201, and the gutter with a U-shaped cross section of the overflow receiving portion 217 is integrally formed in a substantially O shape on a plane about an entire outer periphery of the upper portion of the drying chamber 201. Furthermore, a side surface of the gutter of the overflow receiving portion 217 on the side of the drying chamber 201 is formed by an outer side surface of the upper portion of the drying chamber 201, and another side surface is formed so that an upper end thereof should be positioned higher than the upper end of the drying chamber 201. Consequently, when pure water overflows the drying chamber 201, this overflowing pure water can be received by the overflow receiving portion 217. Furthermore, a drainage port 217a is disposed in a bottom of the overflow receiving portion 217, and the overflowing pure water can be drained out of the treatment chamber 212 via a pipe or the like, or directly by drainage port 218 disposed in a bottom portion of the treatment chamber 212. In the first embodiment, the partition plate elevating mechanism 214 is one example of a drainage device.

Figure 5A:
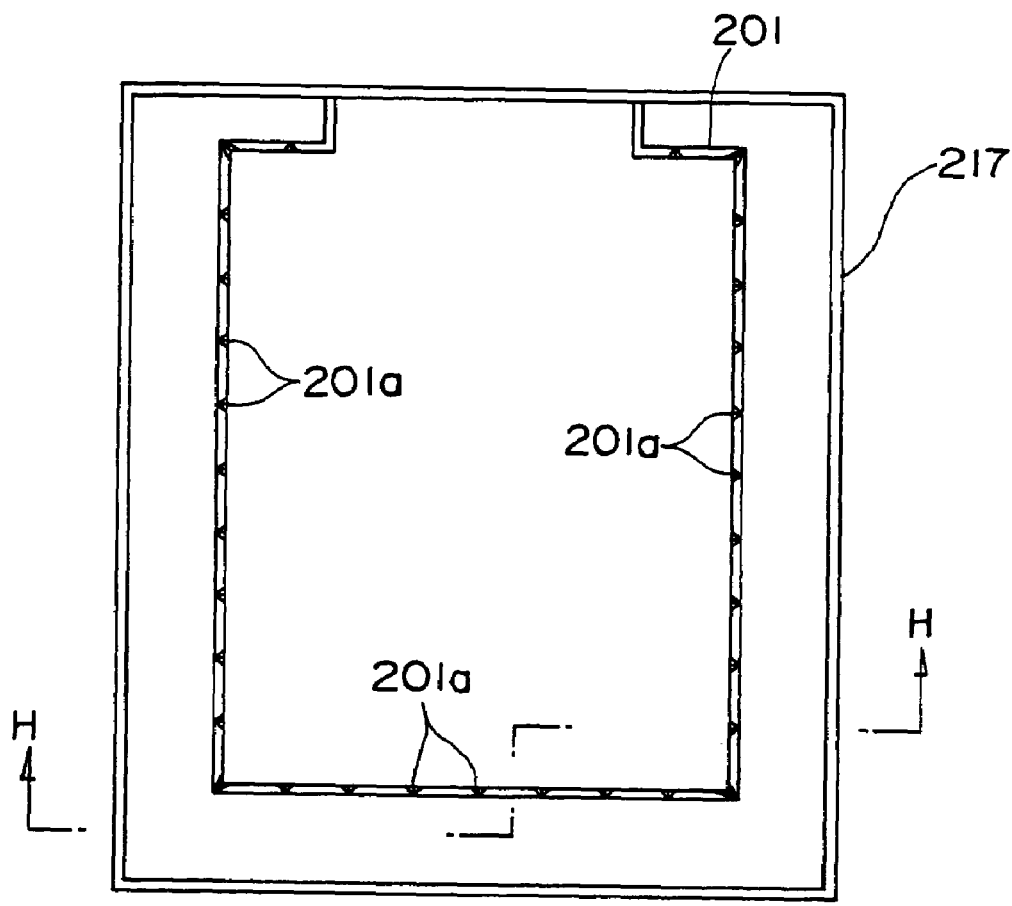
FIG. 5A is an enlarged plan view showing an upper portion of a drying chamber in the wafer drying apparatus of the first embodiment.
Figure 5B:
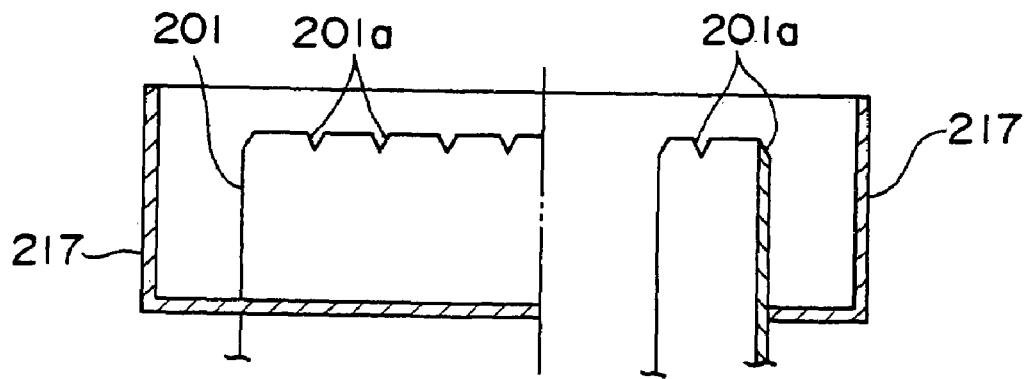
FIG. 5B is a cross sectional view showing the upper portion of the drying chamber along line H—H in FIG. 5A.

Here, an enlarged plan view of the upper portion of the drying chamber 201 equipped with the overflow receiving portion 217 is shown in FIG. 5A. A cross sectional view of the drying chamber 201 along line H—H in FIG. 5A is shown in FIG. 5B. As shown in FIGS. 5A and 5B, a plurality of triangular dams 201a having a V-shaped notch are formed as one example at a constant interval on an edge inside the O-shaped overflow receiving portion 217, that is, the upper end of the drying chamber 201. When pure water on the liquid level side of the pure water 40 is allowed to flow into the overflow receiving portion 217 (that is, overflow), an inflow amount can be easily adjusted and inflow can be smoothly achieved by allowing the water to flow from these triangular dams 201a into the overflow receiving portion 217. The constant interval between the triangular dams 201a may be the same as an interval between wafers 2 supported by the wafer carrier 13.

In the drying chamber 201, by each of the droplet supply devices 3 disposed on the lid 211 of the treatment chamber 212, nitrogen gas is injected into the space 4 above the liquid level of the pure water 40 in the drying chamber 201 in the treatment chamber 212, and, at the same time, liquid-phase IPA is injected at a temperature higher than a temperature of the wafers 2 immersed in the pure water 40 in the upper pure water tank-section 40a and supported by the wafer carrier 13 (for example, room temperature), preferably at least 5° C. or more higher than the temperature of the wafers 2, more preferably higher than the temperature of the wafers 2 by a range from 5° C. to 60° C., to supply droplet-like IPA into the space 4. When the wafers 2 are exposed above the liquid level from the pure water 40 in the drying chamber 201 by draining the pure water 40 in the drying chamber 201 (that is, draining pure water in the upper pure water tank-section 40a), IPA is continuously supplied to surfaces of the wafers 2 from each droplet supply device 3 in droplets; that is, not by using nitrogen as a carrier, but in a state that IPA itself is floating as a simple substance in nitrogen gas, so that pure water 40 attached to the surfaces of the wafers 2 is replaced by the droplet-like IPA.

Figure 6A:
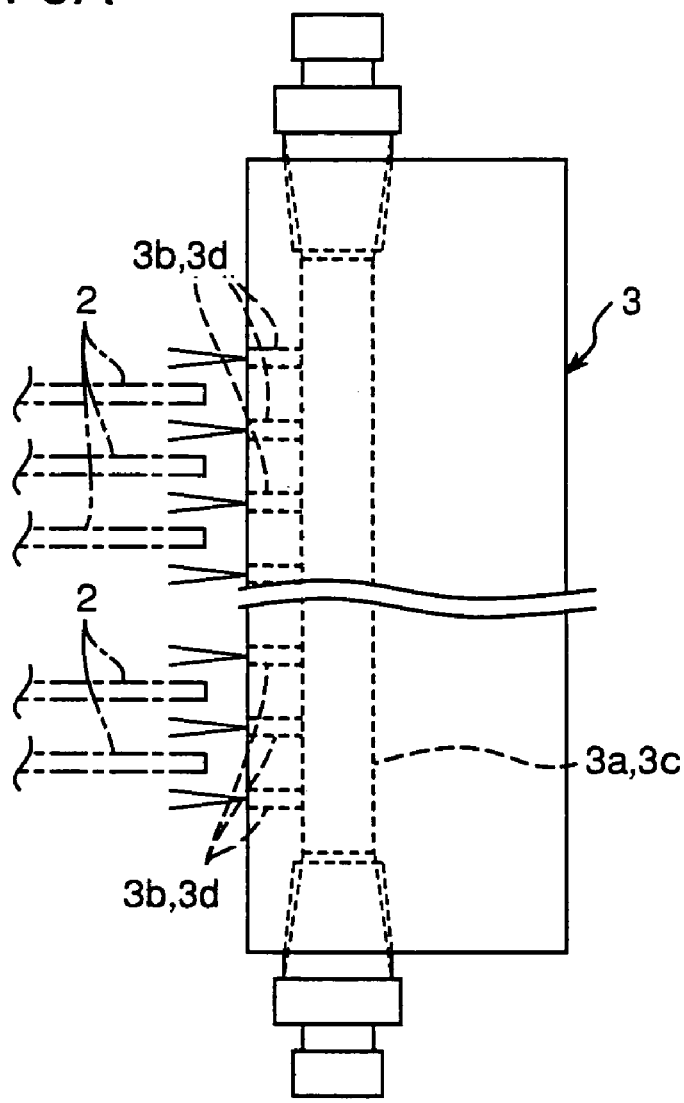
FIG. 6A is a plan view showing a mist spray device of the wafer drying apparatus of the first embodiment.
Figure 6B:
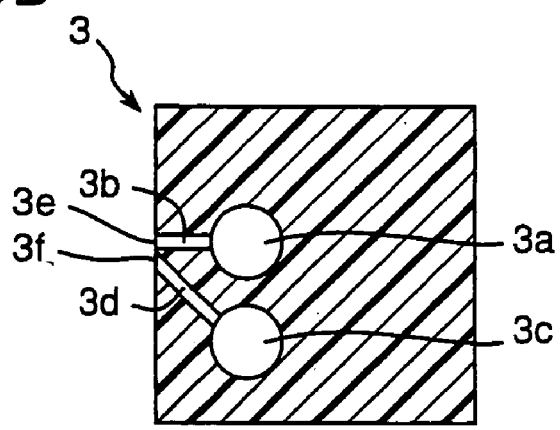
FIG. 6B is a cross sectional view showing the mist spray device.

Here, the structure of each droplet supply device 3 is explained in detail with reference to FIGS. 6A and 6B. As shown in FIGS. 6A and 6B, each droplet supply device 3 has a nitrogen gas passage 3a and a passage 3c for liquid-phase IPA, formed by penetrating a rectangular main body made of a fluororesin along a longitudinal direction, and includes a multiplicity of thin nitrogen gas injection passages 3b each having an injection port 3e extending from the nitrogen gas passage 3a and opened substantially towards the wafers 2 (specifically, a space between adjacent wafers 2 and a position corresponding to a center of the wafers 2) as well as a multiplicity of thin IPA injection passages 3d each having an injection port 3f extending from the IPA passage 3c and opened towards the injection port 3e at an opening end of the nitrogen gas injection passage 3b. Therefore, when nitrogen gas is injected from the injection ports 3e of the nitrogen gas injection passage 3b, liquid-phase IPA can be injected from injection port 3f of IPA injection passage 3d at the same time to supply droplet-like IPA into the space 4. An injection port 3e of the nitrogen gas injection passage 3b and a corresponding injection port 3f of the IPA injection passage 3d constitute one pair of droplet supplying nozzles. Each pair of droplet supplying nozzles is disposed so as to be opposed to the space between adjacent wafers 2 of, for example, about 50 wafers 2 placed at a predetermined interval, and droplet supplying nozzles are also disposed outside of the wafers 2 at both ends in the space 4 so that IPA droplets can be jetted and supplied to entire surfaces of all wafers 2 from the droplet supplying nozzles.

Instead of jetting and supplying droplet-like IPA into the space 4 by the droplet supply device 3 as described above, gaseous IPA may be injected into the space 4 by a known injection device. In such a case, when wafers 2 are exposed above the liquid level from the pure water 40 in the drying chamber 201, IPA is continuously injected in a gaseous state from the known injection device to the surfaces of the wafers 2, and pure water 40 attached to the surfaces of the wafers 2 can be replaced with the IPA in the gaseous state (or liquid-phase IPA obtained by condensing the gaseous IPA). Furthermore, instead of supplying droplet-like IPA into the space 4 by the droplet supply device 3, mist-like IPA may be injected into the space 4 since the mist-like IPA can also achieve the same effect as that of the droplet-like IPA.

Meanwhile, nitrogen gas is supplied at room temperature or a temperature of wafers 2, or supplied at a temperature higher than room temperature (for example, a high temperature in a range exceeding room temperature or a temperature of the wafers 2 up to 60° C.), preferably at least 5° C. or more higher than room temperature or the temperature of the wafers 2, more preferably at a high temperature in a range from 5° C. to 60° C. higher than room temperature or the temperature of the wafers 2. As shown in FIG. 4, nitrogen gas is supplied to the droplet supply devices 3 disposed on the right and left of the lid 211 of the treatment chamber 212 in FIG. 2 via a filter 39, a pressure-reducing valve 29, a first air operation valve 30, and a flowmeter 31. It is preferable that the first air operation valve 30 automatically regulates a flow rate of nitrogen gas based on a flow rate of the nitrogen gas detected by the flowmeter 31. As a result, droplets are injected at a temperature higher than room temperature or the temperature of the wafers 2, preferably at least 5° C. or more higher than room temperature or the temperature of the wafers 2, more preferably at a high temperature in a range from 5° C. to 60° C. higher than room temperature or the temperature of the wafers 2. When the nitrogen gas is supplied to right and left droplet supply devices 3, the nitrogen gas can be supplied into the nitrogen gas passage 3a from one end side of each droplet supply device 3 towards a blocked portion at another end in one direction. This is advantageous in that structure is simplified. However, when a pressure loss occurs in the nitrogen gas passage 3a and nitrogen gas cannot be uniformly injected from injection ports 3e of all nitrogen gas injection passages 3b, the nitrogen gas can be supplied into the nitrogen gas passage 3a from both the one end side and another end side of each droplet supply device 3 towards a middle therebetween at the same time. As a result, a pressure loss can be prevented in the nitrogen gas passage 3a, and nitrogen gas can be uniformly injected from the injection ports 3e.

Furthermore, as shown in FIG. 4, nitrogen gas is supplied to a drying nozzle 5 disposed in a center of the lid 211 of the treatment chamber 212 in FIG. 2 via the filter 39, a pressure-reducing valve 20, and eighth air operation valve 28. After pure water 40 attached to surfaces of the wafers 2 is replaced with IPA, evaporation of IPA and drying can be accelerated by injecting nitrogen gas via the drying nozzle 5.

Furthermore, in FIG. 4, by pressure of nitrogen gas transferred by pressure into IPA pressurizing tank 41 via the filter 39, a pressure-reducing valve 20, a second air operation valve 21, and a filter 22, IPA liquid 42 in the IPA pressurizing tank 41 is supplied into the droplet supply devices 3 disposed on the right and left of the lid 211 of the treatment chamber 212 in FIG. 2 via a third air operation valve 24, and further via each filter 25, flowmeter 26, and fourth air operation valve 27. Reference numeral 23 denotes a relief valve for the IPA pressurizing tank. The fourth air operation valves 27 are included in each of the right and left droplet supply devices 3. By automatically regulating a flow rate of IPA liquid, and based on a flow rate of IPA liquid detected by each flowmeter 26, a balance in the right and left droplet supplies is automatically regulated when droplets are supplied from the right and left droplet supply devices 3 into the space 4 above the liquid level of the pure water 40 in the drying chamber 201. When IPA liquid is supplied into each of the right and left droplet supply devices 3, the liquid can be supplied into the IPA passage 3c from one end side of each droplet supply device 3 towards a blocked portion at the other end in one direction. This is advantageous in that structure is simplified. However, when a pressure loss occurs in the IPA passage 3c, and IPA liquid cannot be uniformly injected from all the injection ports 3f of IPA injection passage 3d to uniformly supply IPA droplets, IPA liquid can be supplied into the IPA passage 3c from both the one end side and the other end side of each droplet supply device 3 towards the middle therebetween at the same time. As a result, a pressure loss can be prevented in the IPA passage 3c, and IPA liquid can be uniformly injected from the injection ports 3f.

Furthermore, as shown in FIG. 4, to prevent an abnormal increase in pressure in the space 4 in the treatment chamber 212, the treatment chamber 212 has an exhaust passage 43, a manual valve 7 for regulating an exhaust flow rate, and a fifth air operation valve 8 for starting and stopping exhaust. A pressure sensor can be disposed in the space 4 so that the fifth air operation valve 8 is automatically opened or closed depending on pressure in the space 4 as detected by the pressure sensor.

Furthermore, as shown in FIG. 4, the drainage port 219 in the bottom portion of the drying chamber 201 has a sixth air operation valve 35 so that a drainage flow rate is regulated. Furthermore, the drainage port 218 in the bottom portion of the treatment chamber 212 has a drainage passage 44, a drainage passage from the drainage port 217a in the overflow receiving portion 217 is connected to this drainage passage 44 in the treatment chamber 212, and drainage is performed from the treatment chamber 212 out of the wafer drying apparatus 501 via the drainage passage 44. It is not shown, but a water sealing mechanism is disposed on the drainage passage 44 to maintain pressure in the space 4 in the treatment chamber 212.

Furthermore, as shown in FIG. 4, a pure water supply passage 45 is connected to the pure water supply unit 210 disposed in the lower pure water tank-section 40b in the drying chamber 201, and pure water is supplied into the pure water supply unit 210 via a manual valve 32, a flowmeter 33, and a seventh air operation valve 34 disposed in a path of the pure water supply passage 45. It is preferable that an opening angle of the seventh air operation valve 34 is automatically regulated based on a flow rate of pure water as detected by the flowmeter 33 to automatically regulate the flow rate of pure water.

The first air operation valve 30, second air operation valve 21, third air operation valve 24, fourth air operation valves 27, fifth air operation valve 8, sixth air operation valve 35, seventh air operation valve 34, and eighth air operation valve 28 are connected to a control unit 47 so that operations for respective flow rates of nitrogen gas and IPA liquid supplied into the space 4 in the treatment chamber 212 (that is a supply state of IPA droplets), exhaust amount from the space 4, drainage amount of the pure water 40, and the like can be automatically controlled based on a predetermined program or the like. Furthermore, the control unit 47 can also control operations of the partition plate elevating mechanism 214.

Procedures of drying wafers 2 in the wafer drying apparatus 501 having the above constitution are explained below.

First, in FIGS. 1 to 4, the seventh air operation valve 34 in the pure water supply passage 45 is opened to supply pure water into the drying chamber 201 via the pure water supply unit 210 and fill the lower pure water tank-section 40b. Then, the pure water is supplied from the lower pure water tank-section 40b through the gap between the periphery of the partition plate 250 and the inner surface of the drying chamber 201 to fill the upper pure water tank-section 40a. Then, the lid 211 is opened, the wafer carrier 13 supporting a plurality of wafers 2 is carried into the treatment chamber 212, and the wafer carrier 13 is immersed in pure water 40 in the drying chamber 201 and fixed by the carrier fixing portion 9. At this time, by allowing pure water to overflow the drying chamber 201 into the overflow receiving portion 217, particles in the upper pure water tank-section 40a of the drying chamber 201 in which the wafers 2 are immersed are floated in the vicinity of the liquid level of pure water 40, and washing is performed by draining these particles out of the drying chamber 201 together with the overflowing pure water.

Subsequently, in a state that the exhaust passage 43 is closed, that is, in a state that the space 4 in the treatment chamber 212 is sealed, nitrogen gas is injected from each droplet supply device 3, and, at the same time, IPA liquid is injected in the vicinity of an injection opening of the nitrogen gas to supply IPA droplets into the space 4 at a rate of, for example, about 2 cc/min. A direction in which the droplets are supplied is generally downward, which is a direction substantially towards the wafers 2 in pure water 40 (specifically, a direction towards a space between adjacent wafers 2 and a position corresponding to a center of each wafer 2), and it is preferable that droplets are uniformly maintained above the liquid level of pure water 40. At this time, in a case where pressure in the space 4 of the drying chamber 201 is abnormally increased, it is preferable to open the exhaust passage 43 to lower the pressure.

Subsequently, while droplets are continuously supplied to maintain such a state that the vicinity of the liquid level of the pure water 40 in the space 4 is covered with numerous IPA droplets, the partition plate elevating mechanism 214 is controlled by control of the control unit 47, and the partition plate 250 positioned at the lower end position of the raising and lowering operation is gradually raised at a constant speed. An example of this raising speed of the partition plate 250 is equal to or less than about 10 mm per second, preferably about 2 mm per second, for example, when droplets are supplied at about 2 cc/min.

With this start of the raise of the partition plate 250, generally radial flows occur in directions towards an entire periphery of the upper end of the drying chamber 201 from the vicinity of the center of the liquid level in the pure water 40 in the drying chamber 201. The pure water on the liquid level side of the pure water 40 flows into the overflow receiving portion 217 via the triangular dams 201a, and the pure water on the liquid level side that flows from the drainage port 217a of the overflow receiving portion 217 into the overflow receiving portion 217 is drained through the drainage passage.

An amount of the pure water supplied into the lower pure water tank-section 40b via the pure water supply unit 210 is controlled depending on a drainage amount of the pure water on the liquid level along with the raise of the partition plate 250 by control of the seventh air operation valve 34 by the control unit 47. That is, by the raise of the partition plate 250, pure water in an amount corresponding to an increase of volume of the lower pure water tank-section 40b is supplied to the lower pure water tank-section 40b. Therefore, when the upper pure water tank-section 40a is raised by raising of the partition plate 250, a pure water flow rarely occurs in the gap between the periphery of the partition plate 250 and the inner surface of the drying chamber 201. Consequently, only the pure water in the upper pure water tank-section 40a can be raised and drained by raising of the partition plate 250.

When the raising operation of the partition plate 250 can be smoothly performed by the partition plate elevating mechanism 214, an amount of pure water supplied into the lower pure water tank-section 40b of the drying chamber 201 via the pure water supply unit 210 may be more or less than an increase in volume of the lower pure water tank-section 40b along with raising of the partition plate 250 depending on a size of the gap between the periphery of the partition plate 250 and the inner surface of the drying chamber 201.

Therefore, when pure water on the liquid level side is drained, the partition plate 250 is raised at a raising speed at which generally radial surface flows can be generated on the liquid level. Consequently, pure water at the liquid level or in the vicinity of the liquid level of pure water 40 in which IPA is dissolved, and floating particles or the like, can be allowed to flow into the overflow receiving portion 217 by the aforementioned surface flows together with the pure water on the liquid level side and drained.

As a result, upper portions of wafers 2 raised along with the raising of the partition plate 250 are exposed above the liquid level of the pure water 40, but the surfaces of the wafers 2 are not brought into contact with oxygen and naturally oxidized, since pure water attached to the surfaces of the wafers 2 is immediately replaced with IPA droplets uniformly sprayed to the liquid level of the pure water 40 continuously.

Then, when the partition plate 250 is raised to an upper end position of the raising operation, that is, lower ends of the wafers 2, supported by the wafer carrier 13 raised together with the partition plate 250, are raised until they are positioned above the upper end of the drying chamber 201 with some margin, raising of the partition plate 250 is stopped. Each wafer 2 is completely exposed from the pure water 40, and replacement of pure water attached to each surface of the wafers 2 with IPA is completed. Then, supply of droplets from the droplet supply device 3 is stopped, and spray of nitrogen gas from the drying nozzle 5 is started. Consequently, evaporation of IPA from each surface of the wafers 2 is accelerated, and the surfaces of the wafers 2 are dried. After completion of this drying, spray of nitrogen gas from the drying nozzle is stopped. Thus, a drying treatment of the wafers 2 is completed. Instead of injecting nitrogen gas from the drying nozzle 5, IPA may be spontaneously evaporated from the surfaces of the wafers 2 by leaving the wafers 2 as they are.

Then, the lid 211 of the treatment chamber 212 is opened, fixation of the wafer carrier 13 by the carrier fixing portion 9 is released, and the wafers 2 together with the wafer carrier 13 are carried upwardly out of the treatment chamber 212.

Furthermore, when a temperature of IPA or nitrogen gas, or that of IPA and nitrogen gas, is higher than room temperature, which is a temperature of the wafers 2, preferably at least 5° C. higher, more preferably higher in a range from 5° C. to 60° C., and IPA droplets at the aforementioned temperature are supplied, evaporation of IPA from each surface of the wafers 2 can be accelerated, and each wafer 2 can be rapidly dried. For example, when the wafers 2 are at room temperature, IPA droplets are supplied at any temperature in the aforementioned range. When fifty wafers are dried, the wafers can be dried in a drying time of at most ten minutes.

When the pure water on the liquid level side of pure water 40 is drained by raising the partition plate 250, pure water may be further supplied from the pure water supply unit 210 in an amount of, for example, about 30 L/min, preferably, about 4 L/min more than an amount for filling an increase in volume of the lower pure water tank-section 40b. In such a case, particles or the like in pure water 40 are positively raised by this excessively supplied pure water to the liquid level side and can be rapidly and smoothly drained together with the pure water on the liquid level side.

Furthermore, another pure water supply unit (not shown) may be further included in the upper pure water tank-section 40a separately from the pure water supply unit 210 included in the lower pure water tank-section 40b. In such a case, when pure water is filled in the drying chamber 201, pure water is supplied into the lower pure water tank-section 40b by the pure water supply unit 210, and pure water can be supplied into the upper pure water tank-section 40a by this separate pure water supply unit. Therefore, a time required for an initial supply of pure water into the drying chamber 201 can be shortened. Furthermore, by further supplying pure water by the separate pure water supply unit into the upper pure water tank-section 40a filled with pure water, and forcibly allowing pure water to overflow the upper pure water tank-section 40a, particles or the like in the upper pure water tank-section 40a can be easily and rapidly removed.

Furthermore, instead of forming all of a plurality of triangular dams 201a disposed at the upper end of the drying chamber 201 at a constant interval, the plurality of triangular darns 201*a* may be formed at a shorter interval at upper ends of side surfaces of the drying chamber 201 opposed to each other in a direction along surfaces of the wafers 2 supported by the wafer carrier 13, and at a longer interval at upper ends of side surfaces of the drying chamber 201 opposed to each other in a direction perpendicular to the surfaces of the wafers 2. In such a case, the aforementioned generally radial flows generated from the vicinity of the center of the liquid level in the directions of the entire periphery of the upper ends of the four side surfaces of the drying chamber 201, when pure water on the liquid level side of pure water 40 is allowed to flow into the overflow receiving portion 217, can be made stronger in a direction along the surfaces of the wafers 2. Consequently, a part of each wafer 2 is exposed above the liquid level of the pure water 40, the pure water on the liquid level side between adjacent wafers 2 can be drained by this strong flow, and a draining property of the pure water between the wafers 2 at the liquid level or in the vicinity of the liquid level in which IPA is dissolved, and of floating particles or the like, can be made favorable.

When fine adjustment of a drainage flow rate is not required upon drainage of pure water on the liquid level side from the drying chamber 201, no triangular dams 201*a* may be formed instead of forming a plurality of triangular dams 201*a* at the upper end of the drying chamber 201.

Furthermore, it is not limited to a case in which the triangular dams 201*a* are formed on each of the four side surfaces of the drying chamber 201. For example, a plurality of triangular dams 201*a* may be disposed on only side surfaces opposed to each other in directions along surfaces of the wafers 2 supported by the wafer carrier 13 among the four side surfaces.

In such a case, when pure water on the liquid level side of the pure water 40 is allowed to flow into the overflow receiving portion 217, flows in directions along surfaces of the wafers 2 from the vicinity of a center of the liquid level towards the upper end side of the drying chamber 201 at which the triangular dams 201*a* are formed, that is, surface flows in two directions opposed to each other in the directions along the surfaces, can be generated on the liquid level. Consequently, when a part of each wafer 2 is exposed above the liquid level of pure water 40, pure water on the liquid level side between adjacent wafers 2 can be drained by the surface flows in opposite directions, and a draining property of pure water between the two wafers 2 at liquid level or in the vicinity of the liquid level in which IPA is dissolved, and of floating particles or the like, can be made favorable.

Furthermore, when pure water on the liquid level side is drained, the partition plate 250 is raised at a raising speed at which the surface flows in the two directions can be generated on the liquid level. Consequently, particles or the like floating at the liquid level or in the vicinity of the liquid level of the pure water 40 can be allowed to flow into the overflow receiving portion 217 together with the pure water on the liquid level side by the surface flows in the two directions and drained.

Furthermore, instead of disposing the triangular dams 201*a* only at one pair of upper ends opposed to each other, a plurality of triangular dams 201*a* may be disposed at only one upper end of the pair of upper ends. In such a case, when pure water on the liquid level of pure water 40 is allowed to flow into the overflow receiving portion 217, a one-way surface flow from a side of the upper end of the pair of upper ends at which triangular dams 201*a* are not disposed to a side of the upper end at which the triangular dams 201*a* are disposed in a direction along the surfaces of the wafers 2 can be generated on the liquid level. Consequently, when a part of each wafer 2 is exposed above the liquid level of the pure water 40, pure water on the liquid level side between adjacent wafers 2 can be drained by the one-way surface flow, and a draining property of the pure water between the two wafers 2 at the liquid level or in the vicinity of the liquid level in which IPA is dissolved, and of floating particles or the like, can be made favorable.

Furthermore, when pure water on the liquid level side is drained, the partition plate 250 is raised at a raising speed at which the one-way surface flow can be generated on the liquid level. Consequently, particles or the like floating at the liquid level or in the vicinity of the liquid level of the pure water 40 can be allowed to flow into the overflow receiving portion 217 together with the pure water on the liquid level side by the one-way surface flow and drained.

Figure 25A:
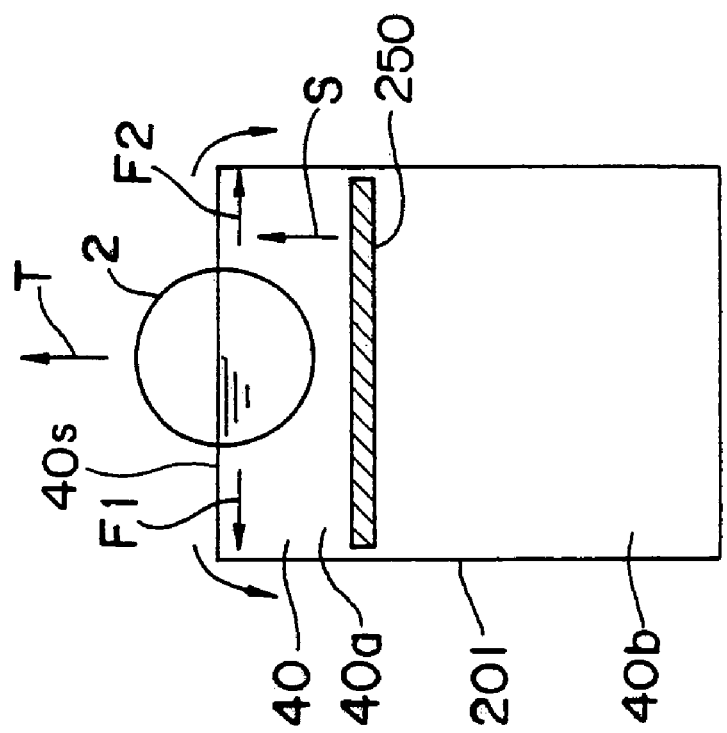
Figure 25B:
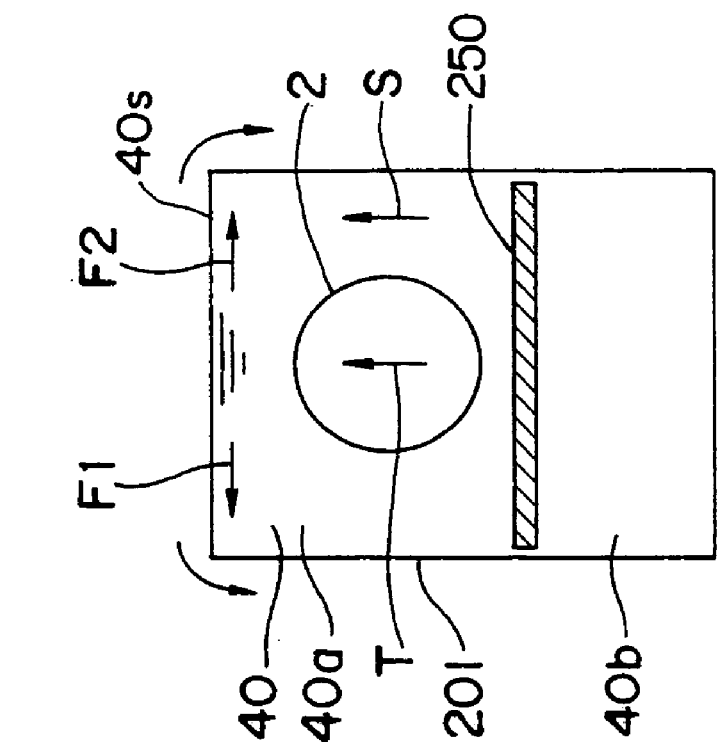

Here, the surface flows generated on the liquid level when wafers 2 are exposed above the liquid level of the pure water 40 in the drying chamber 201 are explained in detail. As one example of such cases, FIGS. 25A and 25B show schematic explanatory views when a wafer 2 is exposed above the liquid level in the case where the aforementioned surface flows in the two opposed directions along the surfaces of the wafers 2 are formed at the liquid level of the pure water 40. FIG. 25A shows a state in which raising of wafers 2 immersed in the pure water 40 in the upper pure water tank-section 40*a* is started, and the wafers 2 are still completely immersed in the pure water 40. FIG. 25B shows a state thereafter when raising of the wafers 2 is further proceeded, and upper portions of the wafers 2 are exposed above liquid level 40*s* of the pure water 40.

First, as shown in FIG. 25A, raising of the partition plate 250 is started in the drying chamber 201, and, at the same time, the wafers 2 fixed on and supported by the partition plate 250 are raised with a velocity vector T. At the same time, the pure water 40 in the upper pure water tank-section 40*a* is raised with a velocity vector S. The velocity vector T of the wafers 2 and the velocity vector S of the pure water 40 have the same directions and size (length). That is, this is a state where the wafers 2 immersed in the pure water 40 and their surrounding the pure water 40 are relatively stationary relative to each other.

Subsequently, as shown in FIG. 25B, when the partition plate 250 is further raised in the drying chamber 201, an upper portion of the wafers 2 raised with the velocity vector T is exposed above the liquid level 40*s* of the pure water 40. Furthermore, as shown in FIGS. 25A and 25B, by raising the pure water 40 in the upper pure water tank-section 40*a* along with raising of the partition plate 250, surface flows in two opposed directions along surfaces of the wafers 2, i.e. F1 (a surface flow in the left direction in the figure) and F2 (a surface flow in the right direction in the figure), are formed at the liquid level 40*s* of the pure water 40 or in the vicinity thereof. Pure water on the liquid level side is drained from the drying chamber 201 at the liquid level 40*s* of the pure water 40 or in the vicinity thereof by these surface flows F1 and F2. Furthermore, the pure water 40 is raised with the velocity vector S as shown in FIG. 25B. However, since this raised pure water 40 becomes the pure water on the liquid level side at the liquid level 40*s* of the pure water 40 or in the vicinity thereof, and the pure water on the liquid level side is successively drained, a height of the liquid level 40*s* of the pure water 40 is maintained substantially constant. Consequently, in a state shown in FIG. 25B, a relative velocity difference, that is, a velocity difference corresponding to the velocity vector T, is generated between each wafer 2 and the pure water 40. With this velocity difference, the wafers 2 are exposed from the liquid level 40s of the pure water 40 in which the surface flows F1 and F2 are generated.

Figure 7B:
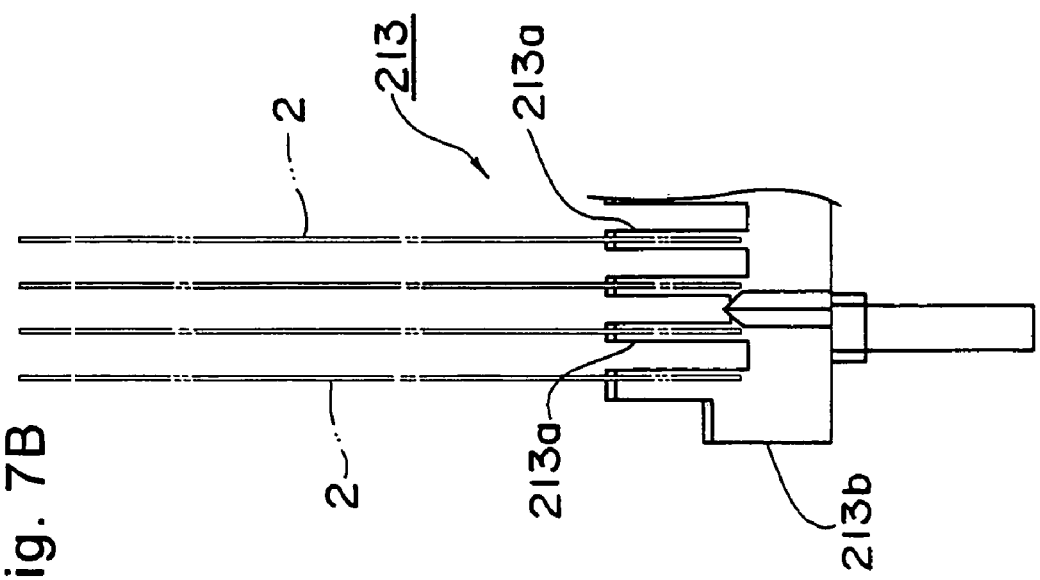
FIG. 7B is a side view showing the wafer holder in FIG. 7A.
Figure 7A:
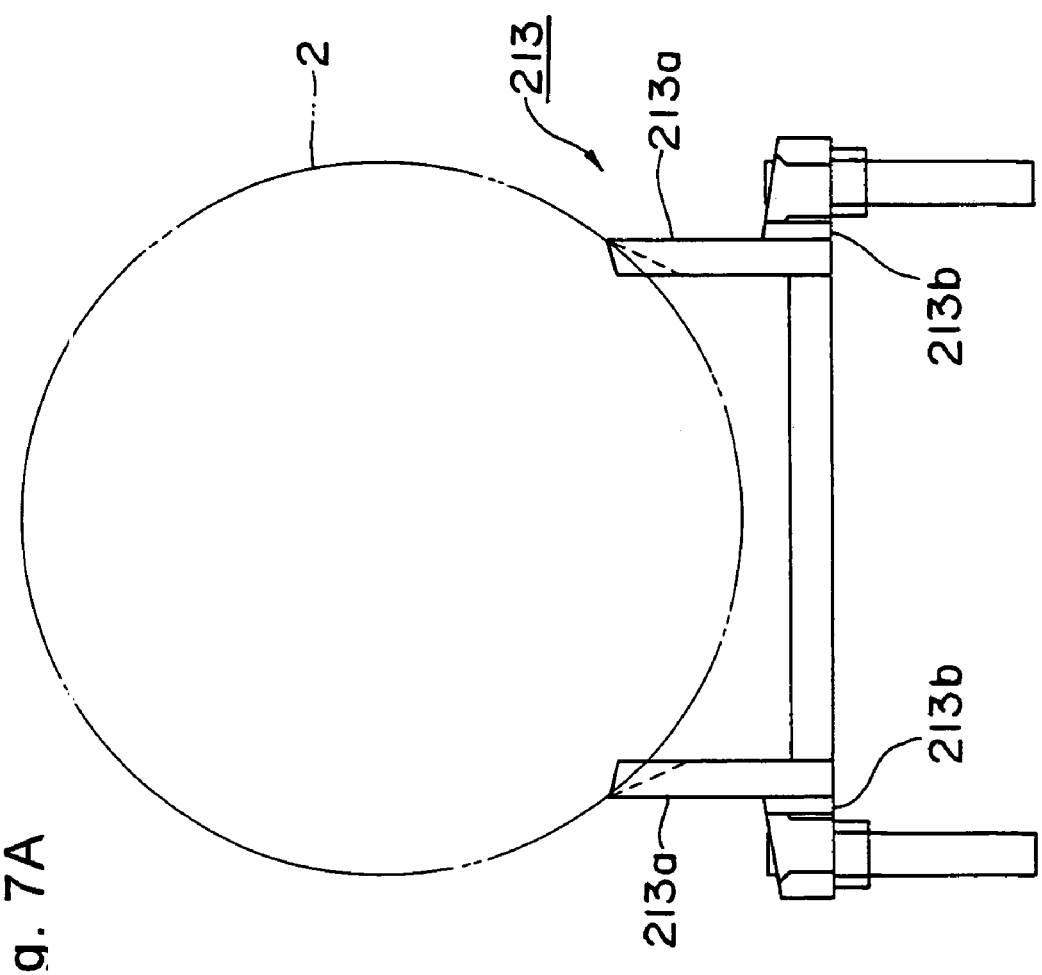
FIG. 7A is a partially enlarged front view showing a wafer holder in the wafer drying apparatus of the first embodiment.

Furthermore, instead of using known wafer carrier 13, a wafer holder 213 as shown in FIGS. 7A and 7B may be used. FIGS. 7A and 7B are partially enlarged side views showing the wafer holder 213.

As shown in FIGS. 7A and 7B, the wafer holder 213 includes a frame 213b in which a plurality of wafer support portions 213a, that can support disk-like wafers 2 at a constant interval at two symmetrical positions along its surface at a lower portion of the disc-like wafers, is formed. Furthermore, as shown in FIG. 7B, each wafer support portion 213a is formed in a toothed shape on the frame 213b, and spaces are secured at a constant interval between the wafer support portions 213a adjacent to each other in a direction of arrangement of the wafers 2. Consequently, the spaces can be secured from the upper end to the lower end of wafer 2 between adjacent wafers 2 in a direction along surfaces of the wafers 2 and a direction along the liquid level of the pure water 40.

When the wafers 2 immersed in the pure water 40 are exposed above the liquid level by using such a wafer holder 213, drainage of pure water between the wafers 2 at the liquid level or in the vicinity of the liquid level in which IPA is dissolved, and of floating particles or the like, can be made further favorable by surface flows generated on the liquid level and in the direction along the surfaces of the wafers 2.

Figure 24:
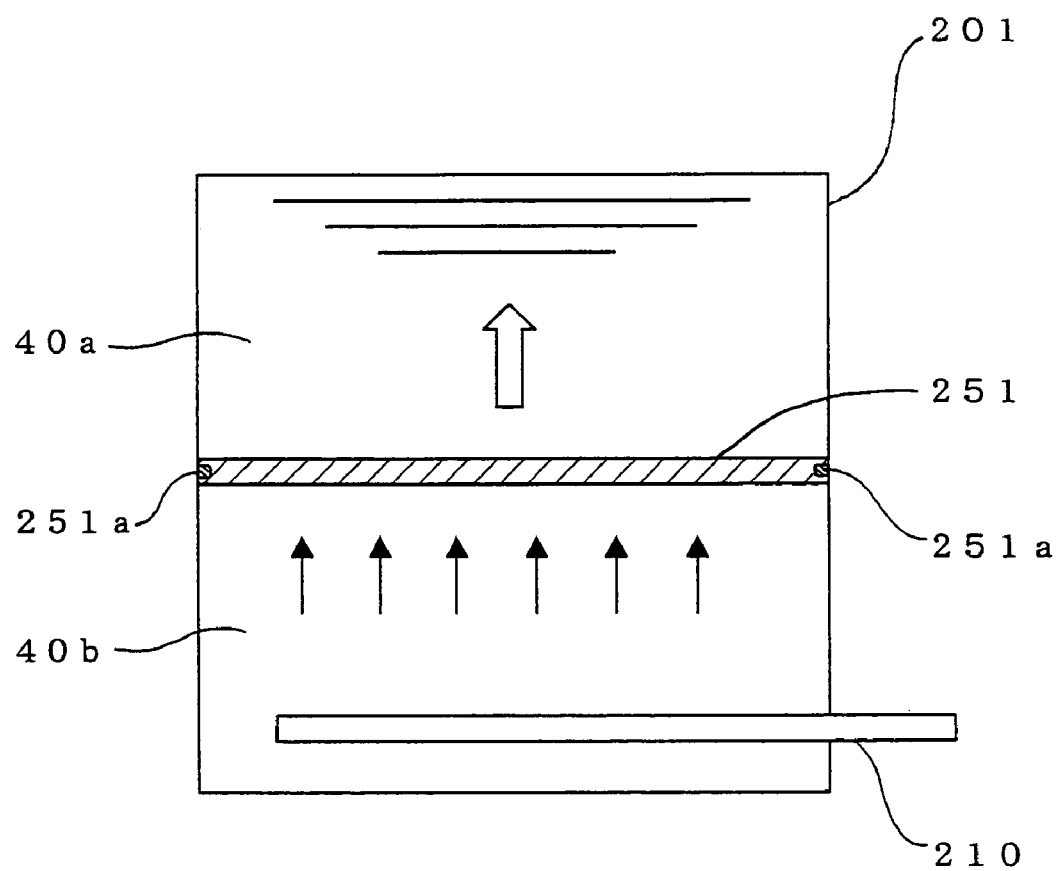
FIG. 24 is a schematic explanatory view showing a drying chamber of a wafer drying apparatus according to a modification of the first embodiment of the present invention.

Furthermore, instead of including the aforementioned gap between the entire periphery of the partition plate 250 and the inner surface of the drying chamber 201, a sealing 251a may be included between the entire periphery of the partition plate 250 and the inner surface of the drying chamber 201 without providing the gap as shown in a schematic explanatory view of the drying chamber 201 in FIG. 24. In such a case, the partition plate 251 is not raised by the partition plate elevating mechanism 214, but the partition plate 251 can be raised along the inner surface of the drying chamber 201 by water pressure of pure water supplied into the lower pure water tank-section 40b by the pure water supply unit 210. Therefore, a wafer drying apparatus can be made compact without requiring a mechanical mechanism for raising the partition plate 251; that is, a mechanism such as the partition plate elevating mechanism 214, and manufacturing costs of the wafer drying apparatus can be reduced.

Figure 26:
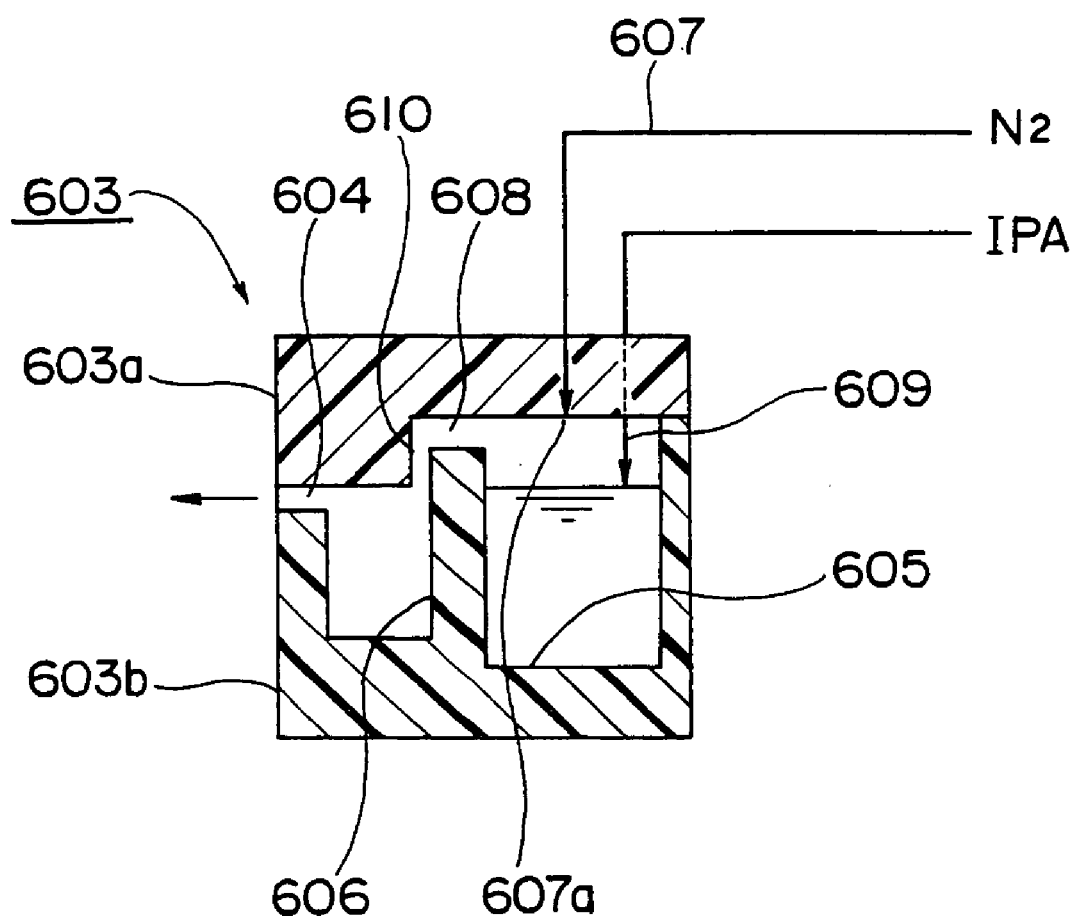
FIG. 26 is a schematic cross sectional view showing a schematic structure of a droplet supply device according to a modification of a droplet supply device in the wafer drying apparatus of the first embodiment of the invention.

Furthermore, it is possible that droplets having a large particle size, which do not float in nitrogen gas but fall even in a short time, are included in numerous IPA droplets supplied into the space 4 by each droplet supply device 3 of the wafer drying apparatus 501. Or, it is possible that IPA does not become droplets, but flows into the space 4 as a gas. As a droplet supply device that can prevent such a problem, a droplet supply device 603 according to a modification of the droplet supply device 3 in the wafer drying apparatus 501 of this first embodiment is explained below. A schematic cross sectional view schematically showing a structure of this droplet supply device 603 is shown in FIG. 26. It is noted that a cross sectional view of the droplet supply device 603 shown in FIG. 26 is a cross sectional view corresponding to the cross sectional view of the droplet supply device 3 shown in FIG. 6B.

As shown in FIG. 26, the droplet supply device 603 includes, for example, two gas passages formed along a longitudinal direction of a rectangular main body made of a fluororesin, and a multiplicity of supply holes 604 for guiding nitrogen gas and IPA supplied or passed through the two gas passages so as to be supplied into the space 4. The droplet supply device 603 is attached to lid 211 so that two droplet supply devices 603 are opposed to each other, and, each longitudinal direction is along a direction of arrangement of wafers 2 as in the case of each droplet supply device 3 included in the wafer drying apparatus 501 shown in FIG. 2.

Furthermore, as shown in FIG. 26, the main body of the droplet supply device 603 is divided into two structures, that is, an upper portion side main body 603a and a lower portion side main body 603b. By surrounding a first gutter 605 (gutter on the right side of the figure) and a second gutter 606 (gutter on the left side of the figure), which are two gutters formed along the longitudinal direction in an upper portion of the lower portion side main body 603b, with a lower portion of the upper portion side main body 603a, the two gas passages are formed as adjacent to each other. Furthermore, a nitrogen gas supply passage 607 is connected to an upper side, in the figure, of the first gutter 605, that is, a lower surface of the upper portion side main body 603a, and nitrogen gas is jetted substantially vertically downwardly from a multiplicity of nitrogen gas injection ports 607a disposed at an end portion of the nitrogen gas supply passage 607, and can be supplied into the first gutter 605. Furthermore, an IPA supply passage 609 is connected to the first gutter 605, so that liquid-phase IPA can be supplied into the first gutter 605. As shown in FIG. 26, the first gutter 605 has a substantially U-shaped cross section, and liquid-phase IPA supplied from the IPA supply passage 609 can be reserved in the first gutter 605 having the substantially U-shaped cross section. That is, the first gutter 605 is also a reservoir of liquid-phase IPA. Furthermore, a supply passage 608 is formed to connect the first gutter 605 and the second gutter 606 formed as adjacent to each other in the vicinity of upper portions thereof. Furthermore, supply holes 604 are formed in the vicinity of an upper left portion of the second gutter 606 in the figure.

Furthermore, a height of each formed supply hole 604 is such that the height of the supply hole 604 and a height of the formed supply passage 608 do not become the same. Furthermore, the supply passage 608 for connecting the first gutter 605 and the second gutter 606 in the vicinity of their upper portions is not linear, but formed by bending it downwards in a middle of the passage in a substantially L shape. Furthermore, a wall surface of this bent portion in this supply passage 608 serves as a hit portion 610, so that a fluid such as a gas that flows out from the first gutter 605 to the second gutter 606 through the supply passage 608 collides against the hit portion 610 and can change its flow-out direction to a downward direction.

Furthermore, an injection port diameter, positioning pitch, and injection direction of each nitrogen gas injection port 607a are set, and an initial velocity of injection of nitrogen gas from each nitrogen gas injection port 607a is set so that nitrogen gas can be injected at a high speed towards the liquid level of liquid-phase IPA supplied and reserved in the first gutter 605. A direction of the nitrogen gas injection from the nitrogen gas injection port 607a is not limited to a substantially vertically downward direction, but may be set to be a diagonally downward direction. Furthermore, a multiplicity of supply holes 604 included in the droplet supply device 603 is not limited to the aforementioned form, but may be, for example, a slit-like supply unit formed along the longitudinal direction of the main body. Such a slit-like supply unit can be regarded as one integral slit formed by arranging the multiplicity of supply holes 604 next to each other and can perform similar functions.

A case where droplet-like IPA is sprayed from each supply hole 604 of the droplet supply device 603 having the above constitution is explained below. First, liquid-phase IPA is supplied from the IPA supply passage 609 into the first gutter 605 and reserved, and, at the same time, nitrogen gas is injected from each nitrogen gas injection port 607a through the nitrogen gas supply passage 607 and sprayed at the liquid level of the reserved liquid-phase IPA at a high speed. Consequently, the liquid-phase IPA reserved in the first gutter 605 becomes a multiplicity of fine IPA droplets. The multiplicity of IPA droplets thus generated flow out and are supplied into the second gutter 606 through the supply passage 608 together with the nitrogen gas, and further sprayed out from the supply holes 604. Here, the first gutter 605 and the supply holes 604 are connected, not directly by the supply passage 608, but via the second gutter 606, and the hit portion 610 is formed in the middle of the supply passage 608. Therefore, when the IPA droplets are supplied from the first gutter 605 into the second gutter 606, IPA droplets having a diameter such that they do not float in nitrogen gas, sags of the liquid-phase IPA that flow out from the first gutter 605, and the like are allowed to collide against the hit portion 610 such that their flow-out direction is changed to a downward direction, and they can be captured at the second gutter 606. Consequently, large IPA droplets, the sags, and the like can be prevented from being supplied from the supply holes 604 into the space 4 in which wafers 2 are held. Thus, deposition of metals or organic substances due to attachment of the IPA droplets, sags, and the like onto wafer 2 surfaces can be prevented.

Furthermore, a case where a multiplicity of IPA droplets and nitrogen gas are supplied from the droplet supply device 3 or 603 into the space 4 and nitrogen gas is further supplied from the drying nozzle 5 into the space 4 is described in the above explanation, but air may be supplied instead of the nitrogen gas as one example of such an inert gas. When air is thus used, there are advantages of a low cost and favorable handling property. On the other hand, when an inert gas represented by nitrogen gas is used as described above, oxidation of surfaces of the wafers 2 exposed in the space 4 can be prevented.

Figure 27:
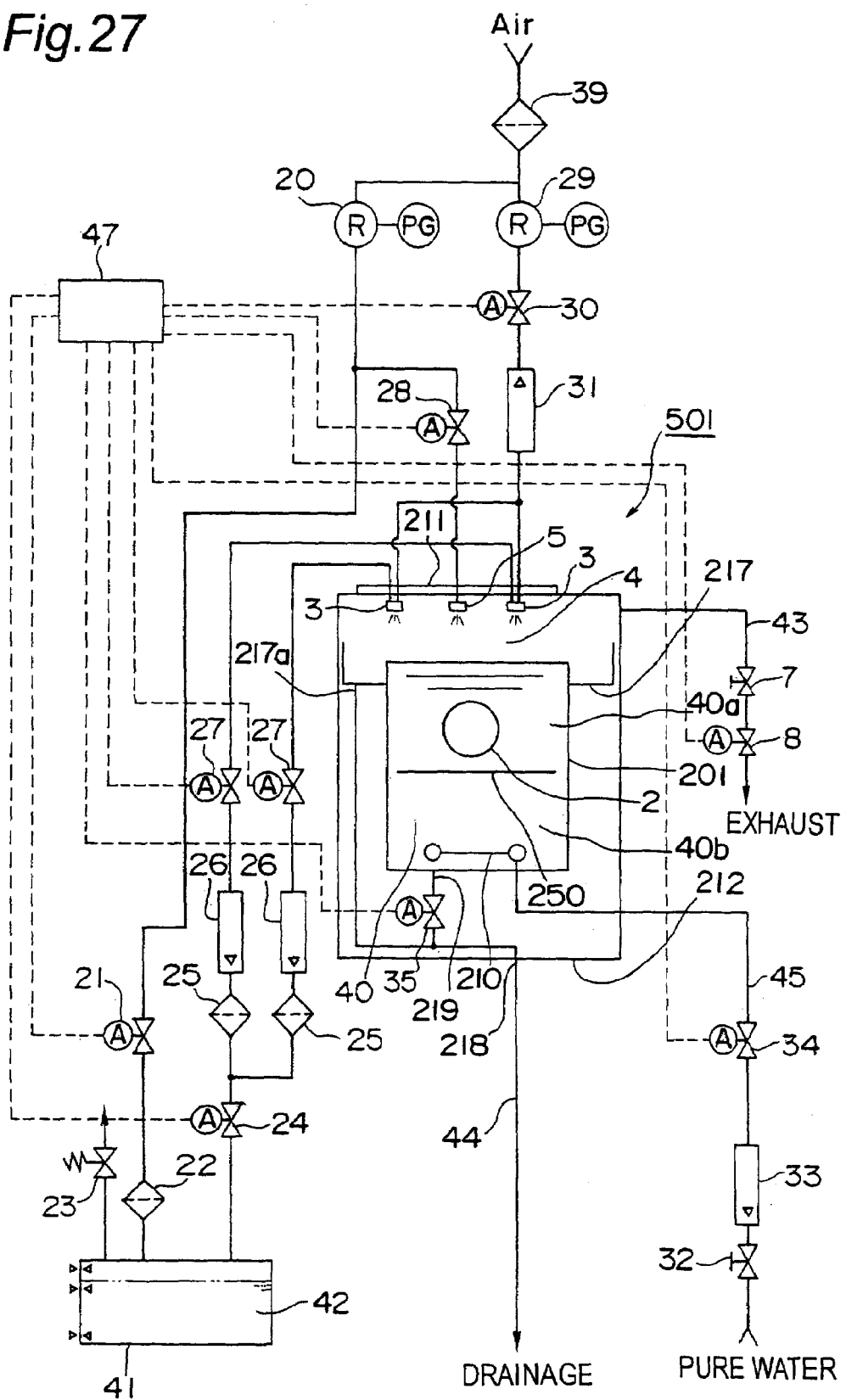
FIG. 27 is a flow diagram showing a schematic configuration of the wafer drying apparatus of the first embodiment when air is used instead of nitrogen gas.

Furthermore, FIG. 27 shows a flow diagram in the wafer drying apparatus 501 when air is thus used instead of nitrogen gas. As shown in FIG. 27, even when air is used, the constitution is the same as in the case where nitrogen gas is used. Furthermore, air supplied through pressure-reducing valve 20 or 29 is supplied in a state cleaned by filter 39 as in the case of nitrogen gas, that is, as clean air.

According to the first embodiment, when the wafers 2 immersed in the pure water 40 in the upper pure water tank-section 40a in the drying chamber 201 are exposed above the liquid level of the pure water 40, the pure water on the liquid level side is allowed to flow from the upper portion of the drying chamber 201 into the overflow receiving portion 217 and drained, not by drainage of pure water only from the bottom of the drying chamber 201 or raising of the wafers 2 themselves from the pure water 40, but by raising of pure water in the upper pure water tank-section 40a together with the wafers 2. Therefore, particles or the like floating at the liquid level or in the vicinity of the liquid level can be drained together with the pure water on the liquid level side. Consequently, upon exposure of the wafers 2 from the liquid level, attachment of the particles or the like to surfaces of the wafers 2 can be prevented.

Furthermore, since the wafers 2 immersed in the pure water 40 in the upper pure water tank-section 40a in the drying chamber 201 are exposed from the liquid level by raising the pure water in the upper pure water tank-section 40a together with the wafers 2 and allowing the pure water on the liquid level side to flow and drain from the upper portion of the drying chamber 201 into the overflow receiving portion 217, pure water in which IPA is dissolved can be continuously drained as the pure water at the liquid level even when IPA droplets supplied above the liquid level into the space 4 are dissolved in the pure water 40 at the liquid level or in the vicinity of the liquid level. Consequently, an increase in an amount of IPA dissolved in the pure water at the liquid level or in the vicinity of the liquid level can be prevented, wafer drying efficiency is improved by improving replacement efficiency of pure water and droplet-like IPA in the water droplets, and occurrence of non-uniform drying on wafer surfaces can be prevented.

Furthermore, upon drainage of the pure water 40 in the drying chamber 201, since the pure water 40 is drained by raising pure water 40 with the wafers 2 in the upper pure water tank-section 40a in which the wafers 2 are immersed together, and allowing pure water on the liquid level side to overflow from the upper end of the drying chamber 201, a position of the liquid level of the pure water 40 and a position of the space 4 above the liquid level are fixed relative to each other during the drainage; that is, the position of the liquid level of the pure water 40 and a position of the droplet supply device 3 are fixed relative to each other, and thus a distance between the droplet supply device 3 and the liquid level can be maintained constant at all times. Consequently, droplet-like IPA can be stably supplied into the space 4 and onto the liquid level from commencement of exposure of the wafers 2 from the liquid level to completion of the exposure (that is, from commencement of a drying treatment of the wafers 2 to its completion) (when gaseous IPA is used, the gaseous IPA can be stably supplied), replacement efficiency of the pure water and droplet-like IPA (or gaseous IPA) in water droplets attached to the surfaces of the wafers 2 can be stabilized upon exposure of the wafers 2, and thus occurrence of non-uniform drying of the wafer surfaces can be prevented.

Furthermore, since pure water in an amount matching an increase of volume of the lower pure water tank-section 40b, depending on this raise amount from the pure water supply unit 210, is supplied into the lower pure water tank-section 40b when the partition plate 250 is raised along the inner surface of the drying chamber 201 by the partition plate elevating mechanism 214, the pure water on the liquid level side can be drained by raising only pure water in the upper pure water tank-section 40a by raising of the partition plate 250 even when a gap is provided between the periphery of the partition plate 250 and the inner surface of the drying chamber 201 so that they should not be brought into a contact with each other. Consequently, the gap between the periphery of the partition plate 250 and the inner surface of the drying chamber 201 does not need to be eliminated (or sealed), generation of particles due to friction, which may occur when the gap is filled, can be prevented, and thus generation of particles in the pure water 40 in the drying chamber 201 can be prevented.

Furthermore, since, along with raising of the partition plate 250, pure water in an amount matching the increase in the volume of the lower pure water tank-section 40b is supplied into the lower pure water tank-section 40b by raising of the partition plate 250, almost no flow of pure water can be generated in the gap between the periphery of the partition plate 250 and the inner surface of the drying chamber 201. Therefore, occurrence of turbulence such as a vortex or the like due to inflow of pure water can be prevented in the upper pure water tank-section 40a, in which wafers 2 are immersed. The pure water between exposed wafers 2 at the liquid level or in the vicinity of the liquid level in which IPA is dissolved, and floating particles or the like, can be drained by the aforementioned substantially radial surface flow or the aforementioned smooth surface flows in the two directions or in the one direction on the liquid level.

Furthermore, since the wafers 2 are exposed from the liquid level by raising pure water 40 in which the wafers 2 are immersed in the upper pure water tank-section 40a together with the wafers 2; that is, exposure can be performed in a state that relative positions of the wafers 2 and the pure water 40 are fixed, occurrence of a wave of pure water 40 at the liquid level could be prevented. Therefore, generation of non-uniform drying of wafer surfaces associated with occurrence of the wave can be prevented.

Furthermore, non-uniform drying can also be eliminated upon exposure of the wafers 2 from the liquid level by making a raising speed of the partition plate 250 constant.

Furthermore, since nitrogen gas is always maintained in the space 4 above the liquid level of pure water in which the wafers 2 are immersed, wafer surfaces are not naturally oxidized due to contact of the wafer surfaces with oxygen when upper portions of the wafers 2 are exposed from the pure water 40, and IPA droplets uniformly supplied at the liquid level of the pure water 40 are immediately replaced with pure water attached to both front and rear surfaces of the wafers 2. Furthermore, when an IPA temperature is higher than a temperature of the wafers 2, that is, room temperature, preferably at least 5° C. or more higher, or higher in a range from 5° C. to 60° C., IPA is easily agglutinated to the front and rear surfaces of the wafers 2, and easily replaced with pure water attached to the front and rear surfaces of the wafers 2. Thus, the surfaces of the wafers 2 are rapidly dried. Therefore, drying time becomes shorter than in a conventional case, where pure water of the wafer surfaces at room temperature and IPA at room temperature are replaced, and then IPA at room temperature is dried, and thus drying efficiency is improved. Furthermore, since IPA is supplied in droplets to the liquid level of the pure water 40, an amount of IPA consumption can be significantly reduced in comparison with the conventional case, where the IPA is supplied in vapor. Furthermore, when IPA is supplied in vapor, an exterior of a pipe needs to be covered with a heat insulating material to maintain this vapor state. However, in the first embodiment, since it is sufficient to simply supply liquid-phase IPA, for example, at room temperature to the droplet supply devices 3 on the right and left, the pipe does not need to be covered with a heat insulating material, and thus the apparatus is simplified. Furthermore, when IPA is evaporated, energy for heating it is required, but, in the first embodiment, it is sufficient to use only energy required for injection of nitrogen gas and IPA from the droplet supply devices 3, and thus IPA droplets can be formed with a low-cost and simple apparatus constitution. Thus, nitrogen gas can be injected from sides opposed to each other, liquid-phase IPA can be injected, and, at the same time, droplet-like IPA is filled into the space of the drying chamber to supply the droplet-like IPA to entire front and rear surfaces of the wafers.

Furthermore, since liquid-phase IPA is not converted to droplets by electrical energy such as ultrasound, and liquid-phase IPA can be converted to droplets by injecting IPA with the IPA injection nozzle in the vicinity of the injection port of the nitrogen gas without using electrical energy, IPA, which has high inflammability, can be safely and stably supplied in droplets.

It is noted that the present invention is not limited to the first embodiment, and can be applied to other various aspects.

Second Embodiment

Figure 8:
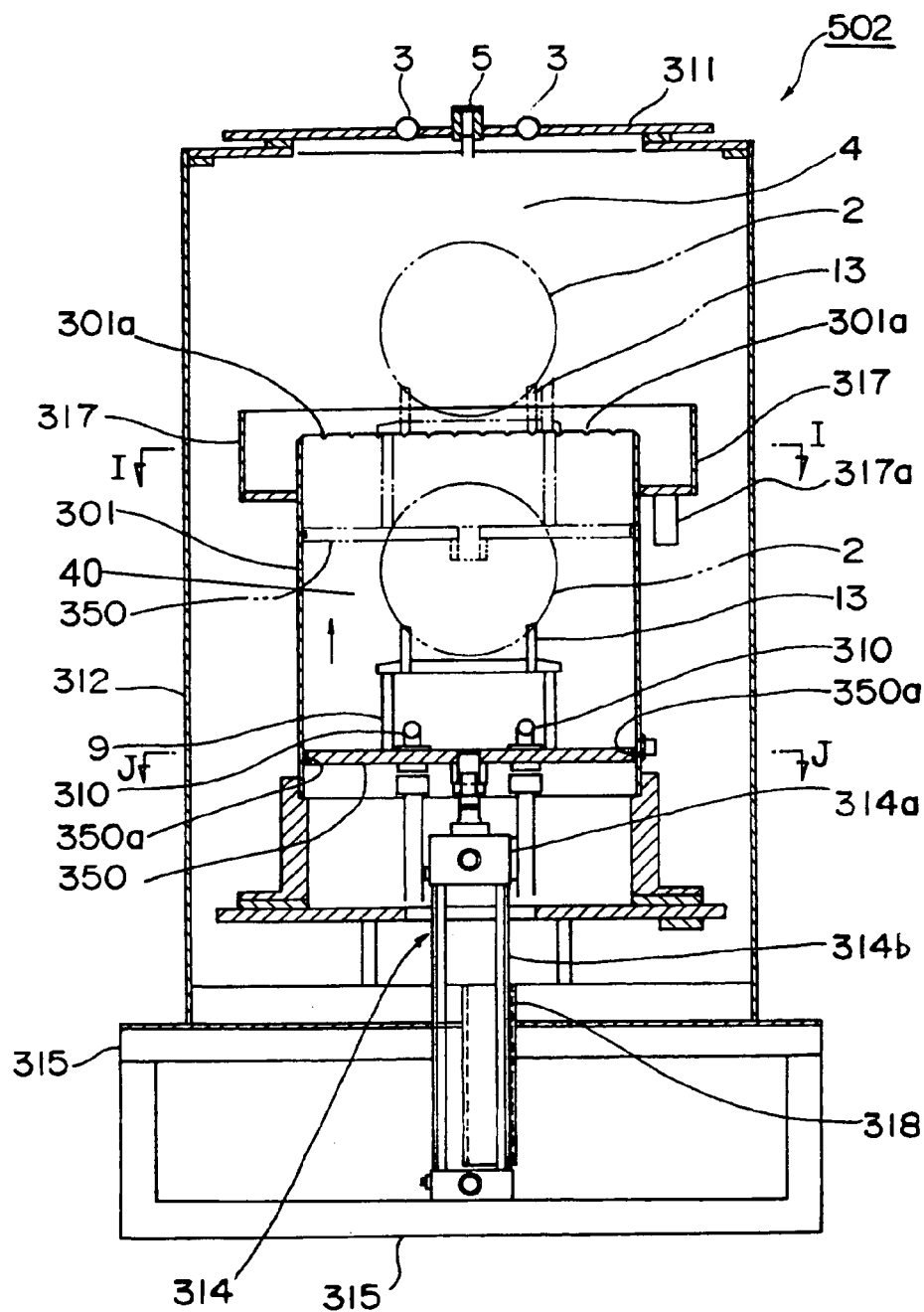
FIG. 8 is a longitudinal sectional view showing a wafer drying apparatus according to a second embodiment of the present invention.
Figure 9:
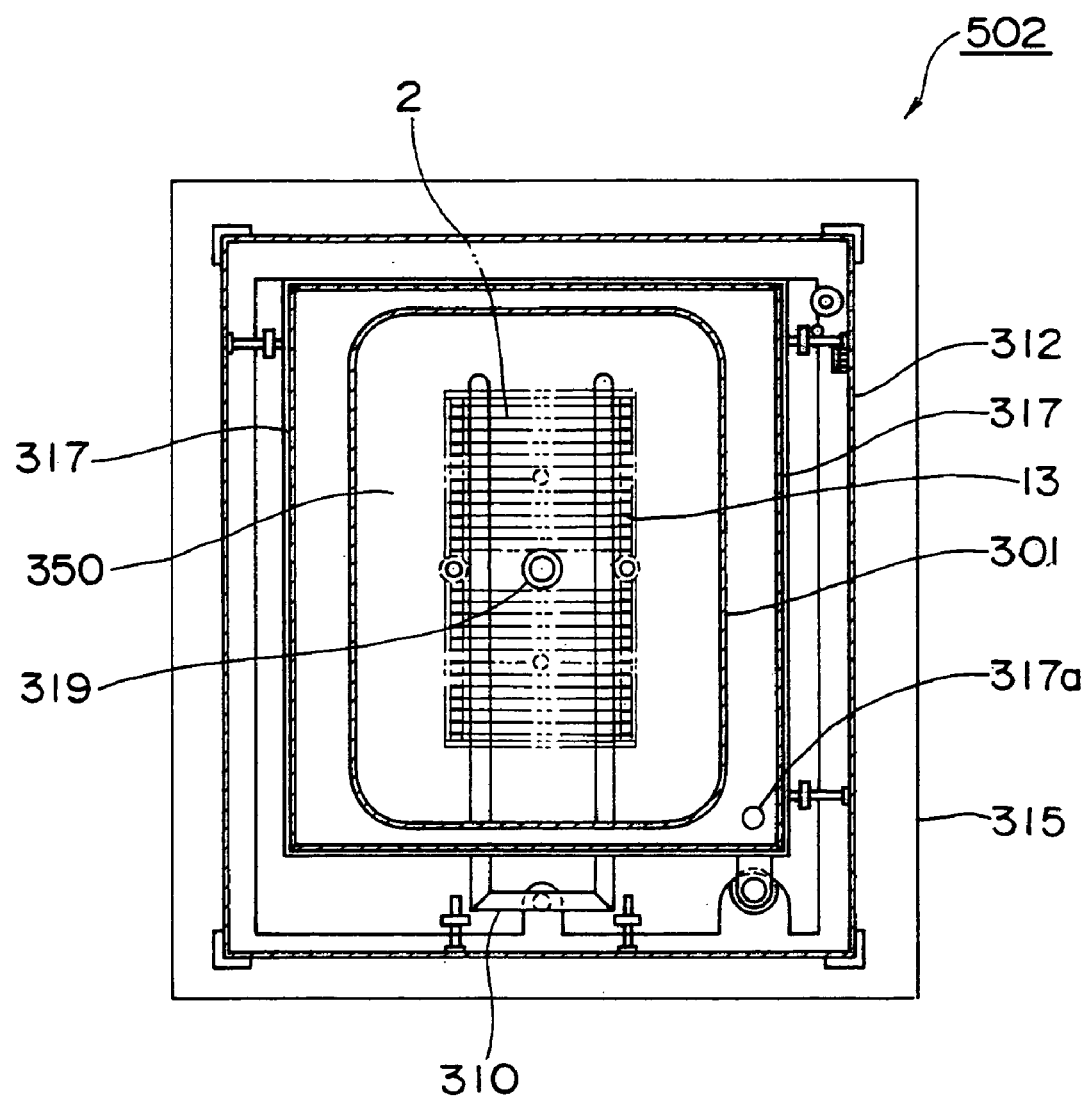
FIG. 9 is a cross sectional view showing the wafer drying apparatus along line I—I in FIG. 8.

Unlike the wafer drying apparatus 501 of the first embodiment, in which pure water on the liquid level side, in which the wafers 2 are immersed in the upper pure water tank-section 40a in the drying chamber 201, is drained by including the partition plate 250 to divide the drying chamber 201 into the upper pure water tank-section 40a and the lower pure water tank-section 40b, and raising the partition plate 250 by the partition plate elevating mechanism 214, in a wafer drying apparatus 502, which is one example of a substrate drying apparatus according to a second embodiment of the present invention, for example, pure water on the liquid level side is drained by raising a bottom itself, which is one example of a movable plate, of a drying chamber. The constitution is the same except for this part. Hereafter, only this different part is explained. A longitudinal section of this wafer drying apparatus 502 is shown in FIG. 8. A cross sectional view along line I—I in FIG. 8 is shown in FIG. 9. A cross sectional view along line J—J in FIG. 8 is shown in FIG. 10.

Figure 10:
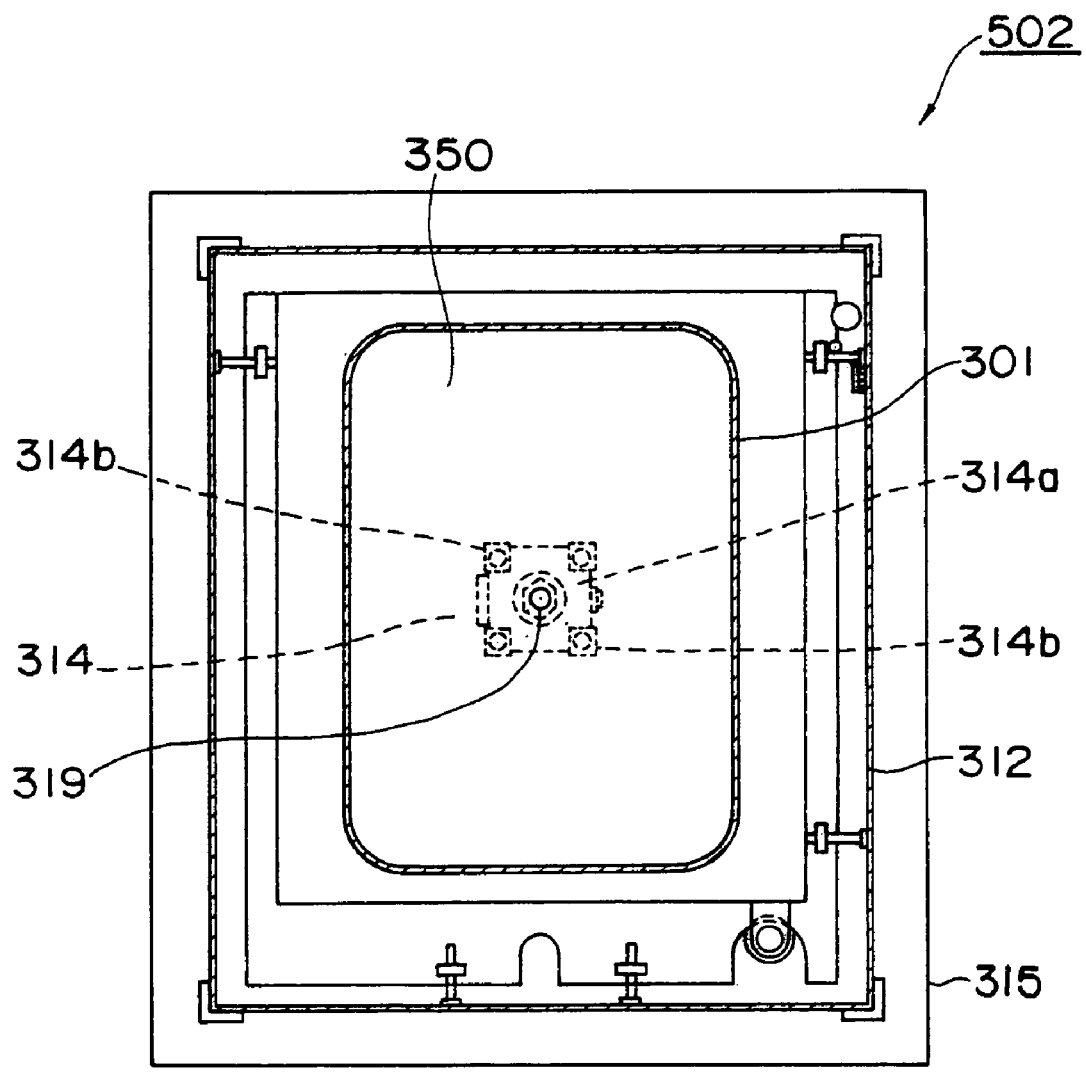
FIG. 10 is a cross sectional view showing the wafer drying apparatus along line J—J in FIG. 8.

As shown in FIGS. 8, 9 and 10, in drying chamber 301 of the wafer drying apparatus 502, a bottom portion 350, which is a bottom of the drying chamber 301, is elevatably set along each side surface of the drying chamber 301. Since a sealing 350a is provided in a gap between this bottom portion 350 and each of the side surfaces, a liquid in the drying chamber 301 does not leak from the aforementioned gap even when the bottom portion 350 is raised or lowered. Furthermore, a bottom portion elevating mechanism 314, which is one example of a bottom elevator for raising or lowering the bottom portion 350, is included on a machine base 315 of a treatment chamber 312 and the wafer drying apparatus 502. As the sealing 350a, for example, an O-ring made of an IPA-resistant and chemical-resistant fluorine rubber or the like is used.

The bottom portion elevating mechanism 314 is constituted by a mechanism using an air cylinder, and includes an air cylinder 314a fixed at a center of a lower surface of the bottom portion 350 of the drying chamber 301, an elevating guide 314b elevatably supporting the air cylinder 314a and fixed at the machine base 315 of the drying chamber 301, and a compressed air supply unit (not shown) for charging and exhausting compressed air to and from the air cylinder 314a. Furthermore, the bottom portion elevating mechanism 314 is controlled by a control unit 47, the air cylinder 314a is raised along the elevating guide 314b by supplying compressed air into the air cylinder 314a by the compressed air supply unit, and the bottom portion 350 is raised along inner sides of side surfaces of the drying chamber 301. Furthermore, the air cylinder 314a is lowered along the elevating guide 314b by switching a direction of the compressed air supplied into the air cylinder 314a, and the bottom portion 350 is lowered along the inner sides of the side surfaces of the drying chamber 301. Furthermore, speeds for raising and lowering the air cylinder 314a are controlled by the control unit 47, and, for example, the air cylinder 314a is raised at a constant raising speed.

Consequently, the bottom portion elevating mechanism 314 can raise or lower a carrier fixing portion 9 and a pure water supply unit 310 fixed on an upper surface of the bottom portion 350, a wafer carrier 13 fixed by the carrier fixing portion 9, and pure water 40 stored in the drying chamber 301 together with the bottom portion 350. The bottom portion elevating mechanism 314 may be constituted by other known elevating mechanisms, for example, an elevating mechanism using hydraulic pressure, an elevating mechanism using a ball screw shaft or the like, instead of the mechanism using an air cylinder 314*a*. It is noted that the carrier fixing portion 9, wafer carrier 13, and pure water supply unit 310 has the same constitution and functions as those of the carrier fixing portion 9, wafer carrier 13 or wafer holder 213, and pure water supply unit 210 in the first embodiment. Furthermore, a raising speed of the bottom portion 350 by the bottom portion elevating mechanism 314 is the same as the raising speed of the partition plate 250 in the first embodiment.

Furthermore, the bottom portion 350 is raised or lowered by the bottom portion elevating mechanism 314 in a range from a height position at which upper ends of all wafers 2 supported by the wafer carrier 13 are positioned below an upper end of the drying chamber 301 with some margin (lower end position of a raising and lowering operation) to a height position at which lower ends of all the wafers 2 are positioned above the upper end of the drying chamber 301 with some margin (upper end position of a raising and lowering operation). That is, in a state that the pure water 40 is filled in the drying chamber 301, the bottom portion 350 is raised or lowered by the bottom portion elevating mechanism 314 so that all the wafers 2 are immersed in pure water 40 at the lower end position of the raising and lowering operation, and that all the wafers 2 are completely exposed from the pure water 40 at the upper end position of the raising and lowering operation. Furthermore, triangular dams 301*a* similar to a plurality of triangular dams 201*a* formed at the upper end of the drying chamber 201 in the wafer drying apparatus 501 of the first embodiment are formed at a constant interval over an entire upper end of the drying chamber 301, for example. Furthermore, an overflow receiving portion 317 similar to the overflow receiving portion 217 in the wafer drying apparatus 201 is disposed at an outer periphery of an upper portion of the drying chamber 301. Furthermore, as in the case of the treatment chamber 212 and the drying chamber 201 of the wafer drying apparatus 501, a drainage port 319 is disposed at the bottom portion 350 of the drying chamber 301, and a drainage port 318 is disposed at the bottom portion of the treatment chamber 312. In the second embodiment, the bottom portion elevating mechanism 314 is one example of a drainage device.

A method of exposing the wafers 2 immersed in the pure water 40 filled in the drying chamber 301 from the liquid level of the pure water 40 in the wafer drying apparatus 502 having such a constitution is explained with reference to FIGS. 8, 9, and 10.

First, the bottom portion 350 is positioned at the lower end position of the raising or lowering operation by the bottom portion elevating mechanism 314 in the drying chamber 301, pure water 40 is filled into the drying chamber 301, and the wafers 2 are immersed in the pure water 40. From this state, the bottom portion elevating mechanism 314 is controlled by the control unit 47, and raising of the bottom portion 350 is started by the bottom portion elevating mechanism 314. When the bottom portion 350 is gradually raised at the aforementioned constant speed, pure water on the liquid level side of the pure water 40 overflows from the upper end of the drying chamber 301 and flows into the overflow receiving portion 317. At this time, liquid is allowed to flow into the overflow receiving portion 317 disposed at the upper end of the drying chamber 301 via the triangular dams 301*a*. The liquid allowed to flow into the overflow receiving portion 317 is drained out of the treatment chamber 312 by drainage passage 44 via a drainage port 317*a* and a drainage port 318.

Along with raising of the bottom portion 350 by the bottom portion elevating mechanism 314, pure water on the liquid level side of the pure water 40 is allowed to flow into the overflow receiving portion 317 from the upper end of the drying chamber 301, and is drained. At the same time, the wafer carrier 13 fixed to the carrier fixing portion 9 fixed at the bottom portion 350 is also raised, and the wafers 2 are exposed above the liquid level. When lower ends of all the wafers 2 are positioned above the upper end of the drying chamber 301, raising of the bottom portion 350 by the bottom portion elevating mechanism 314 is stopped by the control unit 47.

Upon drainage of the pure water on the liquid level side, pure water may be further supplied from the pure water supply unit 310 at a rate of, for example, about at most 30 L/min, preferably about 4 L/min. In such a case, particles or the like in the pure water 40 are positively pushed up to the liquid level side by this further supplied pure water, and can be rapidly and smoothly drained together with the pure water on the liquid level side.

Furthermore, upon drainage of the pure water on the liquid level side, sixth air operation valve 35 in FIG. 4 is opened, and the pure water 40 may be drained while its drainage amount is regulated by the drainage port 319 (219 in FIG. 4) at the bottom portion of the drying chamber 301 (201 in FIG. 4). In this case, a drainage amount is regulated by the drainage port 319 so that drainage of pure water on the liquid level side by the aforementioned raising of the bottom portion 350 at a constant speed is maintained (that is, the drainage amount of the pure water on the liquid level side is not changed). In such a case, a drainage speed of the pure water 40 can be increased while generally radial flows at the liquid level (that is, the same flows as in the first embodiment) are maintained, time for drying treatment of the wafers 2 can be shortened, and particles or the like in the pure water 40 on a bottom side of the drying chamber 301 can be drained out of the drying chamber 301.

Unlike the wafer drying apparatus 501 in the first embodiment, in which the pure water 40 in the drying chamber 201 is divided into two layers by the partition plate 250, according to the second embodiment, by including the bottom portion elevating mechanism 314 for raising or lowering the bottom portion 350 in the drying chamber 301, and raising the bottom portion 350 of the drying chamber 301 by the bottom portion elevating mechanism 314, pure water on the liquid level side of the pure water 40 can be drained in a form that it is allowed to overflow from the upper end of the drying chamber 301, and the same effect as that of the first embodiment can be obtained.

Furthermore, in addition, since the bottom portion elevating mechanism 314 is disposed on the machine base 315 below the drying chamber 301, the wafer drying apparatus 502 can be made compact.

Third Embodiment

A wafer drying apparatus 503, which is one example of a substrate drying apparatus according to a third embodiment of the present invention, includes a partition plate 450 corresponding to the partition plate 250 in the first embodiment, and, in a state that positions of the partition plate 450 and the wafers 2 supported by a wafer carrier 13 fixed on an upper surface of this partition plate 450 are fixed relative to a treatment chamber, pure water on the liquid level side is drained by lowering not only a bottom portion of the drying chamber, but also the drying chamber in its entirety by using the same elevating mechanism as the elevating mechanism 314 of the wafer drying apparatus 502 of the second embodiment. The constitution except for this part is the same. Hereafter, only the different part is explained. A longitudinal section of this wafer drying apparatus 503 is shown in FIG. 11.

Figure 11:
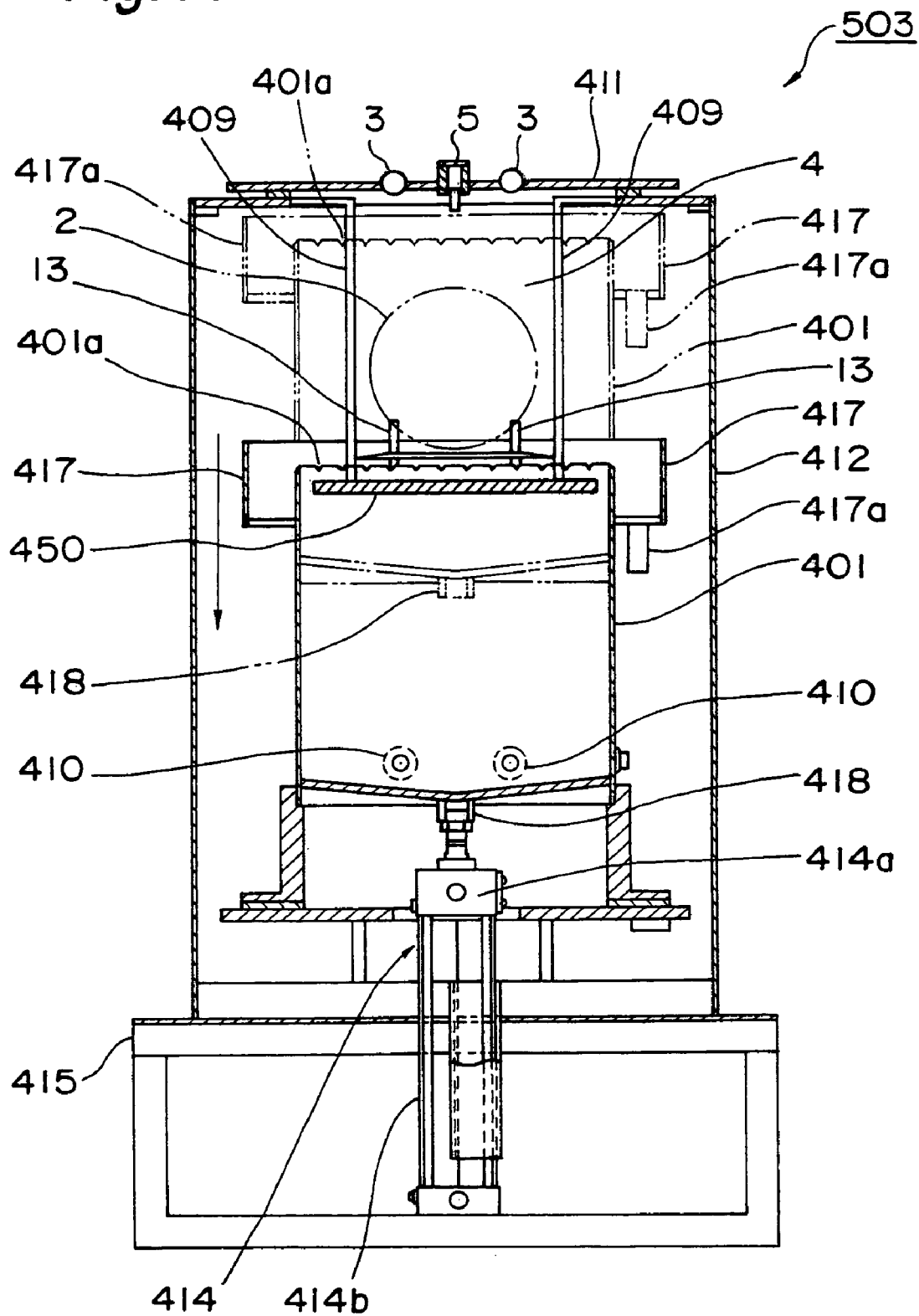
FIG. 11 is a longitudinal sectional view showing a wafer drying apparatus according to a third embodiment of the present invention.

As shown in FIG. 11, in the wafer drying apparatus 503, the drying chamber 401 in its entirety is elevatably set in treatment chamber 412, and a drying chamber elevating mechanism 414, which is one example of an elevator for raising or lowering the drying chamber 401, is disposed on a machine base 415 of the wafer drying apparatus 503. Furthermore, a partition plate 450 for dividing an interior of the drying chamber 401 into two sections, i.e. an upper pure water tank-section 40a and a lower pure water tank-section 40b, is included, and the partition plate 450 defines a gap so that an entire periphery of the partition plate 450 is not brought into a contact with an inner surface of the drying chamber 401, and that pure water can be supplied from the lower pure water tank-section 40b into the upper pure water tank-section 40a through the gap. The partition plate 450 serves as one example of a liquid moving plate corresponding to the movable plate of the first embodiment. Furthermore, a carrier fixing portion 409 is fixed not to the bottom portion of the drying chamber 401, but rather to an inner upper portion of the treatment chamber 412. Wafer carrier 13 can be attached to the carrier fixing portion 409, to which the partition plate 450 is fixed. Furthermore, a pure water supply unit 410 is fixed at the bottom portion of the drying chamber 401. The wafer carrier 13 and the pure water supply unit 410 are the same as the wafer carrier 13 or wafer holder 213 and the pure water supply unit 210 in the first embodiment.

Furthermore, the drying chamber elevating mechanism 414 has the same constitution as the bottom portion elevating mechanism 314 in the second embodiment, and the drying chamber 401 can be raised or lowered by raising or lowering an air cylinder 414a, fixed at a center of a lower surface of the bottom portion of the drying chamber 401, along an elevating guide 414b while the partition plate 450 and the wafer carrier 13 are fixed relative to the treatment chamber 412. That is, the partition plate 450 and the wafer carrier 13 can be raised relative to the drying chamber 401. Furthermore, raising and lowering speeds of the air cylinder 414a are controlled by control unit 47, and it is lowered at, for example, a constant lowering speed. It is noted that this lowering speed is the same as the raising speed of the partition plate 250 in the first embodiment.

Furthermore, the drying chamber 401 is raised or lowered by the drying chamber elevating mechanism 414 in a range from a height position at which upper ends of all wafers 2 supported by the wafer carrier 13 are positioned below an upper end of the drying chamber 401 with some margin (upper end position of a raising and lowering operation) to a height position at which lower ends of all the wafers 2 are positioned above the upper end of the drying chamber 401 with some margin (lower end position of the raising and lowering operation). That is, in a state that the pure water 40 is filled in the drying chamber 401, the drying chamber 401 is raised or lowered by the drying chamber elevating mechanism 414 so that all the wafers 2 are immersed in the pure water 40 in the upper pure water tank-section 40a at the upper end position of the raising and lowering operation, and that all the wafers 2 are completely exposed from the pure water 40 in the upper pure water tank-section 40a at the lower end position of the raising and lowering operation.

Furthermore, the same triangular dams 401a as the plurality of triangular dams 201a formed at the upper end of the drying chamber 201 in the wafer drying apparatus 501 of the first embodiment, for example, are formed at a constant interval over the entire upper end of the drying chamber 401. Furthermore, the same overflow receiving portion 417 as the overflow receiving portion 217 in the wafer drying apparatus 201 is disposed at an outer periphery of the upper portion of the drying chamber 401. Furthermore, as in the case of the treatment chamber 212 and the drying chamber 201 of the wafer drying apparatus 501, a drainage port 419 is disposed in a bottom portion of the drying chamber 401, and a drainage port 418 is disposed in a bottom portion of the treatment chamber 412.

A method of exposing the wafers 2 immersed in the pure water 40 filled in the upper pure water tank-section 40a in the drying chamber 401 from the liquid level of the pure water 40 in the wafer drying apparatus 503 having such a constitution is explained with reference to FIG. 11.

First, in the wafer drying apparatus 503, the drying chamber 401 is positioned at the upper end position of the raising and lowering operation by the drying chamber elevating mechanism 414, and pure water from the pure water supply unit 410 in the lower pure water tank-section 40b is supplied into the lower pure water tank-section 40b. The pure water 40 is filled into the drying chamber 401, and the wafers 2 are immersed in the pure water 40 in the upper pure water tank-section 40a. In this state, the drying chamber elevating mechanism 414 is controlled by the control unit 47, and lowering movement of the drying chamber 401 is started by the drying chamber elevating mechanism 414.

With this start of the lowering of the drying chamber 401, pure water on the liquid level side of the pure water 40 in the drying chamber 401 flows into the overflow receiving portion 417 via each triangular dam 401a, and the pure water on the liquid level side that flows from the drainage port 417a into the overflow receiving portion 417 is drained through a drainage passage.

Furthermore, pure water supplied from the pure water supply unit 410 is supplied to the lower pure water tank-section 40b in an amount depending on a drainage amount of the pure water on the liquid level side along with lowering of the drying chamber 401 while a seventh air operation valve 34 is controlled by using a flowmeter 33 via control unit 47. That is, by the lowering of the drying chamber 401, pure water is supplied to the lower pure water tank-section 40b in an amount matching an increase in volume of the lower pure water tank-section 40b. Therefore, almost no flow of pure water is generated in a gap between a periphery of the partition plate 450 and the inner surface of the drying chamber 401. Thus, by lowering of the drying chamber 401, only pure water in the upper pure water tank-section 40a can be raised relatively to the drying chamber 401, and drained.

Along with the lowering of the drying chamber 401 by the drying chamber elevating mechanism 414, the pure water on the liquid level side of pure water 40 in the upper pure water tank-section 40a is allowed to flow into the overflow receiving portion 417 from the upper end of the drying chamber 401 and be drained, and the liquid level of the pure water 40 in the drying chamber 401 is lowered. At the same time, the wafers 2 fixed by the wafer carrier 13 attached to the carrier fixing portion 409 fixed on the interior of the upper portion of the treatment chamber 412 are exposed above the liquid level. When lower ends of all the wafers 2 are positioned above the upper end of the drying chamber 401, lowering of the drying chamber 401 by the drying chamber elevating mechanism 414 is stopped by the control unit 47.

Unlike the wafer drying apparatus 501 of the first embodiment, in which pure water on the liquid level side is drained by raising pure water in the upper pure water tank-section 40a together with the wafers 2 by raising the partition plate 250, according to the third embodiment, the partition plate 450 and the carrier fixing portion 409 are raised relative to the drying chamber 401 by fixing the partition plate 450 and the carrier fixing portion 409 relative to the treatment chamber 412 and lowering the drying chamber 401; that is, pure water in the upper pure water tank-section 40a can be raised together with wafers 2 relative to the drying chamber 401, and the pure water on the liquid level side can be drained. Thus, the same effect as that of the first embodiment can be obtained.

Furthermore, according to the above embodiments of the present invention, substrates are exposed from the liquid level of the pure water by draining pure water on the liquid level side by raising the substrates and the pure water in which the substrates are immersed together in the drying chamber. Even when the substrates are exposed by an embodiment other than the above embodiments of the present invention, the object of the present invention can be achieved. Hereafter, concepts of the other embodiments are explained first to explain other embodiments.

According to a first concept of the other embodiments, there is provided a substrate drying method for drying substrates immersed in pure water in a drying chamber by exposing the substrates from the pure water:

wherein, nitrogen gas and mist-like isopropyl alcohol are supplied into a space above a liquid level of the pure water in the drying chamber;

the liquid level is lowered by draining pure water on the liquid level side from the pure water at the liquid level or in the vicinity liquid level, the substrates are exposed from the pure water above the liquid level in the drying chamber, and at the same time, the pure water held on exposed surfaces of the substrates is replaced by the mist-like isopropyl alcohol; and then, the substrates are dried by evaporating the isopropyl alcohol from the substrate surfaces.

Furthermore, there is provided a substrate drying apparatus comprising:

a drying chamber in which substrates can be immersed in pure water;

a mist supply device for supplying nitrogen gas and mist-like isopropyl alcohol into a space above a liquid level of the pure water in the drying chamber; and a drainage device for draining the pure water on the liquid level side from the liquid level or the vicinity of the liquid level in the pure water in the drying chamber, wherein the liquid level of the pure water is lowered by draining the pure water on the liquid level side by the drainage device, the substrates are exposed from the pure water above the liquid level, and at the same time, the pure water held on exposed surfaces of the substrates is replaced by the mist-like isopropyl alcohol, and then the substrates are dried by evaporating the isopropyl alcohol from the substrate surfaces.

According to the first concept, when the substrates immersed in the pure water in the drying chamber are exposed above the liquid level of the pure water, the liquid level is lowered in the drying chamber, not by either drainage of the pure water only from a bottom of the drying chamber or raising of the substrates themselves from the pure water, but by draining pure water on the liquid level side from the liquid level or the vicinity of the liquid level of the pure water while a position at which the substrates are supported is fixed in the pure water, and thus the substrates can be exposed from the liquid level. Consequently, upon exposure of the substrates from the liquid level, attachment of particles or the like, floating at the liquid level or in the vicinity of the liquid level, to substrate surfaces can be prevented.

Furthermore, since the substrates immersed in the pure water in the drying chamber are exposed from the liquid level by draining the pure water on the liquid level side, the pure water in which isopropyl alcohol is dissolved can be continuously drained as the pure water on the liquid level side even when mist-like isopropyl alcohol supplied into the space above the liquid level is dissolved in the pure water at the liquid level or in the vicinity of the liquid level. Consequently, an increase of an amount of isopropyl alcohol dissolved in the pure water at the liquid level or in the vicinity of the liquid level can be prevented, and drying efficiency of the substrates can be improved by improving replacement efficiency of pure water and the mist-like isopropyl alcohol in the pure water, and thus, generation of non-uniform drying of the substrate surfaces can be prevented.

According to a second concept of the other embodiments, there is provided the substrate drying apparatus according to the first concept, wherein the drainage device includes a drainage port disposed on a side in the drying chamber, a drainage port drainage mechanism for draining a liquid that flows into the drainage port out from the drying chamber, and a drainage port elevating mechanism for raising or lowering the drainage port in the drying chamber, the pure water on the liquid level side is allowed to flow into the drainage port from the liquid level or the vicinity of the liquid level of the pure water by lowering the drainage port by the drainage port elevating mechanism in the drying chamber, and the pure water on the liquid level side in the drainage port is drained out from the drying chamber by the drainage port drainage mechanism.

According to the second concept, since the drainage device includes the drainage port, drainage port drainage mechanism, and drainage port elevating mechanism, the pure water on the liquid level side is allowed to flow from the liquid level or the vicinity of the liquid level of the pure water into the drainage port by lowering the drainage port by the drainage port elevating mechanism in the drying chamber, and the pure water on the liquid level side in the drainage port can be drained out from the drying chamber by the drainage port drainage mechanism.

According to a third concept of the other embodiments, there is provided the substrate drying method or apparatus according to the first or second concept, wherein the substrates immersed in the pure water are a plurality of substrates that are arranged so that their surfaces are substantially parallel to each other and substantially perpendicular to the liquid level of pure water, and the pure water on the liquid level side is drained by a flow along the liquid level and along the substrate surfaces.

According to the third concept, by arranging a plurality of the substrates so that their surfaces are substantially parallel to each other and substantially perpendicular to the liquid level of the pure water, immersing them in the pure water, and draining the pure water on the liquid level side by flow along the liquid level and along the substrate surfaces, a drainage property of pure water between adjacent substrates at the liquid level or in the vicinity of the liquid level in which the isopropyl alcohol is dissolved, and floating particles or the like, can be made favorable when a part of the substrates is exposed above the liquid level of the pure water.

According to a fourth concept of the other embodiments, there is provided the substrate drying apparatus according to the third concept, wherein the drying chamber has side surfaces opposed to each other, drainage ports are disposed along inner sides of the side surfaces opposed to each other, and the flow is generated by allowing the pure water on the liquid level side to flow into the drainage ports.

According to the fourth concept, by disposing the drainage ports of the drainage device along the inner sides of the side surfaces opposed to each other in the drying chamber, and allowing the pure water on the liquid level side to flow into the drainage ports and draining it, the flow along the liquid level and along the substrate surfaces can be generated.

According to a fifth concept of the other embodiments, there is provided a substrate drying method or apparatus according to any one of the first to fourth concepts, wherein the pure water on the liquid level side is drained so that a lowering speed of the liquid level in the drying chamber is constant.

According to the fifth concept, by making the lowering speed of the liquid level constant upon exposure of the substrates from the liquid level, non-uniform drying generated during drying of the substrates can be eliminated.

According to a sixth concept of the other embodiments, there is provided the substrate drying method or apparatus according to any one of the first to fifth concepts, wherein the substrates are fixed in the drying chamber until the substrates are completely exposed from a liquid level of the pure water.

According to the sixth concept, upon exposure of the substrates from the liquid level, since the substrates are not moved, but their positions are fixed until the substrates are completely exposed, a wave due to movement of the substrates does not occur at the liquid level of the pure water, and a stable state can be maintained. Consequently, non-uniform drying generated during drying of the substrates can be eliminated.

According to a seventh concept of the other embodiments, there is provided the substrate drying method or apparatus according to any one of the first to sixth concepts, wherein, upon drainage of the pure water on the liquid level side from the liquid level or the vicinity of the liquid level of the pure water, the pure water is drained from the vicinity of the bottom of the drying chamber.

According to the seventh concept, by also draining the pure water from the bottom of the drying chamber upon drainage of the pure water on the liquid level side of the pure water, time required for drainage of the pure water can be shortened while the pure water on the liquid level side is drained, and thus the substrates can be further efficiently dried.

According to an eighth concept of the other embodiments, there is provided the substrate drying apparatus according to any one of the first to seventh concepts, wherein the drainage port is a gutter including a plurality of triangular dams in upper portions of side surfaces thereof, and the pure water on the liquid level side from the liquid level or the vicinity of the liquid level of the pure water is allowed to flow from the triangular dams into the gutter.

According to the eighth concept, when the pure water on the liquid level side or in the vicinity of the liquid level is allowed to flow from the drying chamber into the gutter, a flow-in rate can be easily regulated by allowing the pure water on the liquid level side to flow in via the triangular dams disposed on the upper portions of the side surfaces of the gutter.

According to a ninth concept of the other embodiments, there is provided the substrate drying method or apparatus according to any one of the first to eighth concepts, wherein the substrates are wafers or liquid crystal glass substrates.

According to the ninth concept, when the substrates are wafers or liquid crystal glass substrates of which surfaces require cleanliness or the like, effects of the above concepts can be obtained.

Hereafter, the other embodiments are explained as fourth to seventh embodiments.

Fourth Embodiment

Figure 12:
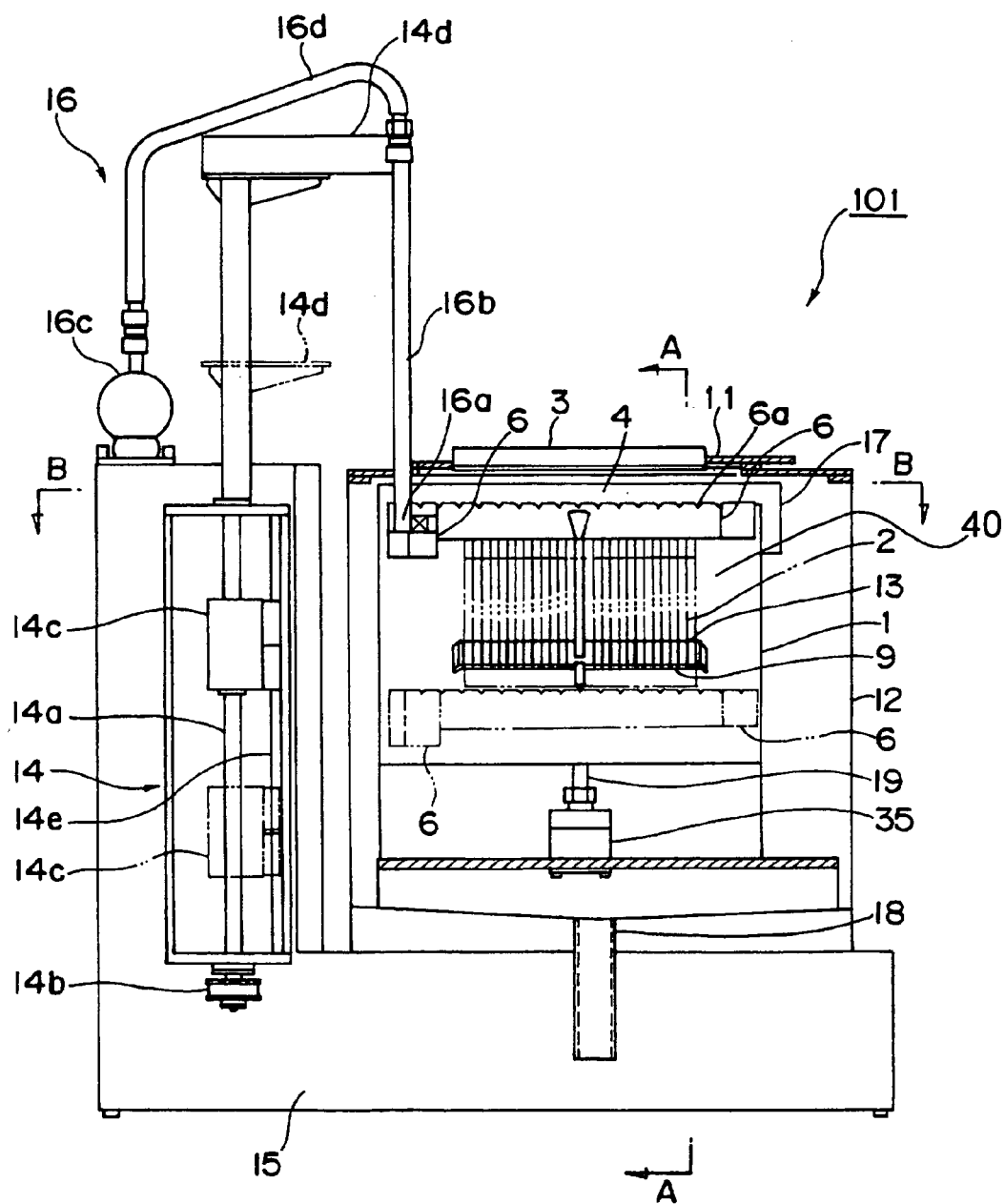
FIG. 12 is a longitudinal sectional view showing a wafer drying apparatus according to a fourth embodiment of the present invention.
Figure 13:
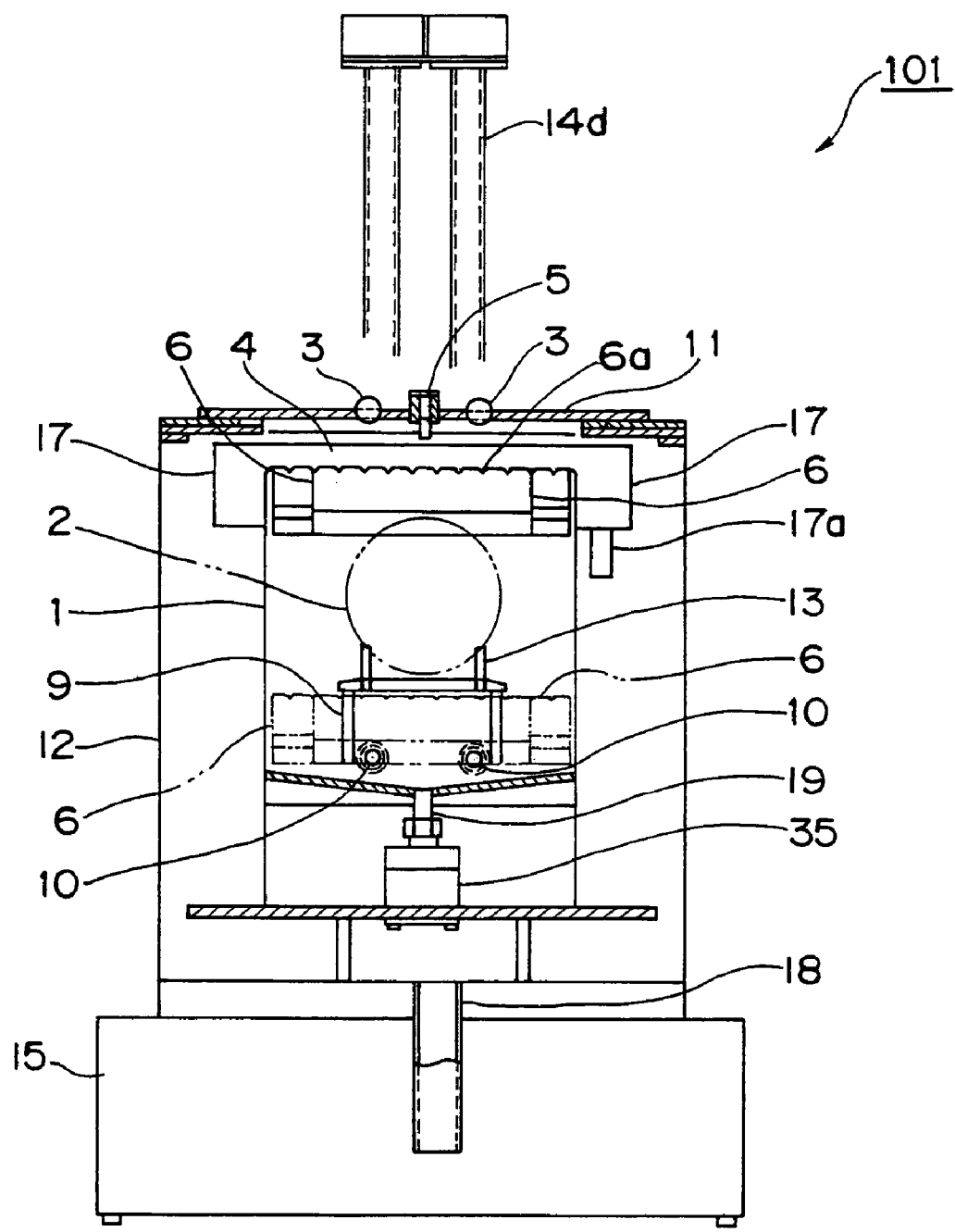
FIG. 13 is a cross sectional view showing the wafer drying apparatus along line A—A in FIG. 12.
Figure 14:
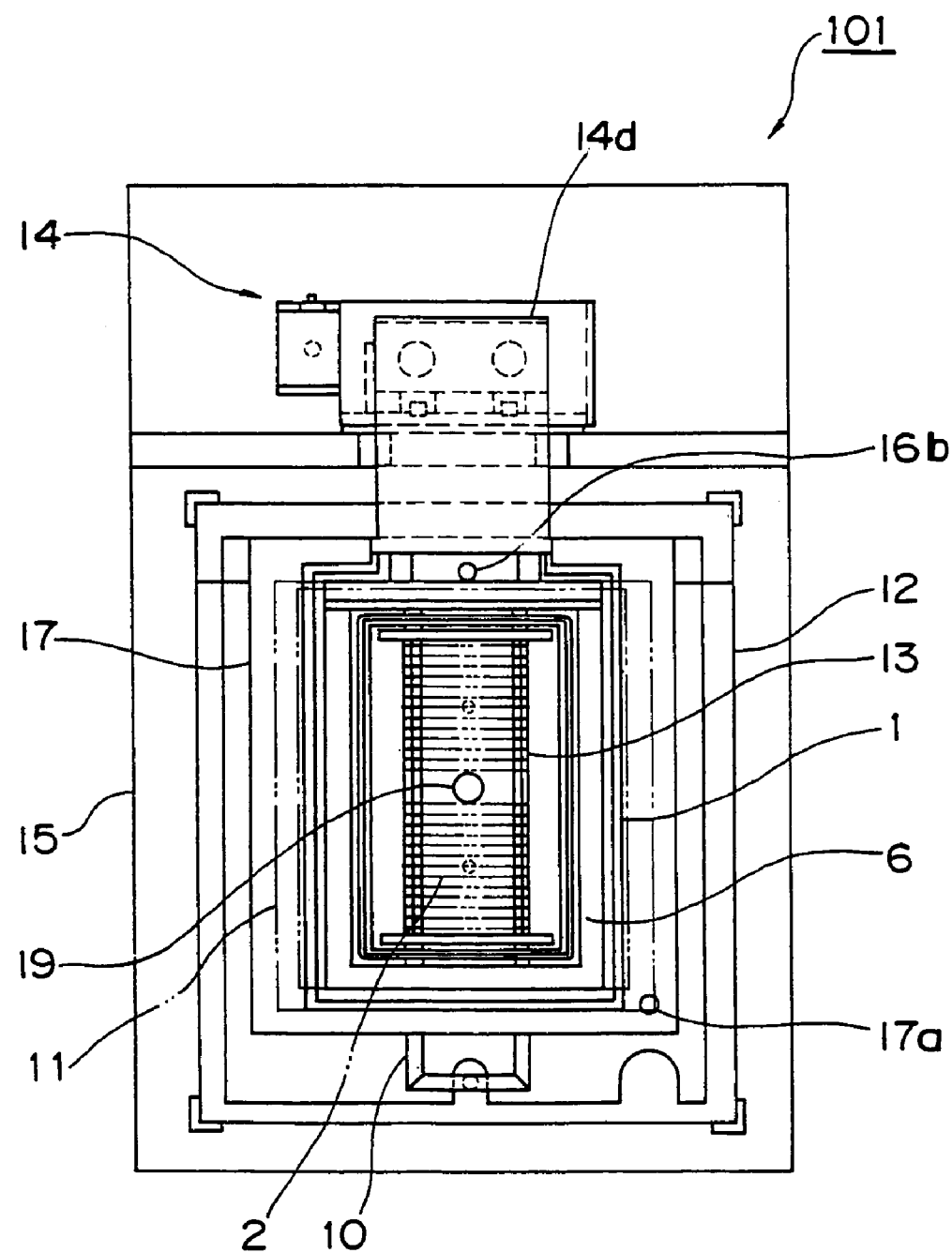
FIG. 14 is a cross sectional view showing the wafer drying apparatus along line B—B in FIG. 12.
Figure 15:
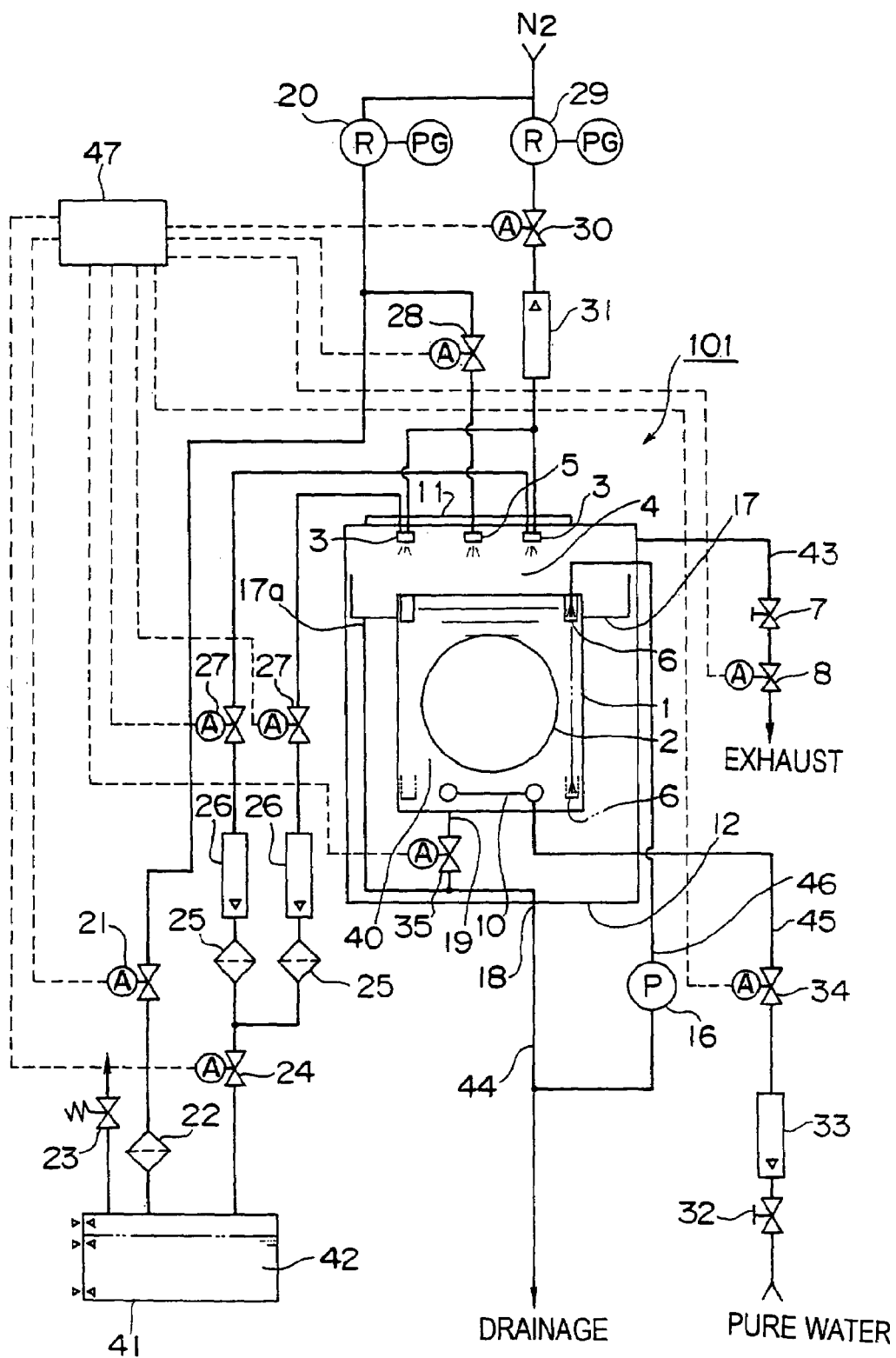
FIG. 15 is a flow diagram showing a schematic configuration of the wafer drying apparatus of the fourth embodiment.

FIG. 12 is a longitudinal sectional view showing a wafer drying apparatus 101, which is one example of a substrate drying apparatus according to a fourth embodiment of the invention. FIG. 13 is a cross sectional view along line A—A in FIG. 12. FIG. 14 is a cross sectional view along line B—B in FIG. 12. Further, FIG. 15 is a flow diagram showing a schematic constitution of the wafer drying apparatus 101.

As shown in FIGS. 12 to 15, the wafer drying apparatus 101 has a substantially rectangular box-like shape with an entire upper surface open, can store pure water 40 therein, and includes a drying chamber 1 in which a plurality of disc-like wafers 2 can be immersed in stored pure water 40, and washed and dried, and a treatment chamber 12 having a space 4 having a substantially rectangular box-like shape that can be sealed therein, wherein the drying chamber 1 is fixed in the treatment chamber 12.

Furthermore, a known wafer carrier 13, for supporting the plurality of wafers 2 arranged so that they are substantially parallel to a vertical direction and their surfaces extend substantially parallel to each other, can be carried into the drying chamber 1, and a carrier fixing portion 9, which is one example of a substrate support mechanism, for releasably fixing carried-in wafer carrier 13 in the drying chamber 1 is further included. The carrier fixing portion 9 is attached to a bottom of the drying chamber 1, and, in a state that pure water is injected and filled into the drying chamber 1, all wafers 2 supported by the wafer carrier 13 can be immersed in the pure water 40. Instead of carrying a plurality of the wafers 2 into the drying chamber 1 by using the wafer carrier 13, the wafers 2 may be directly carried into the drying chamber 1 without using the wafer carrier 13, and may be supported by a substrate support mechanism in the drying chamber 1 so that their supported positions are fixed.

Furthermore, the treatment chamber 12 has a lid 11 on its upper surface that can be opened and closed such that the wafer carrier 13 housing a multiplicity of the wafers 2 can be fed into and removed from the treatment chamber. By opening the lid 11, maintenance and the like of an interior of the treatment chamber 12 can be performed. By closing the lid 11, the space 4 in the treatment chamber 12 can be sealed. Furthermore, the lid 11 includes two mist spray devices 3 for injecting nitrogen gas, which is one example of an inert gas, into the space 4 above the liquid level of the pure water 40 stored in the drying chamber 1 in the treatment chamber 12 and, at the same time, injecting liquid-phase isopropyl alcohol (hereinafter, simply referred to as IPA) to spray mist-like IPA into the space 4, and a drying nozzle 5 for injecting nitrogen gas into the space 4. It is noted that structures and functions of the mist spray devices 3 and the drying nozzle 5 are the same as those of the mist spray devices 3 and the drying nozzle 5 in the first embodiment.

Furthermore, a pipe-like pure water supply unit 10 for supplying pure water into the drying chamber 1 is disposed in a lower portion inside the drying chamber 1, and the pure water supply unit 10 has a multiplicity of pure water supply holes in an outer periphery of a pipe in the drying chamber 1 so that pure water is uniformly supplied into the drying chamber 1.

Furthermore, a drainage port having a gutter of a substantially U-shaped cross section with a portion opened upwardly and a trough 6, which is one example of a gutter, are disposed along inner sides of four side surfaces of the drying chamber 1, and the gutter of the U-shaped cross section and the trough 6 are integrally formed in a substantially O shape in plane on an entire inner periphery of the four side surfaces. It is noted that the gutter means a gutter in which an opening portion in the drainage port is continuously integrated, the drainage port does not limit a form of the gutter, and those of which opening portions are discontinuously or intermittently formed are also included. Furthermore, the trough 6 is formed so as to be substantially horizontal with respect to a height position of an upper end of the inner periphery along the four side surfaces, and the trough 6 can further be moved in parallel along the four side surfaces in the drying chamber 1 by a trough elevating mechanism 14, which is one example of a drainage port elevating mechanism, while maintaining this substantially horizontal state. The trough elevating mechanism 14 is disposed to the left of the treatment chamber 12 in FIG. 1, and the treatment chamber 12 and the trough elevating mechanism 14 are fixed on a machine base 15 of the wafer drying apparatus 101. The trough elevating mechanism 14 is constituted by a ball screw shaft 14a fixed on the machine base 15 in a vertical direction rotatably about a rotational axis, a drive unit 14b for rotating the ball screw shaft 14a in forward or reverse directions, a nut 14c, which is engaged with the ball screw shaft 14a and can be raised or lowered along the ball screw shaft 14a by reciprocally rotating the ball screw shaft 14a in the forward or the reverse directions, a guide 14e which is fixed to the machine base 15 and fixes the nut 14c in the forward or the reverse directions to guide its vertical movement, and an elevating frame 14d which is formed in a portal shape by a plurality of rigid bodies and has one lower end thereof fixed to the nut 14c while another lower end is fixed to the trough 6 on one side of the four side surfaces through the upper surface of the treatment chamber 12. As one example of the drive unit 14b is a motor that is fixed to a lower end of the ball screw shaft 14a and rotates the ball screw shaft 14a directly in the forward or the reverse directions, or a motor that rotates the ball screw shaft 14a indirectly by using a pulley fixed to the lower end of the ball screw shaft 14a via a belt or the like. With the trough elevating mechanism 14, by raising or lowering the elevating frame 14d by rotating the ball screw shaft 14a in the forward or the reverse directions by the drive unit 14b, the trough 6 can be raised or lowered along the side surfaces of the drying chamber 1. Consequently, in the drying chamber 1 supplied and filled with pure water, by lowering the trough 6 of which upper end is positioned at the same height position as that of the upper end of the drying chamber 1 by the trough elevating mechanism 14, the upper end of the trough 6 is positioned below the liquid level of the pure water 40, and the pure water on the liquid level side of the pure water 40 can be allowed to flow into the trough 6. Furthermore, a range of raising and lowering operations of the trough 6 by the trough elevating mechanism 14 is, for example, a range from a height position at which the upper end of the trough 6 is at the same position as that of the upper end of the drying chamber 1 to a height position below lower ends of the wafers 2 supported by the wafer carrier 13.

Figure 16A:
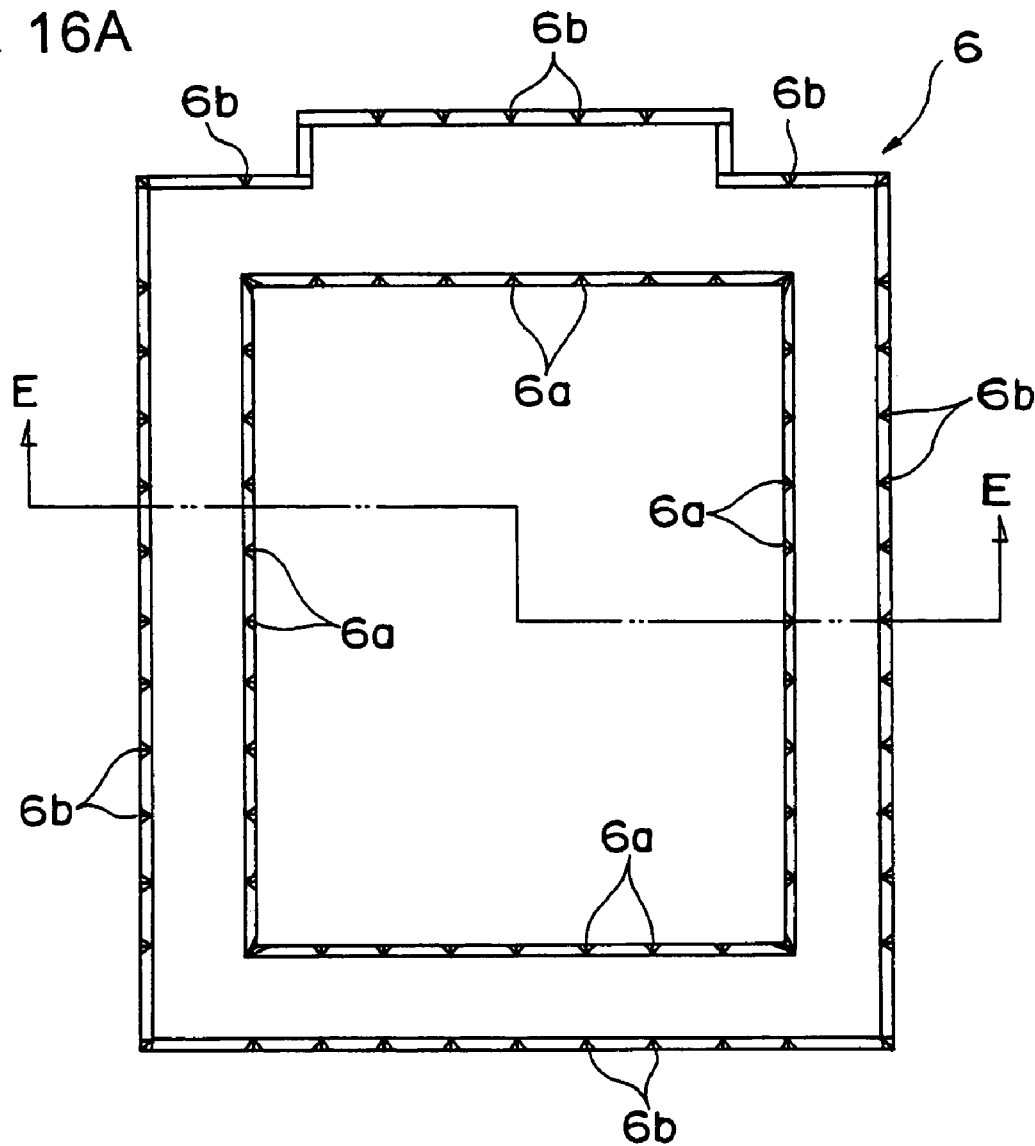
FIG. 16A is an enlarged plan view showing a trough of the wafer drying apparatus of the fourth embodiment.
Figure 16B:
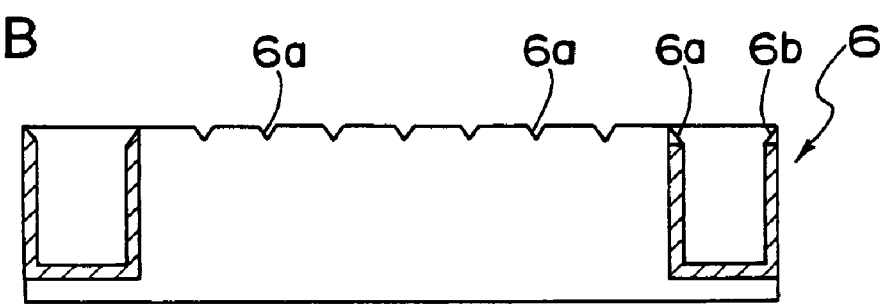
FIG. 16B is a cross sectional view showing the trough in FIG. 16A along line E—E.

Here, FIG. 16A is an enlarged plan view of the trough 6, and FIG. 16B is a cross sectional view of the trough 6 along line E—E in FIG. 16A. As shown in FIGS. 16A and 16B, a plurality of triangular dams 6a having V-shaped notches as one example are formed at a constant interval at an upper end of an inside edge of the trough 6 in the O shape. When the trough 6 is lowered to allow the pure water on the liquid level side of the pure water 40 to flow into the trough 6, a flow-in rate can easily be regulated by allowing the water to flow from each triangular dam 6a into the trough 6, and flows in directions towards the entire periphery can be secured at the liquid level. The constant interval between the triangular dams 6a may be the same as the arrangement gap between the wafers 2 supported by the wafer carrier 13.

Furthermore, a bottom of a portion of trough 6 opposed to a portion of trough 6 on one side (that is, a trough portion on the right side in FIG. 12) is formed higher than a bottom of a portion of the trough 6 on one side so that the inflow liquid can be collected in a portion of trough 6 on one side of the planar O shape (that is, a trough portion on the left side in FIG. 12), and a bottom in a portion of trough 6 for connecting both these trough portions is formed with a downward slope towards a direction of the trough portion on one side. Furthermore, a suction port 16a of a trough drainage mechanism 16, which is one example of a gutter drainage mechanism, is fixed inside the aforementioned trough portion on one side. The trough drainage mechanism 16 includes a drainage pipe 16b having a suction port 16a and fixed to the elevating frame 14d of the trough elevating mechanism 14, a drainage pump 16c fixed to the machine base 15 of the wafer drying apparatus 101, and a flexible hose 16d for interconnecting the suction port of the drainage pump 16c and the drainage pipe 16b, and these constitute a drainage passage 46. Consequently, liquid that flows into the trough 6 is collected in the aforementioned trough portion on one side, and the liquid can be drained from the trough portion on one side out from the wafer drying apparatus 101 through the drainage passage 46 by the trough drainage mechanism 16. In the fourth embodiment, a drainage device for draining pure water on the liquid level side in the drying chamber 1 is constituted by the trough 6, trough drainage mechanism 16, and trough elevating mechanism 14.

Furthermore, in the drying chamber 1, an overflow receiving portion 17 including a gutter having a substantially U-shaped cross section with a portion opened upwardly is disposed along an exterior of the upper portions of the four side surfaces of the drying chamber 1, and this gutter having a U-shaped cross section of the overflow receiving portion 17 is formed integrally at an entire outer periphery of the upper portion of the drying chamber 1 in a substantially O shape in a plane. Furthermore, a side surface of the gutter of the overflow receiving portion 17 on a drying chamber side is formed by an outside surface of the upper portion of the drying chamber 1, and another side surface is formed so that a height position of its upper end is higher than an upper end of the drying chamber 1. Consequently, when pure water overflows the drying chamber 1, this overflowing pure water can be received by the overflow receiving portion 17. Furthermore, a drainage port 17a is disposed at a bottom of the overflow receiving portion 17, and the overflowing pure water can be drained from a drainage port 18 disposed at a bottom portion of the treatment chamber 12 via a pipe or the like, or directly to an exterior of the treatment chamber 12.

Furthermore, as shown in FIG. 16A, a plurality of triangular dams 6b having V-shaped notches as one example are also formed at an upper end of the outside trough 6 in the O shape at a constant interval. Furthermore, a plurality of triangular dams 1a having V-shaped notches as one example are also formed at the upper end of the drying chamber 1 at a constant interval. In a state that the upper end of the trough 6 is positioned at the same height as the upper end of the drying chamber 1, the triangular dams 6b and the triangular dams 1a are matched. Consequently, in a state that the upper end of the trough 6 is positioned at the same height as the upper end of the drying chamber 1, pure water supplied into the drying chamber 1 is allowed to flow into the trough 6. Furthermore, since the pure water can flow into the overflow receiving portion 17 via the triangular dams 6b and the triangular dams 1a when the pure water overflows and flows from the trough 6 into the receiving portion 17, inflow is made smooth.

Furthermore, the bottom of the drying chamber 1 has a slope formed towards its central portion, and a drainage port 19 is disposed at its central portion. Pure water in the drying chamber 1 can be smoothly drained from this drainage port 19 to an exterior of the drying chamber 1. Operations in the trough elevating mechanism 14 and the trough drainage mechanism 16 are controlled by control unit 47.

Procedures of drying wafers 2 in the wafer drying apparatus 101 having the above constitution are explained below.

First, in FIGS. 12 to 15, seventh air operation valve 34 of a pure water supply passage 45 is opened to supply pure water into the drying chamber 1 from the pure water supply unit 10, and pure water is filled into the drying chamber 1. Then, the lid 11 is opened to carry the wafer carrier 13 supporting a plurality of the wafers 2 into the treatment chamber 12, and the wafer carrier 13 is immersed in the pure water 40 in the drying chamber 1 and fixed to the carrier fixing portion 9. At this time, by allowing the pure water to overflow from the drying chamber 1 into the overflow receiving portion 17, particles in the drying chamber 1 are floated in the vicinity of the liquid level of the pure water 40, and these particles are drained together with the overflowing pure water to the exterior of the drying chamber 1 to perform washing.

Subsequently, in a state that an exhaust passage 43 is closed, that is, the space 4 of the treatment chamber 12 is sealed, nitrogen gas is injected from each mist spray device 3, and, at the same time, IPA liquid is injected in the vicinity of the nitrogen gas injection opening to spray IPA mist into the space 4 at, for example, about 2 cc/min. A direction in which the mist is sprayed is generally downward, preferably in a direction substantially towards the wafers 2 in the pure water 40 (specifically, a direction towards a space between adjacent wafers 2 and a position corresponding to a center of the wafers 2) so that the mist is uniformly maintained at the liquid level of the pure water 40. At this time, when pressure in the space 4 in the drying chamber 1 becomes abnormally high, the exhaust passage 43 is preferably opened to lower pressure therein.

Subsequently, supply of pure water is stopped by the control unit 47 in a state that the mist is continuously sprayed to maintain a state that the vicinity of the liquid level of the pure water 40 in the space 4 is thus covered with the IPA mist, and, at the same time, the trough elevating mechanism 14 is controlled to gradually at a constant speed lower the trough 6 such that the upper end is positioned at the same height position as the upper end of the drying chamber 1. One example of the lowering speed of the trough 6 is a lowering speed of about 10 mm per second or lower, preferably, about 2 mm per second when the mist is sprayed at, for example, about 2 cc/min.

Along with this start of the lowering of the trough 6, generally radial flows are generated from the vicinity of a center of the liquid level of the pure water 40 in the drying chamber 1 towards directions of trough portions on four sides of the O shape. The pure water on the liquid level side of pure water 40 flows into the trough 6 via the triangular dams 6a of the trough 6, and the trough drainage mechanism 16 is controlled by control of the control unit 47 to drain the pure water on the liquid level side allowed to flow into the trough 6 via the drainage passage 46. Drainage by the trough drainage mechanism 16 may be started before start of the lowering of the trough 6.

In summary, when pure water on the liquid level side is drained, the trough 6 is lowered at a lowering speed at which generally radial surface flows are also generated at the liquid level. Consequently, pure water at liquid level or in the vicinity of the liquid level of the pure water 40 in which IPA is dissolved, and floating particles or the like, can be allowed to flow into the trough 6 by the flows together with the pure water on the liquid level side, and drained.

As a result, upper portions of the wafers 2 are exposed above the liquid level of the pure water 40, but the surfaces of the wafers 2 are not naturally oxidized due to contact with oxygen, and the IPA mist continuously and uniformly sprayed over the liquid level of the pure water 40 is immediately replaced with pure water held on the surfaces of the wafers 2. Furthermore, the wafers 2 can be rapidly dried when temperature of the IPA mist is higher than temperature of the wafers 2, that is, room temperature (for example, high in a range exceeding a temperature of the wafers 2, that is, room temperature up to 60° C.), preferably at least 5° C. or more higher, more preferably, higher by a range from 5° C. to 60° C.

When an upper end of the trough 6 is lowered to a position below lower ends of the wafers 2 supported by the wafer carrier 13, lowering of the trough 6 is stopped, the wafers 2 are completely exposed from the pure water 40, and replacement of pure water held on the surfaces of the wafers 2 with IPA is completed. Then, spraying of the mist from the mist spray device 3 is stopped, and injection of nitrogen gas from the drying nozzle 5 is started. Consequently, evaporation of the IPA from the surfaces of the wafers 2 is accelerated, and thus the surfaces of the wafers 2 are dried. After completion of this drying, injection of the nitrogen gas from the drying nozzle 5 is stopped, and a drying treatment of the wafers 2 is completed. Instead of injecting nitrogen gas from the drying nozzle 5, the wafers 2 may be left as they are so that the IPA is spontaneously evaporated from the surfaces of the wafers 2.

Then, the lid 11 of treatment chamber 12 is opened, fixation of the wafer carrier 13 by the carrier fixing portion 9 is released, and the wafers 2 in the wafer carrier 13 are carried upwardly out of the treatment chamber 12.

When the wafers 2 are at room temperature, the wafers 2 can be more rapidly dried when IPA or nitrogen gas, or IPA and nitrogen gas, are at a temperature higher than room temperature by a range from 5° C. to 60° C., and IPA mist at a temperature higher than room temperature is sprayed at the wafers 2. For example, fifty wafers can be dried in ten minutes or less.

When the trough 6 is lowered to drain pure water on the liquid level side of the pure water 40, pure water may be further supplied from the pure water supply unit 10 at, for example, about at most 30 L/min, preferably, about 4 L/min. In such a case, particles or the like in the pure water 40 are positively raised to the liquid level side by this further supplied pure water, and can be more rapidly and smoothly drained together with pure water on the liquid level side. At the same time, pure water at the liquid level or in the vicinity of the liquid level in which IPA is dissolved can be rapidly and more smoothly drained.

Furthermore, when the trough 6 is lowered to drain the pure water on the liquid level side of the pure water 40, the sixth air operation valve 35 may be opened to drain the pure water 40 from the drainage port 19 at the bottom portion of the drying chamber 1 while regulating its drainage amount. In this case, the drainage amount from the drainage port 19 is regulated so that the liquid level of the pure water 40 is lowered by drainage from the trough 6 and the drainage port 19 at a constant speed. In such a case, while the generally radial flows at the liquid level are maintained, the lowering speed of the liquid level of the pure water 40 can be increased, and drying time can be shortened. At the same time, particles or the like in the pure water 40 on the side of the bottom of the drying chamber 1 can be drained out of the drying chamber 1. The drainage port 19 and the sixth air operation valve 35 constitute one example of a bottom drainage mechanism.

Furthermore, instead of forming all the plurality of triangular dams 6a included in the trough 6 at a constant interval, a plurality of triangular dams 6a may be formed at a shorter interval on trough portions opposed to each other in a direction along surfaces of the wafers 2 supported by the wafer carrier 13 and at a longer interval on trough portions in a direction perpendicular to the surfaces of the wafers 2. In such a case, the generally radial flows from the vicinity of the center of the liquid level in directions towards the trough portions on four sides generated when pure water on the liquid level side of the pure water 40 is allowed to flow into the trough 6 can be made strong in a direction along the surfaces of the wafers 2. When a part of wafers 2 is exposed above the liquid level of the pure water 40, the pure water on the liquid level side between adjacent wafers 2 can be drained by these strong flows, and thus a drainage property of pure water between the wafers 2 at the liquid level or in the vicinity of the liquid level in which IPA is dissolved, and floating particles or the like, can be made favorable.

When fine regulation of a drainage flow rate is not required upon drainage of pure water on the liquid level side from the drying chamber 1, the triangular dams 6a may not be formed instead of forming the plurality of triangular dams 6a in the trough 6.

Figure 17:
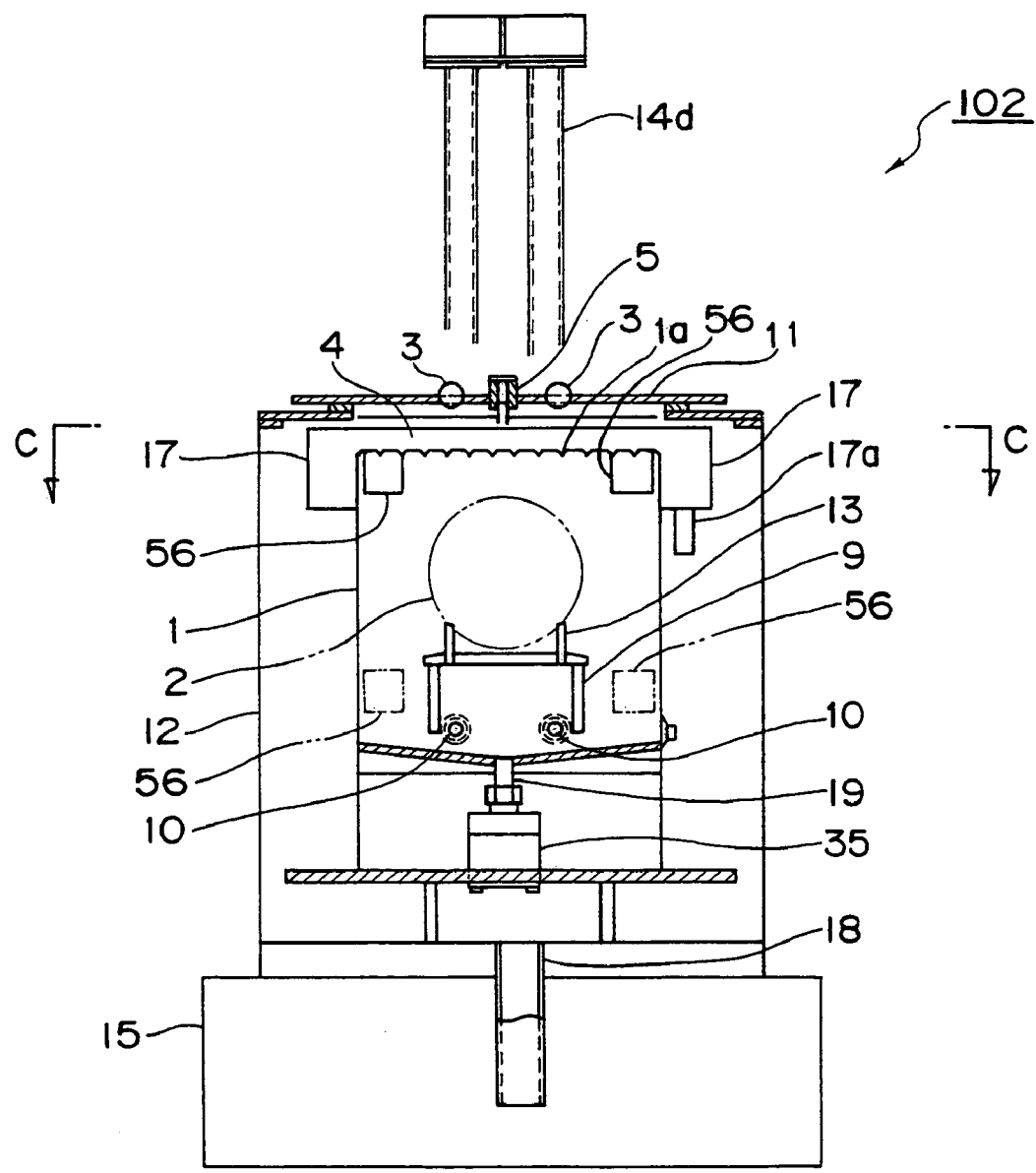
FIG. 17 is a longitudinal sectional view showing a wafer drying apparatus according to a modification of the fourth embodiment.
Figure 18:
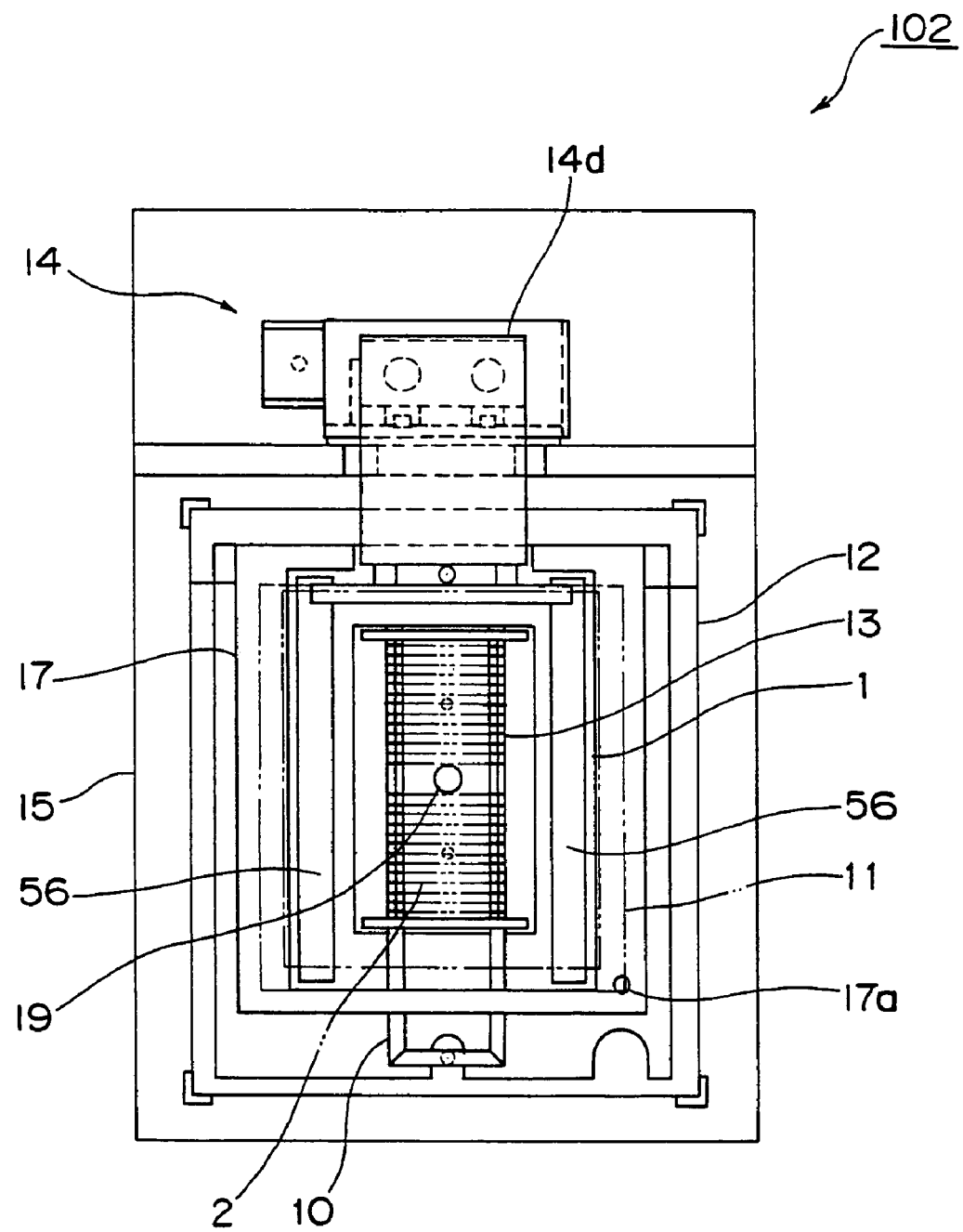
FIG. 18 is a cross sectional view showing the wafer drying apparatus along line C—C in FIG. 17.

Furthermore, the trough 6 is not limited to the one formed on four side surfaces of the drying chamber 1. For example, of the four side surfaces, a trough may be formed only on side surfaces opposed to each other in a direction along surfaces of wafers 2 supported by the wafer carrier 13. As a modification of the fourth embodiment, a longitudinal section of a wafer drying apparatus 102 in such a case is shown in FIG. 17, and a cross sectional view along line C—C in FIG. 17 is shown in FIG. 18. In the wafer drying apparatus 102, corresponding troughs 56 are not integrally formed, but the troughs 56 are fixed to elevating frame 14d of trough elevating mechanism 14 so that upper ends of respective troughs 56 are positioned at the same height, and the troughs 56 can be raised or lowered while maintaining the same height positions. Furthermore, by branching drainage pipe 16b of trough drainage mechanism 16 into two or the like, a suction port 16a of the drainage pipe 16b is positioned in each of the troughs 56, and liquid that flows into each trough 56 can be drained.

In such a wafer drying apparatus 102, a structure of the trough 56 can be simplified, and, when pure water on the liquid level side of the pure water 40 is allowed to flow into the troughs 56, flows in directions along wafer surfaces from a center of the liquid level to the trough sides, that is, flows in two opposite directions in the direction along the surfaces, can be generated at the liquid level. When a part of wafers 2 is exposed above the liquid level of the pure water 40, the pure water on the liquid level side between adjacent wafers 2 can be drained by the flows in two opposite directions, and a drainage property of pure water between the wafers 2 at the liquid level or in the vicinity of the liquid level in which IPA is dissolved, and of floating particles or the like, can be made favorable.

Furthermore, upon drainage of pure water on the liquid level side in the wafer drying apparatus 102, the troughs 56 are lowered at a lowering speed at which the flows in two directions (surface flows) can be generated at the liquid level. Consequently, pure water between the wafers 2 at the liquid level or in the vicinity of the liquid level in pure water 40 in which IPA is dissolved, and floating particles or the like, can be allowed to flow into the troughs 56 by the flows in two directions together with the pure water on the liquid level side, and drained.

Figure 19:
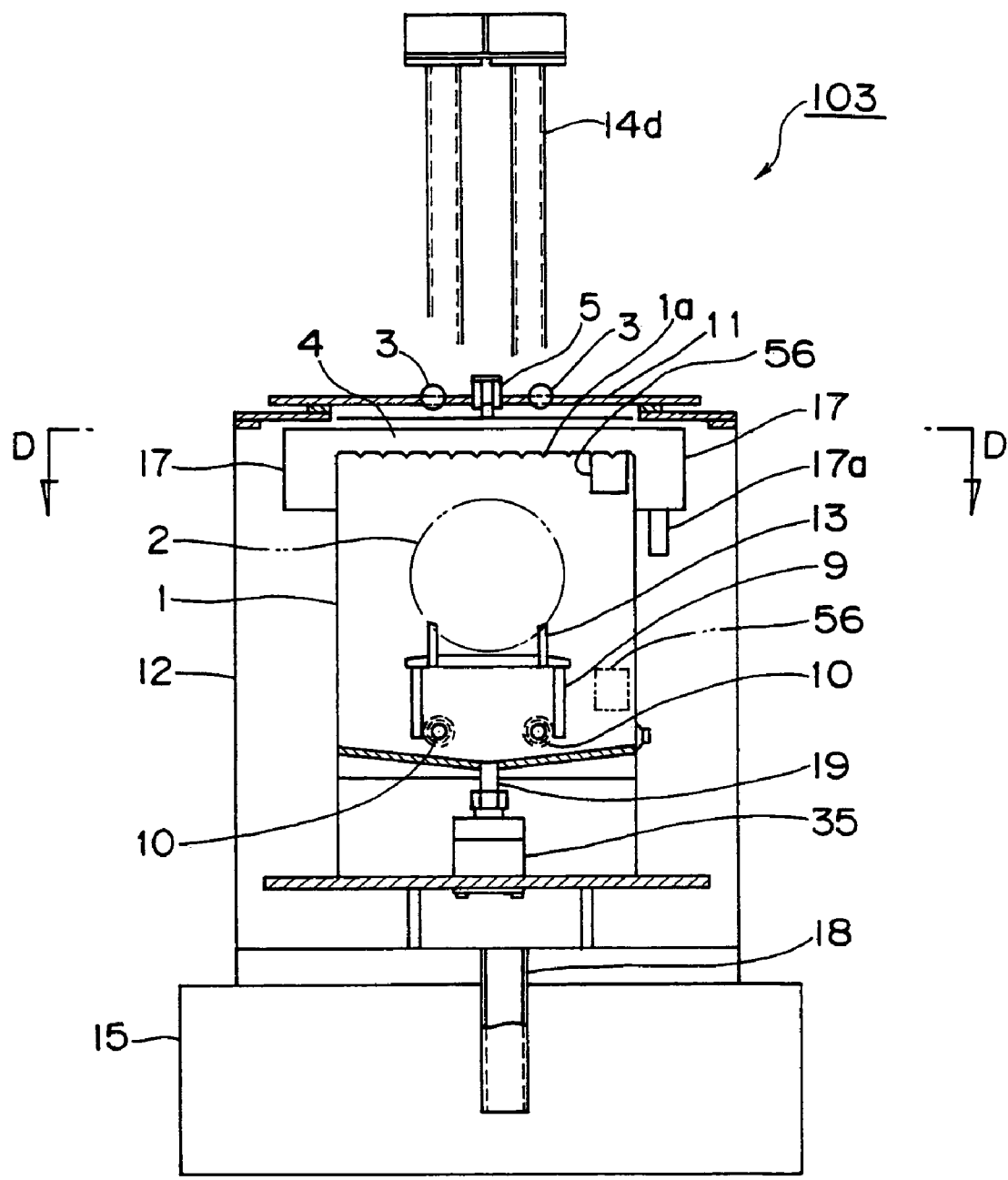
FIG. 19 is a longitudinal sectional view showing a wafer drying apparatus according to another modification of the fourth embodiment.
Figure 20:
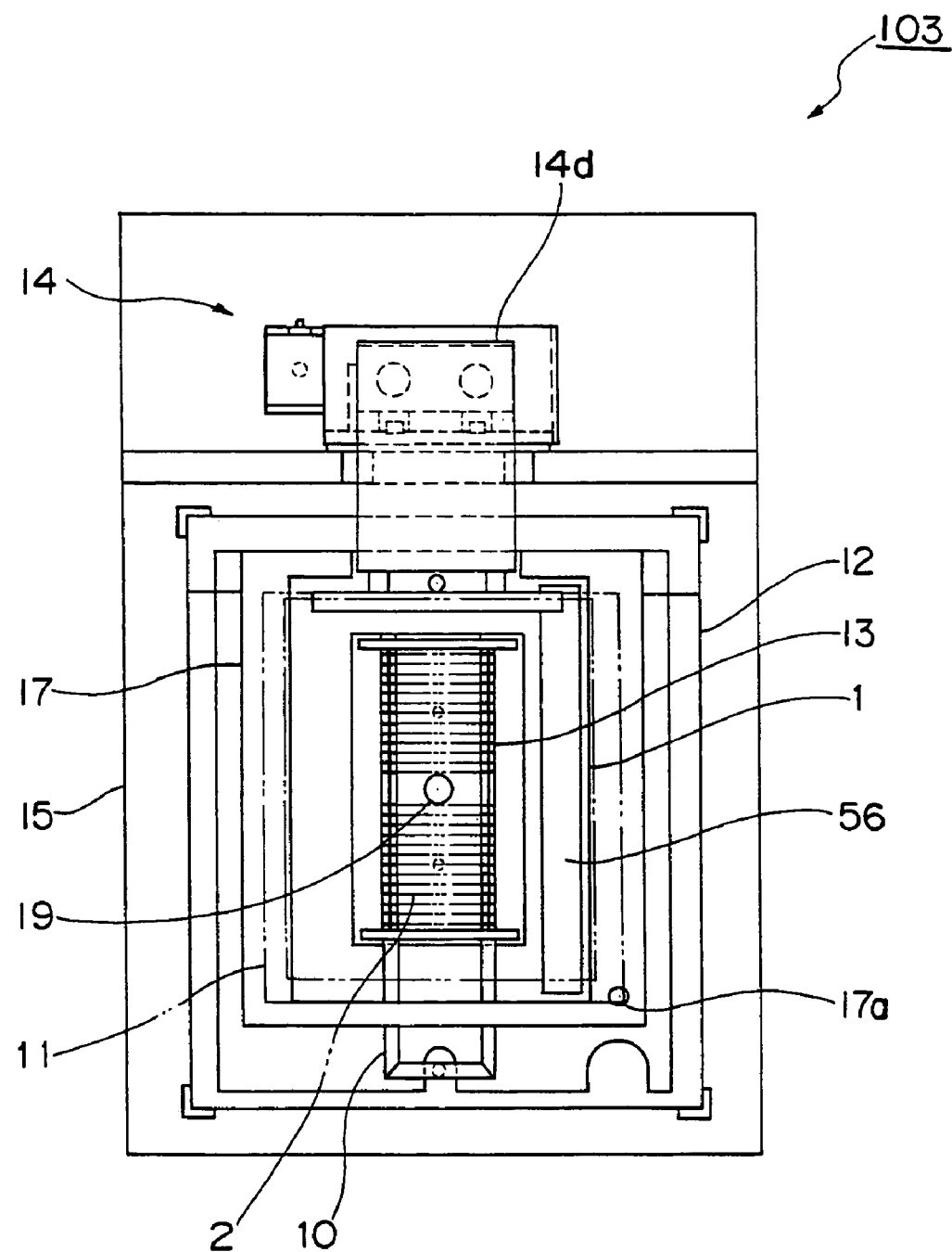
FIG. 20 is a cross sectional view showing the wafer drying apparatus along line D—D in FIG. 19.

Furthermore, only one trough 56 may be included in the wafer drying apparatus 102. As another modification of the fourth embodiment, a longitudinal section of such a wafer drying apparatus 103 is shown in FIG. 19, and a cross sectional view along line D—D in FIG. 19 is shown in FIG. 20. In the wafer drying apparatus 103, a structure of the trough 56 can be further simplified, and, when pure water on the liquid level side of the pure water 40 is allowed to flow into the trough 56, a one-way flow in a direction along surfaces of wafers 2 from a side surface side of the drying chamber 1 on which a trough 56 is not disposed towards the trough side can be generated at the liquid level. When a part of wafers 2 is exposed above the liquid level of the pure water 40, the pure water on the liquid level side between adjacent wafers 2 can be drained by the one-way flow, and thus a drainage property of pure water between the wafers 2 at the liquid level or in the vicinity of the liquid level in which IPA is dissolved, and of floating particles or the like, can be made favorable.

Furthermore, upon drainage of pure water on the liquid level side in the wafer drying apparatus 103, the trough 56 is lowered at a lowering speed at which the one-way flow (surface flow) can be generated at the liquid level. Consequently, pure water between the wafers 2 at the liquid level or in the vicinity of the liquid level of the pure water 40 in which IPA is dissolved, and floating particles or the like, can be allowed to flow into the trough 56 with the one-way flow together with the pure water on the liquid level side, and drained.

According to the fourth embodiment, when the wafers 2 immersed in the pure water 40 are exposed above the liquid level of the pure water 40 in the drying chamber 1, pure water on the liquid level side is drained via the trough 6 not only by drainage of pure water from the bottom of the drying chamber 1 and raising of the wafers 2 themselves from the pure water 40, but by lowering the trough 6 to a position below the liquid level of the pure water 40 in a state that support positions of the wafers 2 are fixed in the pure water 40. Therefore, particles or the like floating at the liquid level, or in the liquid, can be drained with pure water on the liquid level side. Consequently, when the wafers 2 are exposed from the liquid level, attachment of particles or the like to the surfaces of the wafers 2 can be prevented.

Furthermore, since the wafers 2 immersed in the pure water 40 are exposed from the liquid level in the drying chamber 1 by draining pure water on the liquid level side via the trough 6, pure water in which IPA is dissolved can be continuously drained as pure water on the liquid level side even when IPA mist sprayed into space 4 above the liquid level is dissolved at the liquid level or in the vicinity of the liquid level of the pure water 40. Consequently, an increase in an amount of IPA dissolved at the liquid level or in the vicinity of the liquid level of the pure water 40 can be prevented, and, by improving replacement efficiency of pure water by water droplets and mist-like IPA, drying efficiency of the wafers can be improved, and occurrence of non-uniform drying of the wafer surfaces can be prevented.

Furthermore, since the wafers 2 are exposed from the liquid level without moving the wafers 2 in a state that their positions are fixed, a wave is not generated at the liquid level of the pure water 40, and non-uniform drying can be prevented.

Furthermore, non-uniform drying can also be prevented by making a lowering speed of the liquid level constant upon exposure of the wafers 2 from the liquid level.

Fifth Embodiment

A wafer drying apparatus 104, which is one example of a substrate drying apparatus according to a fifth embodiment of the present invention, has the same constitution as that of the drying apparatus 102 of the fourth embodiment, except for including a trough 66 having a shape different from that of the trough 56 in the wafer drying apparatus 102. Hereafter, only this different part, that is, the shape of the trough 66 is explained. A longitudinal section of this wafer drying apparatus 104 is shown in FIG. 21.

Figure 21:
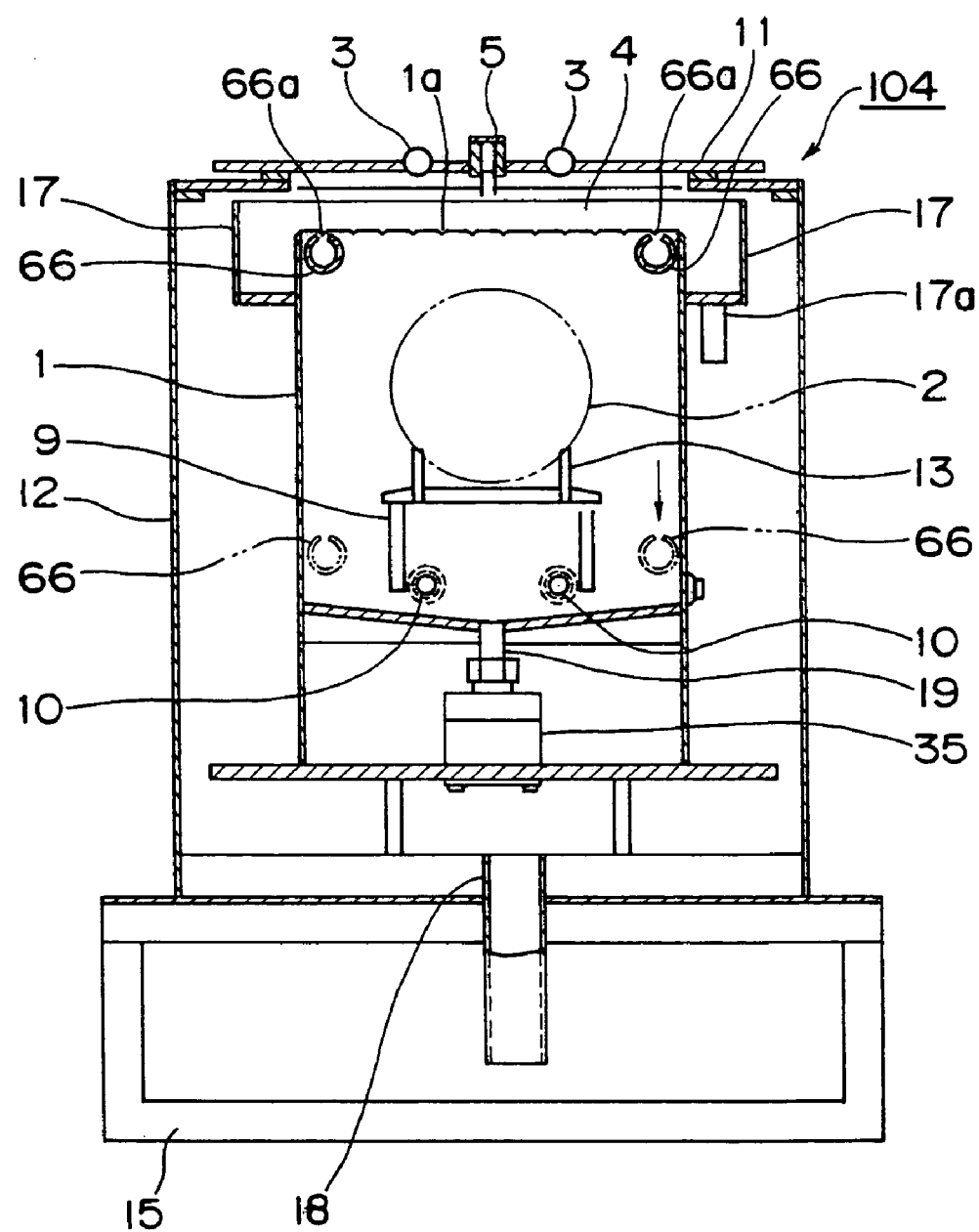
FIG. 21 is a longitudinal sectional view showing a wafer drying apparatus according to a fifth embodiment of the present invention.

As shown in FIG. 21, the wafer drying apparatus 104 includes a cylindrical trough 66, in which a plurality of holes 66a are formed on its side surface as one example of a drainage port, on each of inner sides of side surfaces opposed to each other in a direction along surfaces of wafers 2 supported by wafer carrier 13 in drying chamber 1 (that is, inner sides of left and right side surfaces of the drying chamber 1 in FIG. 21). In each of the troughs 66, a plurality of holes 66a having the same diameter are formed in one row and at a constant interval in a side surface of a cylinder in a direction along a cylindrical axis. Furthermore, the troughs 66 are disposed along respective side surfaces of the drying chamber 1 so that the holes 66a face upwardly. Furthermore, the holes 66a of each trough 66 positioned at its upper end are positioned at the same height, and the troughs 66 can be raised or lowered along the respective side surfaces of the drying chamber 1 while maintaining a state that the holes 66a are substantially horizontal. Furthermore, the wafer drying apparatus 104 includes a trough drainage mechanism 16 (not shown) for draining liquid that flows thereinto and a trough elevating mechanism 14 for raising or lowering (or moving in parallel) the troughs 66 while maintaining a substantially horizontal state along the respective side surfaces of the drying chamber 1.

Consequently, in the drying chamber 1 filled with the pure water 40, by gradually lowering the trough 66, so that its upper end is positioned at the same height as that of the upper end of the drying chamber 1, at a constant speed by the trough elevating mechanism 14, the holes 66a of the trough 66 are positioned below the liquid level of the pure water 40, pure water on the liquid level side of the pure water 40 is allowed to flow into the trough 66 via the holes 66a, and liquid allowed to flow into the trough 66 can be drained by the trough drainage mechanism 16.

According to the fifth embodiment, in addition to the effect of the fourth embodiment, the trough 66 can be formed in a cylindrical shape in which a plurality of holes 66a are formed in an upper portion of the side surface. That is, since this trough can be formed by drilling holes in a cylindrical pipe material or the like, a structure of the trough 66 can be simplified. Furthermore, since a plurality of holes 66a are formed in the side surface of the trough 66, a flow rate of liquid allowed to flow into the trough 66 can be easily regulated.

Furthermore, since the trough 66 having a plurality of holes 66a formed therein is disposed in a direction, along the surfaces of the wafers 2 supported by the wafer carrier 13, on the side surfaces of the drying chamber 1 opposed to each other, when pure water on the liquid level side of the pure water 40 is allowed to flow into the trough 66, flows in two opposed directions along the surfaces of the wafers 2 from the vicinity of the center of the liquid level towards the troughs 66 can be generated at the liquid level. When a part of the wafers 2 is exposed above the liquid level of the pure water 40, pure water on the liquid level side between adjacent wafers 2 can be drained with these flows in two opposed directions, and a drainage property of the pure water between the wafers 2 at the liquid level or in the vicinity of the liquid level in which IPA is dissolved, and of floating particles or the like, can be made favorable.

Sixth Embodiment

Unlike the wafer drying apparatus 101 of the fourth embodiment or the like, which includes a trough 6, trough drainage mechanism 16, and trough elevating mechanism 14 to drain the pure water on the liquid level side of the pure water 40 in the drying chamber 1, a wafer drying apparatus 105, which is one example of a substrate drying apparatus according to a sixth embodiment of the present invention, performs drainage of pure water on the liquid level side by a different method and has the same constitution of the drying apparatus 101 except for this. Hereafter, only structure corresponding to this different method is explained. A longitudinal section of the wafer drying apparatus 105 is shown in FIG. 22.

Figure 22:
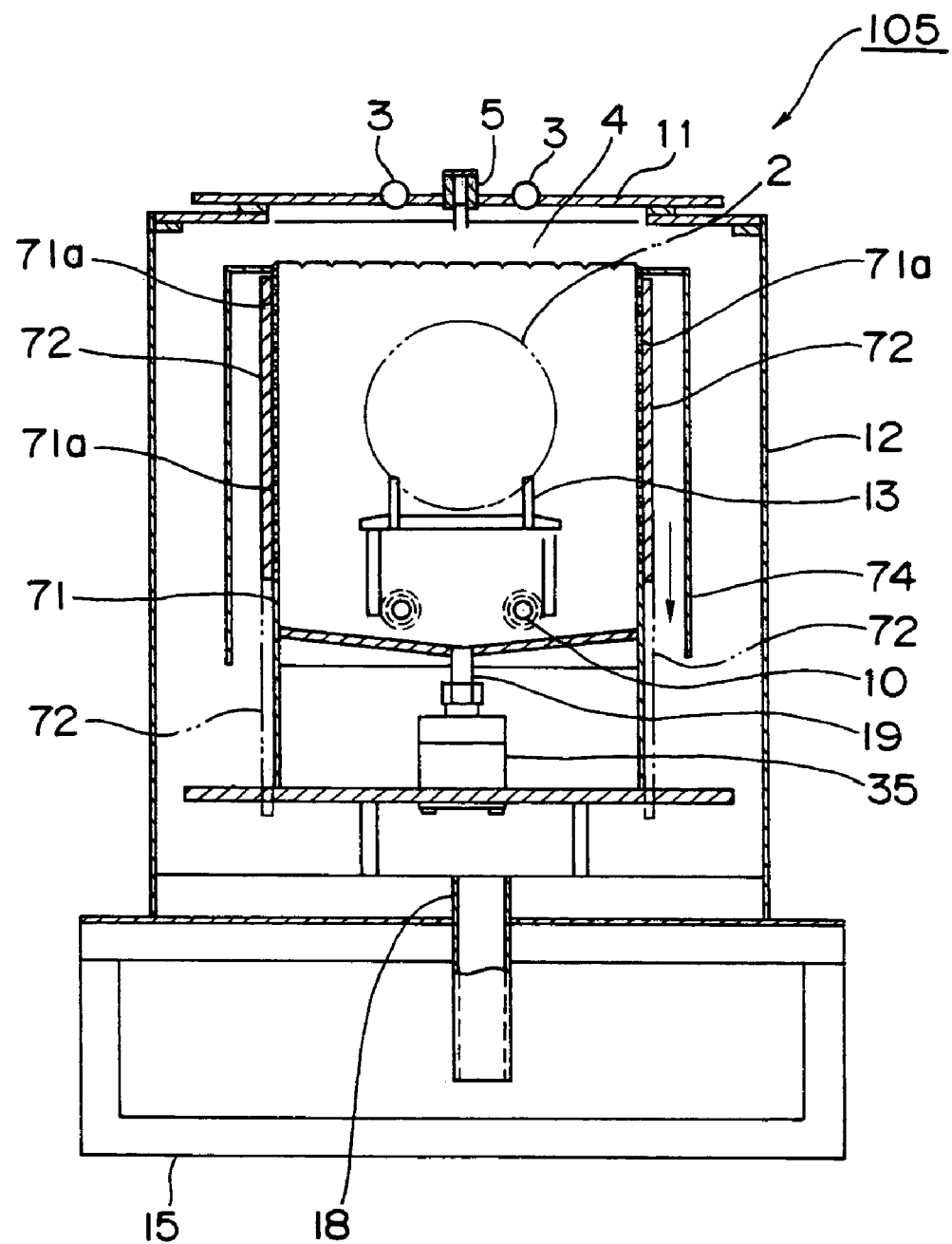
FIG. 22 is a longitudinal sectional view showing a wafer drying apparatus according to a sixth embodiment of the present invention.

As shown in FIG. 22, in the wafer drying apparatus 105, a plurality of holes 71a are formed in a side surface of a drying chamber 71 in a direction along surfaces of wafers 2 supported by wafer carrier 13. The holes 71a are formed in one row in vertical directions and lateral directions at a constant interval; that is, in a grid on the side surfaces of the drying chamber 71, for example. It is preferable that all the holes 71a are formed with the same hole diameter. Furthermore, the holes 71a are formed from the vicinity of an upper end of the drying chamber 71 to a height position below lower ends of the wafers 2 when supported by the wafer carrier 13.

Furthermore, a shutter 72 formed of a square plate that covers the holes 71a in each of the side surfaces, and can be raised and lowered along the side surfaces, is formed on an outer side of each of the side surfaces of the drying chamber 71 in which the holes 71a are formed. Furthermore, shutters 72 have the same shape and can be raised or lowered while height positions of their upper ends are maintained substantially horizontal.

Furthermore, although not shown in FIG. 22, there is included a shutter elevating mechanism for raising or lowering the shutters 72 along the outer side surfaces of the drying chamber 1 from a height position at which the shutters 72 cover all the holes 71a (that is, a position at which an upper end of each shutter 72 is higher than the holes 71a positioned at an uppermost portion) to a position at which none of the holes 71a are covered by the shutter 72 and are opened (that is, a position at which the upper end of each shutter 72 is positioned below the holes 71a positioned at a lowermost portion).

Furthermore, in the side surfaces of the drying chamber 71 in which the holes 71a are formed, when pure water 40 in the drying chamber 71 is drained out of the drying chamber 71 through the holes 71a, a hitting plate 74 having an inverse L-shaped cross section is disposed so that this drained liquid is not scattered in treatment chamber 12.

A method of exposing wafers 2, immersed in the pure water 40 filled in the drying chamber 71, from the liquid level of the pure water 40 in the wafer drying apparatus 105 having such a constitution is explained.

First, in the drying chamber 71, the pure water 40 is filled in a state that all the holes 71a are covered by the shutters 72. In this state, lowering of the shutters 72 is started by the shutter elevating mechanism. The shutters 72 are gradually lowered at a constant speed, and, when each end is lowered below upper ends of the holes 71a in uppermost portions of the side surfaces of the drying chamber 71, pure water on the liquid level side of the pure water 40 is drained from the holes 71a in the uppermost portions to an exterior of the drying chamber 71. This drained liquid is hit against an inner side of the hitting plate 74, dropped onto a bottom of the treatment chamber 12 along the inner side, and drained from a drainage passage through a wastewater disposal port 18 of the treatment chamber 12. A lowering speed of the shutters 72 is similar to a lowering speed of the trough 6 in the fourth embodiment.

Along with lowering of the shutters 72, pure water on the liquid level side of the pure water 40 is drained from the holes 71a, and the liquid level of the pure water 40 is gradually lowered, and the wafers 2 are exposed above the liquid level. When the upper ends of the shutters 72 are positioned below lower ends of all the wafers 2, lowering of the shutters 72 by the shutter elevating mechanism is stopped.

According to the sixth embodiment, even when the wafer drying apparatus 105 includes a plurality of holes 71a formed in the side surfaces of the drying chamber 71, provided are shutters 72 that can cover the plurality of holes 71a and be raised or lowered along the side surfaces, and a shutter elevating mechanism for raising or lowering the shutters 72, instead of including a trough 6, trough drainage mechanism 16, and trough elevating mechanism 14 as in the case of the wafer drying apparatus 101 of the fourth embodiment. Accordingly, the holes 71a covered by the shutters 72 are successively opened by lowering the shutters 72, and pure water on the liquid level side of the pure water 40 can be drained out of the drying chamber 71 through the holes 71a. Thus, the same effect as that of the fourth embodiment can be obtained.

Furthermore, when pure water on the liquid level side of the pure water 40 is drained through the holes 71a by forming the plurality of holes 71a in the side surfaces of the drying chamber 71 opposed to each other in the direction along the surfaces of the wafers 2 supported by the wafer carrier 13, flows in two opposed directions along the surfaces of the wafers 2 from the vicinity of the center of the liquid level towards the side surfaces can be generated at the liquid level. When a part of the wafers 2 is exposed above the liquid level of the pure water 40, pure water on the liquid level side between adjacent wafers 2 can be drained by the flows in the two opposed directions, and a drainage property of pure water between the wafers 2 at the liquid level or in the vicinity of liquid level in which IPA is dissolved, and of floating particles or the like, can be made favorable.

Seventh Embodiment

In a wafer drying apparatus 106, which is one example of a substrate drying apparatus according to a seventh embodiment of the present invention, the pure water on the liquid level side is drained by a different method unlike the wafer drying apparatus 101 of the fourth embodiment, in which pure water on the liquid level side of the pure water 40 in the drying chamber 1 is drained by draining liquid allowed to flow into the trough 6 by lowering the trough 6 via the trough elevating mechanism 14 via the trough drainage mechanism 16, and the constitution of the drying apparatus is the same except for structure corresponding to this different method. Hereafter, only this different structure is explained. A longitudinal section of this wafer drying apparatus 106 is shown in FIG. 23.

Figure 23:
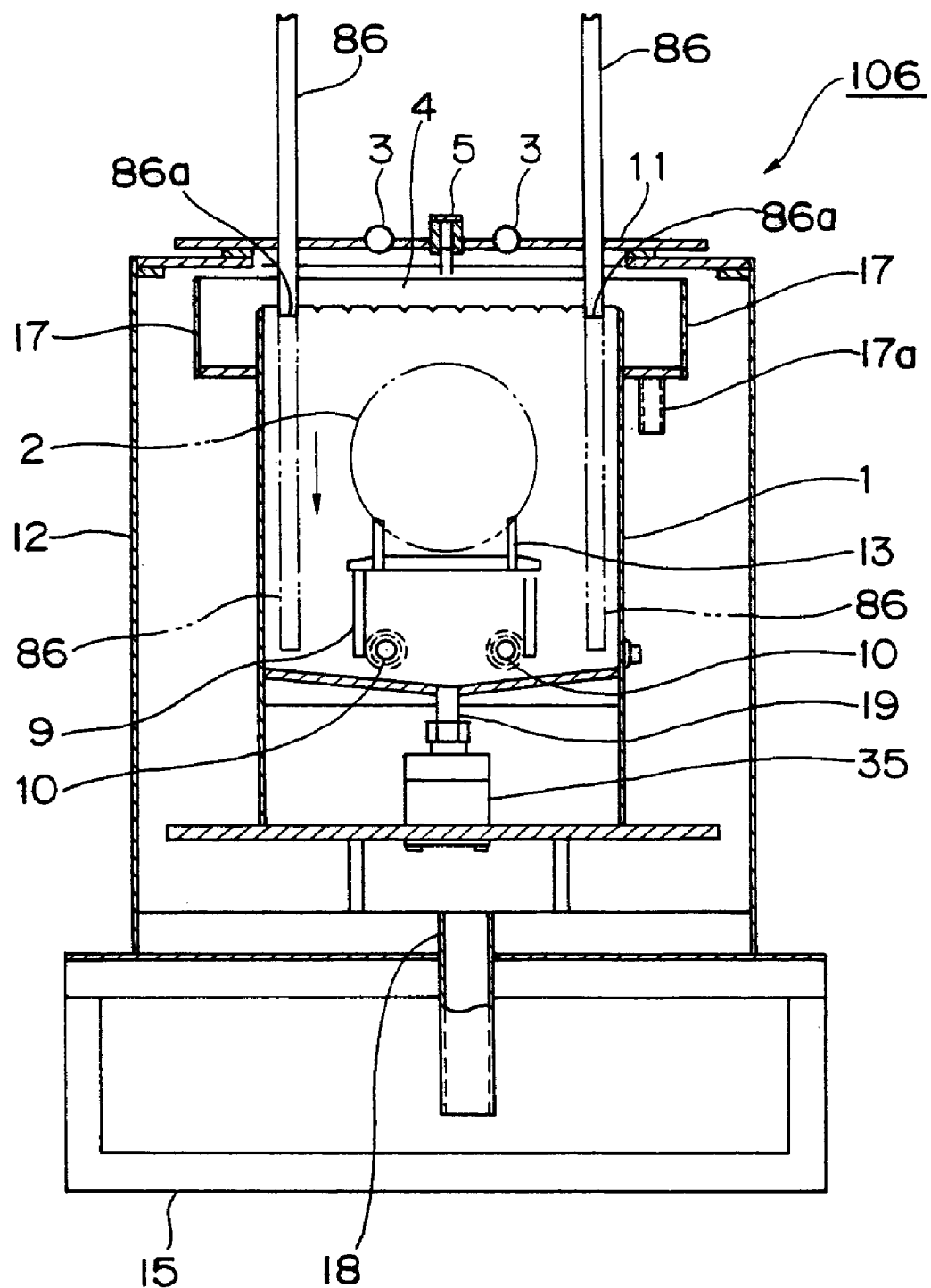
FIG. 23 is a longitudinal sectional view showing a wafer drying apparatus according to a seventh embodiment of the present invention.

As shown in FIG. 23, the wafer drying apparatus 106 includes a plurality of drainage pipes 86 having suction ports 86a in the vicinity of inner sides of side surfaces of the drying chamber 1 in a direction along surfaces of wafers 2 supported by wafer carrier 13. In the drainage pipes 86, the suction ports 86a are arranged in one row along the side surfaces, respectively, at a constant interval. Furthermore, the drainage pipes 86 can be raised or lowered along the side surfaces in the drying chamber 1 in a state that height positions of the suction ports 86a are maintained substantially horizontal.

Although not shown, in the wafer drying apparatus 106, an elevating mechanism for performing a raising or lowering operation of the drainage pipes 86 is included in the same manner as the trough elevating mechanism 14 of the fourth embodiment. Furthermore, a drainage mechanism for draining liquid from the suction ports 86a via the drainage pipes 86 is included in the same manner as the trough drainage mechanism 16 of the fourth embodiment.

Furthermore, the raising and lowering operation of the drainage pipes 86 by the elevating mechanism is performed between a height position in the vicinity of an upper end of the drying chamber 1 and a height position at which the suction ports 86a are below lower ends of the wafers 2 supported by the wafer carrier 13.

Consequently, in the drying chamber 1 filled with the pure water 40, pure water on the liquid level side of the pure water 40 can be drained via the suction ports 86a by gradually lowering the drainage pipes 86 in a state that the suction ports 86a are positioned at the height position in the vicinity of the upper end of the drying chamber 1 by the elevating mechanism at a constant speed, thereby sucking liquid in the vicinity of the suction ports 86a by the drainage mechanism and draining this liquid via the drainage pipes 86. Furthermore, the liquid level of the pure water 40 can also be lowered at a constant speed by lowering the drainage pipes 86 at a constant speed while performing the aforementioned drainage operation, and the wafers 2 can also be exposed above the liquid level.

According to the seventh embodiment, even when pure water on the liquid level side is drained directly from the suction ports 86a of the drainage pipes 86 without using the trough 6, unlike the wafer drying apparatus 101 of the fourth embodiment, in which pure water on the liquid level side allowed to flow into the trough 6 via the trough 6 is drained by the trough drainage mechanism 16, the same effect as that of the fourth embodiment can be obtained.

Furthermore, when pure water on the liquid level side of the pure water 40 is drained through the holes 71a by forming the plurality of drainage pipes 86 in side surfaces of the drying chamber 1 opposed to each other in the direction along the surfaces of the wafers 2 supported by the wafer carrier 13, flows in two opposed directions along the surfaces of the wafers 2 from the vicinity of the center of the liquid level towards the suction ports 86 can be generated at the liquid level when pure water on the liquid level side of the pure water 40 is drained into the drainage pipes 86 through the suction ports 86a. When a part of the wafers 2 is exposed above the liquid level of the pure water 40, pure water on the liquid level side between adjacent wafers 2 can be drained by the flows in the two opposed directions, and a drainage property of pure water between the wafers 2 at the liquid level or in the vicinity of liquid level in which IPA is dissolved, and of floating particles or the like, can be made favorable.

By appropriately combining any embodiments among the above various embodiments, effects of respective embodiments can be exerted.

According to the first aspect of the present invention, when substrates immersed in pure water in the drying chamber are exposed above the liquid level of the pure water, pure water on the liquid level side is drained from the liquid level or the vicinity of the liquid level in the pure water, while the pure water in which the substrates are immersed is raised together with the substrates, not either by drainage of the pure water only from a bottom of the drying chamber or by raising of the substrates themselves from the pure water. Thus, the substrates can be exposed from the liquid level. Consequently, there can be provided a substrate drying method by which attachment of particles or the like, floating at the liquid level or in the vicinity of the liquid level, to substrate surfaces can be prevented upon exposure of the substrates from the liquid level.

Furthermore, since exposure of the substrates immersed in the pure water in the drying chamber from the liquid level is performed along with drainage of the pure water on the liquid level side, even when a gaseous or droplet-like isopropyl alcohol supplied into a space above the liquid level is dissolved in the pure water at the liquid level or in the vicinity of the liquid level, pure water in which the isopropyl alcohol is dissolved can be continuously drained as the pure water on the liquid level side. Consequently, an increase in an amount of the isopropyl alcohol dissolved in the pure water at the liquid level or in the vicinity of the liquid level can be prevented, and drying efficiency of the substrates can be improved by improving replacement efficiency of the pure water and gaseous or droplet-like isopropyl alcohol. Thus, there can be provided a substrate drying method by which occurrence of non-uniform drying of a substrate surface can be prevented.

Furthermore, since the pure water on the liquid level side is drained by raising the pure water in which the substrates are immersed together with the substrates, occurrence of flows diffusing the isopropyl alcohol dissolved in the pure water and floating particles or the like (that is, turbulence such as a vortex) can be prevented in the pure water. Therefore, the pure water on the liquid level side can be drained in a state that such flows diffusing the particles or the like is prevented upon exposure of the substrates. Thus, there can be provided a substrate drying method by which a drainage property of the pure water at the liquid level or in the vicinity of the liquid level in which the isopropyl alcohol is dissolved, and of floating particles or the like, can be made favorable.

According to the second aspect of the present invention, even when the pure water in which the substrates are immersed is raised relative to the drying chamber together with the substrates by lowering the drying chamber, the pure water on the liquid level side can be drained from the liquid level or the vicinity of the liquid level of the pure water along with this relative raising, and the same effect as that of the first aspect can be obtained.

According to the third aspect of the present invention, upon drainage of pure water in the drying chamber, since pure water on the liquid level side of the pure water is drained by raising the pure water in which the substrates are immersed together with the substrates, in comparison with a case where pure water on the liquid level side is drained by lowering a drainage device such as a trough disposed in the drying chamber, for example, a position of the liquid level of the pure water and a position of a space above the liquid level into which air or inert gas, and gaseous or droplet-like isopropyl alcohol are supplied, can be fixed relative to each other during the drainage. Consequently, the gaseous or droplet-like isopropyl alcohol can be stably supplied into the space or onto the liquid level from a start of exposure of the substrates from the liquid level to completion of the exposure (that is, from start of a drying treatment of the substrates to its completion), and replacement efficiency of pure water held on substrate surfaces and the gaseous or droplet-like isopropyl alcohol upon the exposure of the substrates can be stabilized. Thus, there can be provided a substrate drying method by which occurrence of non-uniform drying of the substrate surfaces can be prevented.

According to the fourth aspect of the present invention, when a part of the substrates is exposed above the liquid level of the pure water by arranging a plurality of the substrates so that their surfaces are substantially parallel to each other and substantially perpendicular to the liquid level of the pure water and immersing them in the pure water, and draining the pure water on the liquid level side by a flow along the liquid level and along the substrate surfaces, a drainage property of the pure water on the liquid level side between adjacent substrates can be made favorable. Thus, there can be provided a substrate drying method by which a drainage property of isopropyl alcohol dissolved in the pure water on the liquid level side, and of particles or the like, can be made favorable upon exposure of the substrates from the liquid level.

According to the fifth aspect of the present invention, since time required for drainage of pure water can be shortened by also draining the pure water from the vicinity of the bottom of the drying chamber upon drainage of the pure water on the liquid level side of the pure water while the pure water on the liquid level side is drained, there can be provided a substrate drying method by which the substrates can be more efficiently dried in addition to effects of the first to fourth aspects.

According to the sixth aspect of the present invention, by further supplying pure water from the vicinity of the bottom of the drying chamber when the pure water on the liquid level side is drained, particles or the like floating in the pure water are positively raised towards the side of the liquid level by this further supplied pure water and can be rapidly and smoothly drained together with the pure water on the liquid level side. Thus, there can be provided a substrate drying method by which attachment of particles or the like to substrate surfaces can be prevented.

According to the seventh aspect of the present invention, a handling property can be made favorable by using nitrogen gas as the inert gas.

According to the eighth aspect of the present invention, there can be provided a substrate drying method by which effects of the above aspects can be obtained when the substrates are wafers, or liquid crystal glass substrates, of which surfaces require cleanliness or the like.

According to the ninth aspect of the present invention, when the substrates immersed in pure water in the drying chamber are exposed above the liquid level of the pure water, the pure water on the liquid level side is drained from the liquid level or the vicinity of the liquid level in the pure water, not by drainage of the pure water only from the bottom of the drying chamber or by raising of the substrates themselves from the pure water, but by raising a movable plate to raise the pure water in which the substrates are immersed together with the substrates by a drainage device. Thus, the substrates can be exposed from the liquid level. Consequently, there can be provided a substrate drying apparatus by which attachment of particles or the like, floating at the liquid level or in the liquid, to substrate surfaces can be prevented upon exposure of the substrates from the liquid level.

Furthermore, since the exposure of the substrates immersed in the pure water in the drying chamber from the liquid level is performed while the pure water on the liquid level side is drained, pure water in which isopropyl alcohol is dissolved can be continuously drained by the drainage device as the pure water on the liquid level side even when gaseous or droplet-like isopropyl alcohol supplied into the space above the liquid level by the isopropyl alcohol supply device is dissolved in the pure water at the liquid level or in the vicinity of the liquid level. Consequently, an increase in an amount of isopropyl alcohol dissolved in the pure water at the liquid level or in the vicinity of the liquid level can be prevented, and a substrate drying efficiency can be improved by improving replacement efficiency of the pure water and gaseous or droplet-like isopropyl alcohol. Thus, there can be provided a substrate drying apparatus by which occurrence of non-uniform drying of substrate surfaces can be prevented.

Furthermore, since the pure water on the liquid level side is drained by raising the pure water in which the substrates are immersed together with the substrates by the drainage device, occurrence of flows diffusing the isopropyl alcohol dissolved in the pure water, and particles or the like floating in the pure water (that is, turbulence such as a vortex) can be prevented in the pure water. Therefore, the pure water on the liquid level side can be drained in a state that the flows diffusing the particles or the like upon exposure of the substrate is prevented. Thus, there can be provided a substrate drying apparatus by which a drainage property of the pure water at the liquid level or in the vicinity of the liquid level in which the isopropyl alcohol is dissolved, and of floating particles or the like, can be made favorable.

According to the tenth aspect of the present invention, since drainage of the pure water in the drying chamber is performed by raising the pure water in which the substrates are immersed together with the substrates by the drainage device to drain the pure water on the liquid level side of the pure water, a position of the liquid level of the pure water and a position of the space above the liquid level into which air or an inert gas, and gaseous or droplet-like isopropyl alcohol are supplied by the isopropyl alcohol supply device, can be fixed relative to each other during the drainage. Consequently, the gaseous or the droplet-like isopropyl alcohol can be stably supplied into the space or onto the liquid level from a start of exposure of the substrates from the liquid level to completion of the exposure (that is, from start of a drying treatment of the substrates to its completion) by the isopropyl alcohol supply device, and replacement efficiency of pure water held on substrate surfaces and the gaseous or droplet-like isopropyl alcohol upon exposure of the substrates can be stabilized. Thus, there can be provided a substrate drying apparatus by which occurrence of non-uniform drying of the substrate surfaces can be prevented.

According to the eleventh aspect of the present invention, a substrate support mechanism disposed at the bottom of the drying chamber and supporting substrates, and a bottom elevator for raising or lowering the bottom of the drying chamber are further included, and pure water on the liquid level side can be drained by allowing the pure water on the liquid level side to overflow an upper portion of the drying chamber while raising the pure water in which the substrates are immersed together with the substrates supported by the substrate support mechanism by raising the bottom of the drying chamber by the bottom elevator. Thus, there can be provided a substrate drying apparatus by which the effect by the ninth aspect can be obtained.

According to the twelfth aspect of the present invention, the drying chamber further includes a movable plate for dividing the pure water into pure water in an upper pure water tank-section on a liquid level side and pure water in a lower pure water tank-section on a side of the bottom of the drying chamber, a substrate support mechanism disposed on the movable plate and supporting the substrates immersed in the pure water in the upper pure water tank-section, and a movable plate elevator for raising or lowering the movable plate of the drying chamber. Pure water on the liquid level side can be drained by allowing the pure water on the liquid level side to overflow the upper portion of the drying chamber while raising the movable plate of the drying chamber by the movable plate elevator to raise a partitioning position between the upper pure water tank-section and the lower pure water tank-section, and raising the pure water in which the substrates are immersed in the upper pure water tank-section together with the substrates supported by the substrate support mechanism. Thus, there can be provided a substrate drying apparatus by which the effect of the ninth aspect can be obtained.

According to the thirteenth aspect of the present invention, when the movable plate is raised along an inner surface of the drying chamber by the movable plate elevator so that the movable plate and inner surface are not brought into contact with each other, pure water in an amount matching an increase in a volume of the lower pure water tank-section depending on this raising amount is further supplied from the pure water supply unit into the lower pure water tank-section. Therefore, the pure water in the upper pure water tank-section is raised by raising of the movable plate even in a state that there is a gap between a periphery of the movable plate and the inner surface of the drying chamber, and only pure water on the liquid level side can be drained in addition to the effect of the twelfth aspect. Consequently, there is no necessity of filling (or sealing) the gap between the periphery of the movable plate and the inner surface of the drying chamber, and particles that may be generated due to friction when the gap is filled can be prevented. Thus, there can be provided a substrate drying apparatus by which occurrence of particles can be prevented in the pure water in the drying chamber.

Furthermore, since pure water in an amount matching the increase in the volume in the lower pure water tank-section is supplied into the lower pure water tank-section by raising the movable plate along with raising of the movable plate, almost no flow of pure water is generated in the gap between the periphery of the movable plate and the inner surface of the drying chamber. Therefore, occurrence of turbulence such as a vortex due to inflow of pure water can be prevented in the upper pure water tank-section, in which the substrates are immersed. Thus, there can be provided a substrate drying apparatus by which pure water between exposed substrates at the liquid level or in the vicinity of the liquid level in which isopropyl alcohol is dissolved, and floating particles or the like, can be drained by flow of pure water on the liquid level side with a favorable drainage property.

According to the fourteenth aspect of the present invention, even when pure water on the liquid level side is drained by raising the liquid moving plate relative to the drying chamber by lowering the drying chamber by the drainage mechanism, and raising the pure water in which the substrates are immersed relative to the drying chamber together with the substrates, the same effect as that of the ninth aspect can be obtained.

According to the fifteenth aspect of the present invention, a handling property can be made favorable by using nitrogen gas as an inert gas.

According to the sixteenth aspect of the present invention, since pure water on the liquid level side is drained by a flow along the liquid level and along substrate surfaces by arranging a plurality of the substrates so that their surfaces are substantially parallel to each other, or substantially perpendicular to the liquid level of the pure water, and immersing them in the pure water, a drainage property of the pure water on the liquid level side between adjacent substrates can be made favorable when a part of the substrates is exposed above the liquid level of the pure water. Thus, there can be provided a substrate drying apparatus by which a drainage property of isopropyl alcohol dissolved in the pure water on the liquid level side, and particles or the like, can be made favorable upon exposure of the substrates from the liquid level.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A substrate drying apparatus comprising:
   a drying chamber including
   (i) an upper pure water tank-section in which substrates are to be immersed in pure water, and
   (ii) a lower pure water tank-section having a fixed bottom;
   an isopropyl alcohol supply device for supplying air or an inert gas, and gaseous or droplet-like isopropyl alcohol, into a space above a liquid level of the pure water when in said upper pure water tank-section;
   a mechanism for draining pure water from said upper pure water tank-section while preventing turbulence in the pure water, said mechanism including
   (i) a plate dividing an interior of said drying chamber into said upper pure water tank-section and said lower pure water tank-section such that said plate defines a bottom of said upper pure water tank-section, with an entire periphery of said plate being spaced from an inner surface of said drying chamber by a gap;
   (ii) a plate elevator for raising said plate relative to said drying chamber so as to drain pure water, on a liquid level side, from a liquid level or a vicinity of the liquid level of the pure water in said upper pure water tank-section by raising the substrates together with the pure water in which the substrates are immersed; and
   (iii) a pure water supply unit for supplying pure water into said lower pure water tank-section in an amount corresponding to an increase in volume of said lower pure water tank-section due to raising of said plate, so as to prevent turbulence in the pure water in said upper pure water tank-section due to inflow/outflow of pure water through said gap; and
   a control unit for controlling operation of said plate elevator and said pure water supply unit such that the pure water is supplied into said lower pure water tank-section in the amount corresponding to the increase in volume of said lower pure water tank-section due to the raising of said plate so as to prevent turbulence in the pure water in said upper pure water tank-section due to inflow/outflow of pure water through said gap,
   such that when the pure water and the substrates are raised relative to said drying chamber by raising said plate via said plate elevator, while preventing turbulence in the pure water in said upper pure water tank-section by supplying pure water into said lower pure water tank-section via said pure water supply unit, the pure water at the liquid level is drained, the substrates are exposed from the pure water above the liquid level in said upper pure water tank-section, and, at the same time, the pure water held on exposed surfaces of the substrates is replaced by the gaseous or droplet-like isopropyl alcohol supplied by the isopropyl alcohol supply device, and then the substrates can be dried by evaporating the isopropyl alcohol from the exposed surfaces of the substrates.

2. The substrate drying apparatus according to claim 1, wherein
   said control unit is for controlling operation of said pure water supply unit such that the pure water is supplied into said lower pure water tank-section in the amount corresponding to the increase in volume of said lower pure water tank-section due to raising of said plate, so as to fix a position of the liquid level relative to the space above the liquid level.

3. The substrate drying apparatus according to claim 1, wherein
   the inert gas is a nitrogen gas.

4. The substrate drying apparatus according to claim 1, wherein
   said mechanism is constructed and arranged such that when the pure water and the substrates are raised relative to said drying chamber, the pure water on the liquid level side is drained by a flow along the liquid level and along respective surfaces of the substrates, which substrates are arranged so that the respective surfaces thereof are substantially parallel to each other and substantially perpendicular to the liquid level of the pure water.

5. The substrate drying apparatus according to claim 1, further comprising:
   a substrate support mechanism disposed on said plate for supporting the substrates when immersed in the pure water in said upper pure water tank-section,
   such that when said plate is raised by said plate elevator, the pure water is drained by allowing the pure water to overflow an upper portion of said drying chamber by raising the pure water in said upper pure water tank-section together with the substrates while supported by said substrate support mechanism.

6. The substrate drying apparatus according to claim 1, wherein
said control unit is also for controlling operation of said isopropyl alcohol supply device such that the air or inert gas, and the gaseous or droplet-like isopropyl alcohol, are supplied into the space above the liquid level of the pure water when in said upper pure water tank-section.

7. The substrate drying apparatus according to claim 6, wherein
said control unit is for controlling operation of said pure water supply unit such that the pure water is supplied into said lower pure water tank-section in the amount corresponding to the increase in volume of said lower pure water tank-section due to raising of said plate, so as to fix a position of the liquid level relative to the space above the liquid level.

8. The substrate drying apparatus according to claim 6, wherein
the inert gas is a nitrogen gas.

9. The substrate drying apparatus according to claim 6, wherein
said mechanism is constructed and arranged such that when the pure water and the substrates are raised relative to said drying chamber, the pure water on the liquid level side is drained by a flow along the liquid level and along respective surfaces of the substrates, which substrates are arranged so that the respective surfaces thereof are substantially parallel to each other and substantially perpendicular to the liquid level of the pure water.

10. The substrate drying apparatus according to claim 6, further comprising:
a substrate support mechanism disposed on said plate for supporting the substrates when immersed in the pure water in said upper pure water tank-section,
such that when said plate is raised by said plate elevator, the pure water is drained by allowing the pure water to overflow an upper portion of said drying chamber by raising the pure water in said upper pure water tank-section together with the substrates while supported by said substrate support mechanism.

* * * * *